United States Patent
Rabkin et al.

(10) Patent No.: US 11,177,284 B2
(45) Date of Patent: Nov. 16, 2021

(54) FERROELECTRIC MEMORY DEVICES CONTAINING A TWO-DIMENSIONAL CHARGE CARRIER GAS CHANNEL AND METHODS OF MAKING THE SAME

(71) Applicant: SANDISK TECHNOLOGIES LLC, Addison, TX (US)

(72) Inventors: Peter Rabkin, Cupertino, CA (US); Masaaki Higashitani, Cupertino, CA (US); Alan Kalitsov, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/798,643

(22) Filed: Feb. 24, 2020

(65) Prior Publication Data

US 2020/0203381 A1   Jun. 25, 2020

Related U.S. Application Data

(63) Continuation-in-part of application No. 16/227,889, filed on Dec. 20, 2018, now Pat. No. 10,700,093.

(51) Int. Cl.
*H01L 27/11597* (2017.01)
*H01L 21/02* (2006.01)
*H01L 21/306* (2006.01)
*H01L 29/778* (2006.01)

(52) U.S. Cl.
CPC .. *H01L 27/11597* (2013.01); *H01L 21/02172* (2013.01); *H01L 21/30608* (2013.01); *H01L 29/778* (2013.01)

(58) Field of Classification Search
CPC ......... H01L 27/11597; H01L 21/02172; H01L 21/30608; H01L 29/778
See application file for complete search history.

(56) References Cited

U.S. PATENT DOCUMENTS

| | | | |
|---|---|---|---|
| 8,227,701 B2* | 7/2012 | Wrazien | H01L 27/20 174/256 |
| 9,062,390 B2* | 6/2015 | Blomberg | H01L 21/02194 |
| 9,425,299 B1 | 8/2016 | Rabkin et al. | |
| 9,721,963 B1 | 8/2017 | Rabkin et al. | |
| 9,780,108 B2 | 10/2017 | Rabkin et al. | |
| 9,876,025 B2 | 1/2018 | Rabkin et al. | |

(Continued)

FOREIGN PATENT DOCUMENTS

| | | |
|---|---|---|
| EP | 3128534 A1 | 2/2017 |
| JP | 2006210525 A | 8/2006 |

(Continued)

OTHER PUBLICATIONS

Notification of Transmittal of the International Search Report and Written Opinion of the International Search Authority for International Patent Application No. PCT/US2020/035742, dated Sep. 22, 2020, 11 pages.

(Continued)

*Primary Examiner* — Gene N Auduong
(74) *Attorney, Agent, or Firm* — The Marbury Law Group PLLC

(57) ABSTRACT

A ferroelectric memory device includes a two-dimensional electron gas channel, a gate electrode, and a ferroelectric element located between the gate electrode and the two-dimensional electron gas channel.

15 Claims, 61 Drawing Sheets

(56) References Cited

U.S. PATENT DOCUMENTS

| | | | |
|---|---|---|---|
| 9,941,295 | B2 | 4/2018 | Rabkin et al. |
| 9,941,299 | B1 | 4/2018 | Chen et al. |
| 10,700,093 | B1 | 6/2020 | Kalitsov et al. |
| 10,720,437 | B2 | 7/2020 | Yoo |
| 10,786,284 | B2* | 9/2020 | Spratt ................ A61B 17/7035 |
| 2001/0048622 | A1 | 12/2001 | Kwon et al. |
| 2003/0053350 | A1 | 3/2003 | Krieger et al. |
| 2003/0155602 | A1 | 8/2003 | Krieger et al. |
| 2003/0178667 | A1 | 9/2003 | Krieger et al. |
| 2003/0179633 | A1 | 9/2003 | Krieger et al. |
| 2004/0026729 | A9 | 2/2004 | Krieger et al. |
| 2004/0159835 | A1 | 8/2004 | Krieger et al. |
| 2005/0151177 | A1 | 7/2005 | Miyazawa et al. |
| 2007/0020803 | A1 | 1/2007 | Saigoh et al. |
| 2010/0144064 | A1 | 6/2010 | Saigoh et al. |
| 2012/0104325 | A1 | 5/2012 | Talapin et al. |
| 2014/0098458 | A1 | 4/2014 | Almadhoun et al. |
| 2015/0372225 | A1 | 12/2015 | Gaidis et al. |
| 2016/0032489 | A1* | 2/2016 | Blomberg ................ C30B 1/04 428/697 |
| 2016/0172365 | A1 | 6/2016 | McKinnon et al. |
| 2016/0240545 | A1 | 8/2016 | Karda et al. |
| 2016/0276579 | A1 | 9/2016 | Gaidis et al. |
| 2016/0308107 | A1 | 10/2016 | Talapin et al. |
| 2016/0358933 | A1 | 12/2016 | Rabkin et al. |
| 2017/0114241 | A1 | 4/2017 | Almadhoun et al. |
| 2017/0316713 | A1 | 11/2017 | Hyman |
| 2018/0323214 | A1 | 11/2018 | Karda et al. |
| 2018/0358380 | A1 | 12/2018 | Yoo |
| 2018/0374929 | A1 | 12/2018 | Yoo |
| 2019/0019800 | A1 | 1/2019 | Yoo et al. |
| 2019/0108998 | A1 | 4/2019 | Mueller-Meskamp et al. |
| 2019/0244973 | A1 | 8/2019 | Yoo |
| 2019/0288116 | A1 | 9/2019 | Yoo |
| 2019/0348530 | A1 | 11/2019 | Ando et al. |
| 2019/0393355 | A1 | 12/2019 | Yoo et al. |
| 2020/0091306 | A1 | 3/2020 | Heo et al. |
| 2020/0203380 | A1 | 6/2020 | Prasad et al. |

FOREIGN PATENT DOCUMENTS

| | | |
|---|---|---|
| KR | 10-20140041123 A | 4/2014 |
| KR | 10-20180134122 A | 12/2018 |
| WO | WO2016-200742 A1 | 12/2016 |
| WO | WO2018094397 A1 | 5/2018 |

OTHER PUBLICATIONS

USPTO Office Communication, Non-Final Office Action for U.S. Appl. No. 16/886,179, dated Oct. 7, 2020, 12 pages.

Zheng et al., "Gate-controlled Non-Volatile Graphene-ferroelectric Memory," Appl. Phys. Lett. 94, 163505 (2009).

Song et al., "Robust bi-stable Memory Operation in Single-layer Graphene Ferroelectric Memory," Appl. Phys. Lett. 99, 042109 (2011).

Zheng et al., "Graphene Field Effect Transistors with Ferroelectric Gating," Phys. Rev. Lett. 105, 166602 (2010).

Cadore et al., "Thermo Activated Hysteresis on High Quality Graphene/h-BN Devices," Nano Lett. 14, 5437 (2014).

Ahn et al., "Energy-Efficient Phase-Change Memory with Graphene as a Thermal Barrier," Nano Letters, 15, 6809 (2015).

Huang et al., "Graphene/Si CMOS Hybrid Hall Integrated Circuits," Science Reports, 4, 5548 (2014).

Ismach et al., "Direct Chemical Vapor Deposition of Graphene on Dielectric Surfaces," Nano Letters, 10, 1542 (2010).

Miro et al., "An Atlas of Two-Dimensional Materials," Chem. Soc. Rev., 2014,43, 6537-6554.

M. Jerry, et al., Ferroelectric FET Analog Synapse for Acceleration of Deep Neural Network Training, Tech. Dig.—Int. Electron Devices Meeting (IEDM), IEEE, San Francisco, CA 2017, p. 6.2.1-6.2.4, IEDM17-139 (Published—Jan. 23, 2018) 4 pages.

S. Saremi et al., Electronic Transport and Ferroelectric Switching in Ion-Bombarded, Defect-Engineered BiFeO3 Thin Films, Adv. Mater. Interfaces 2018, 5, 1700991. 9 pages.

Y.-C. Chiu, et al., Multilevel nonvolatile transistor memories using a star-shaped poly((4-diphenylamino)benzyl methacrylate) gate electret, NPG Asia Materials (2013) 5, e35; doi:10.1038/am.2012.64, 7 pages, available at https://www.nature.com/articles/am201264.

W. Wu et al.," High mobility and high on/off ratio field-effect transistors based on chemical vapor deposited single-crystal MoS2 grains", Applied Physics Letters 102, 142106 (2013) 4 pages.

S. Saremi, et al., "Local control of defects and switching properties in ferroelectric thin films", Physical Review Materials 2, 084414 (2018) 9 pages.

Kai CHANG et al., "Enhanced Spontaneous Polarization in Ultrathin SnTe Films with Layered Antipolar Structure" 2D Ferroelectrics, Advanced Science News, Adv.Mater. 2018, 1804428, 7 pages.

Wui Chung Yap et al. "Ferroelectric transistors with monolayer molybdenum disulfide and ultra-thin aluminum-doped hafnium oxide" Appl. Phys. Lett. 111, 013103 (2017); https://doi.org/10.1063/1.4991877, Jul. 2017, 6 pages.

Wui Chung Yap et al., Supplementary Material, "Ferroelectric Transistors with Monolayer Molybdenum Disulfide and Ultra-thin Aluminum-Doped Hafnium Oxide", Applied Physics Letters, 2017, 2 pages.

"Impact of different dopants on the switching properties of ferroelectric hafnium oxide", Uwe Schroeder et al. 2014 Jpn. J. Appl. Phys. 53 08LE02, 6 pages.

Yu ZHOU et al., "Out-of-plane Piezoelectricity and Ferroelectricity in Layered $\alpha$-In2Se3 Nano-flakes", NanoLetters, 2017, 17 pages.

Notification of Transmittal of the International Search Report and Written Opinion of the International Search Authority for International Patent Application No. PCT/US2019/046717, dated Nov. 17, 2019, 11 pages.

Song et al., "Controllable Synthesis of Molybdenum Tungsten Disulfide Alloy for Vertically Composition-Controlled Multilayer," Nature Communications, Jul. 23, 2015;6.

Radisavljevic et al., "Single-layer MoS2 Transistors," Nature Nanotechnology, vol. 6, Mar. 2011, pp. 147-150.

Wang et al., "Integrated Circuits Based on Bilayer MoS2 Transistors," Nano letters 12, No. 9 (2012): 4674-4680.

Kim et al., "High-mobility and Low-Power Thin-Film Transistors based on Multilayer MoS2 Crystals," Nature Communications, Aug. 21, 2012;3:1011.

U.S. Appl. No. 16/227,374, filed Dec. 20, 2018, SanDisk Technologies LLC.

U.S. Appl. No. 16/249,300, filed Jan. 16, 2019, SanDisk Technologies LLC.

U.S. Appl. No. 16/291,673, filed Mar. 4, 2019, SanDisk Technologies LLC.

U.S. Appl. No. 16/412,764, filed May 15, 2019, SanDisk Technologies LLC.

U.S. Appl. No. 16/454,458, filed Jun. 27, 2019, SanDisk Technologies LLC.

U.S. Appl. No. 16/454,475, filed Jun. 27, 2019, SanDisk Technologies LLC.

U.S. Appl. No. 16/456,736, filed Jun. 28, 2019, SanDisk Technologies LLC.

U.S. Appl. No. 16/457,687, filed Jun. 28, 2019, SanDisk Technologies LLC.

U.S. Appl. No. 16/457,721, filed Jun. 28, 2019, SanDisk Technologies LLC.

U.S. Appl. No. 16/530,256, filed Aug. 2, 2019, SanDisk Technologies LLC.

U.S. Appl. No. 16/541,289, filed Aug. 15, 2019, SanDisk Technologies LLC.

U.S. Appl. No. 16/568,668, filed Sep. 12, 2019, SanDisk Technologies LLC.

U.S. Appl. No. 16/577,176, filed Sep. 20, 2019, SanDisk Technologies LLC.

U.S. Appl. No. 16/539,103, filed Aug. 13, 2019, SanDisk Technologies LLC.

U.S. Appl. No. 16/539,124, filed Aug. 13, 2019, SanDisk Technologies LLC.

(56) References Cited

OTHER PUBLICATIONS

U.S. Appl. No. 16/694,340, filed Nov. 25, 2019, SanDisk Technologies LLC.
U.S. Appl. No. 16/778,245, filed Jan. 31, 2020, SanDisk Technologies LLC.
USPTO Office Communication, Notice of Allowance and Fee(s) Due for U.S. Appl. No. 16/778,245, dated Nov. 13, 2020, 20 pages.
Notification of Transmillal of the International Search Report and Written Opinion of the International Search Authority for International Patent Application No. PCT/US2020/039003, dated Nov. 19, 2020, 13 pages.
U.S. Appl. No. 16/798,686, filed Feb. 24, 2020, entitled "Ferroelectric Memory Devices Containing a Two-Dimensional Charge Carrier Gas Channel and Methods of Making the Same", 199 pages.
USPTO Office Communication, Ex parte Quayle Action, for U.S. Appl. No. 16/798,686, mailed on Feb. 18, 2021, 30 pages.

\* cited by examiner

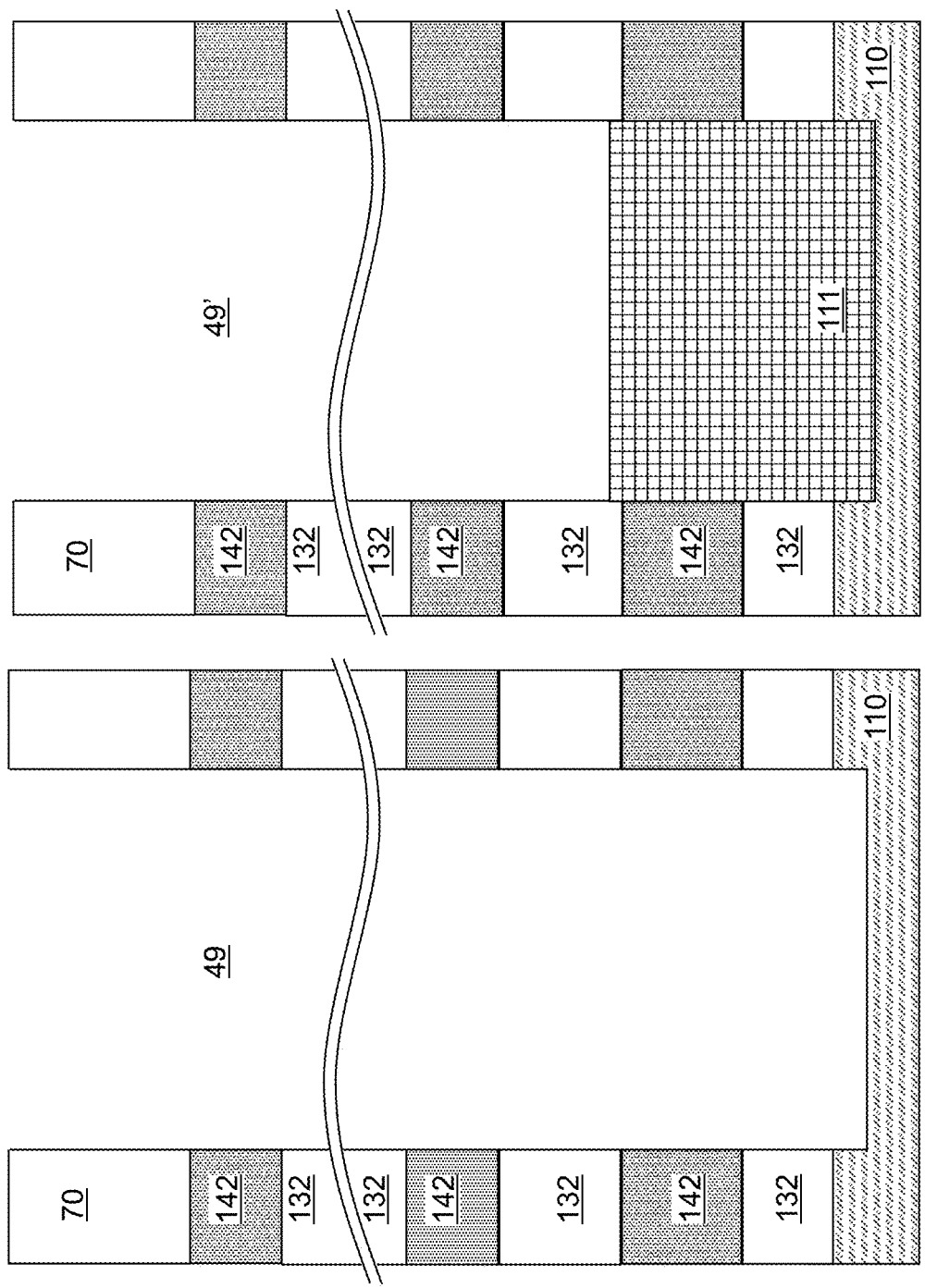

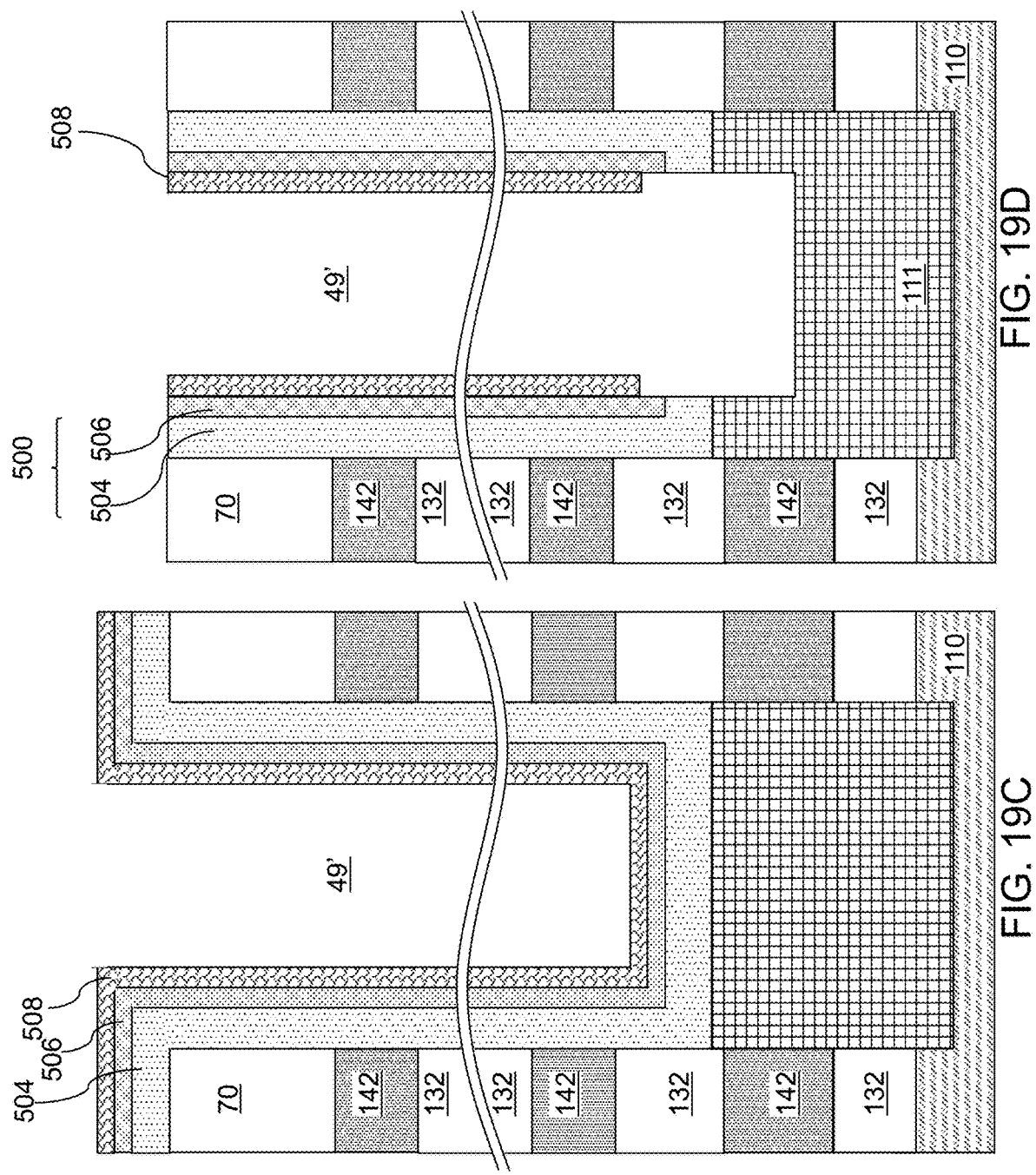

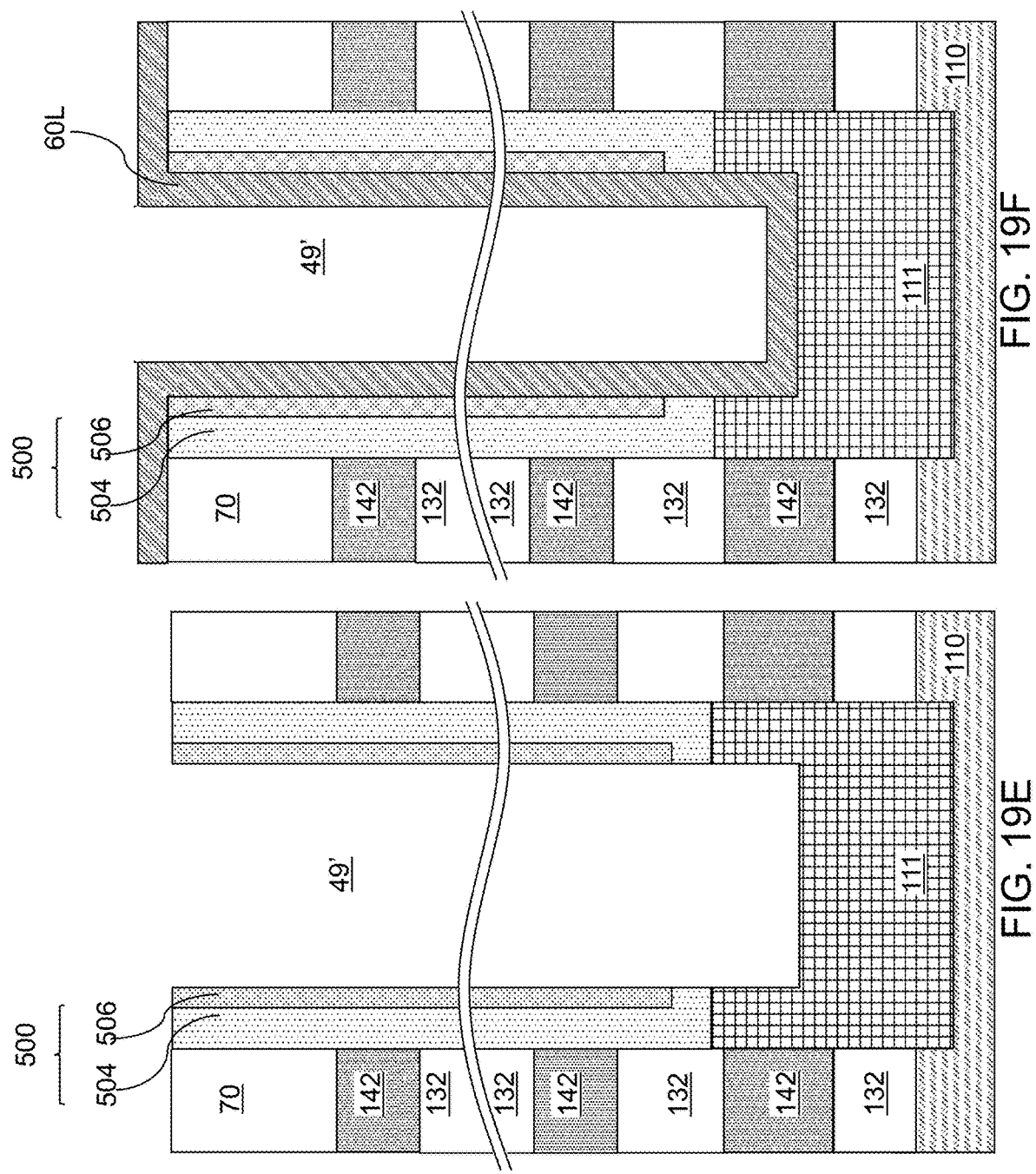

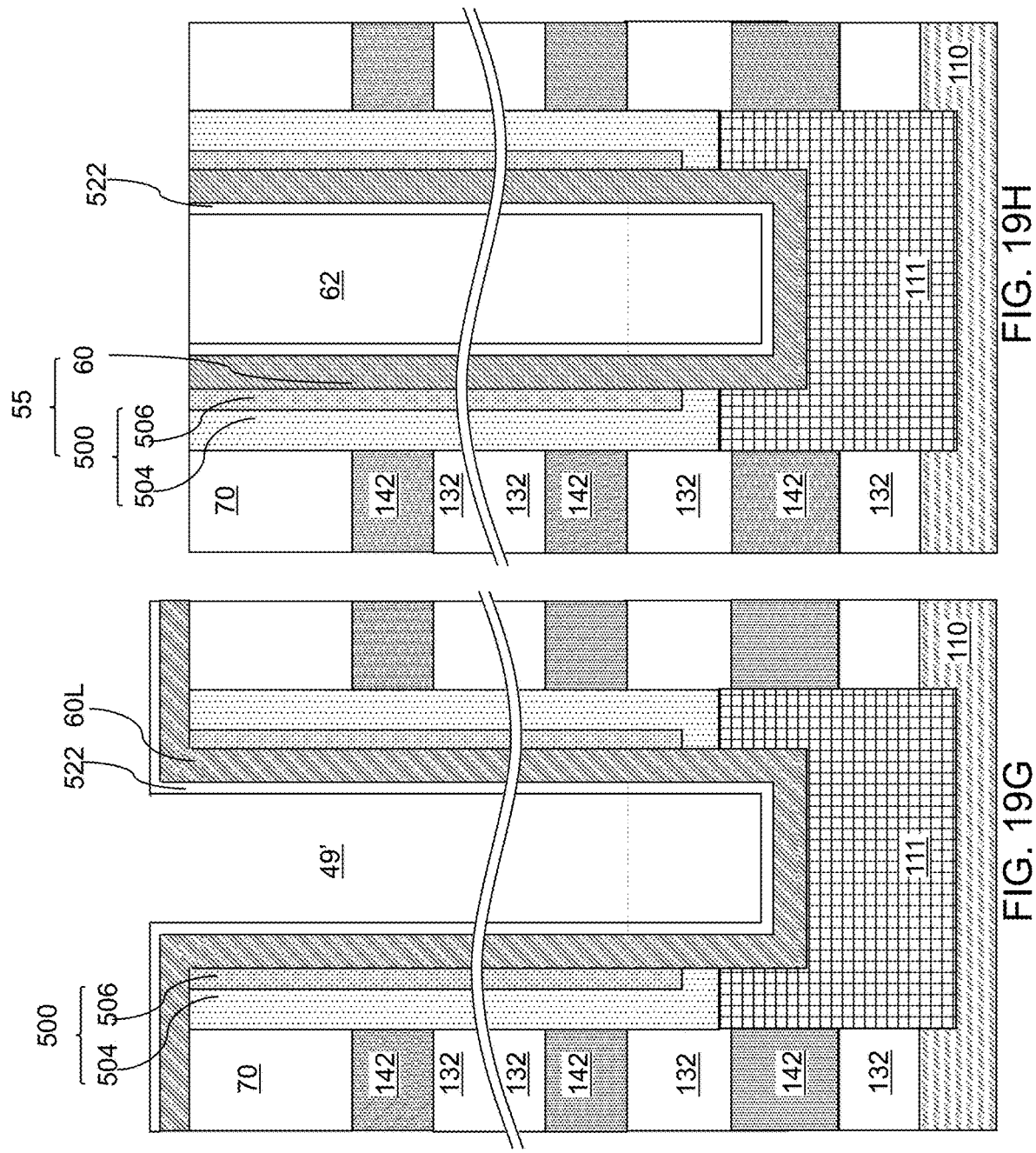

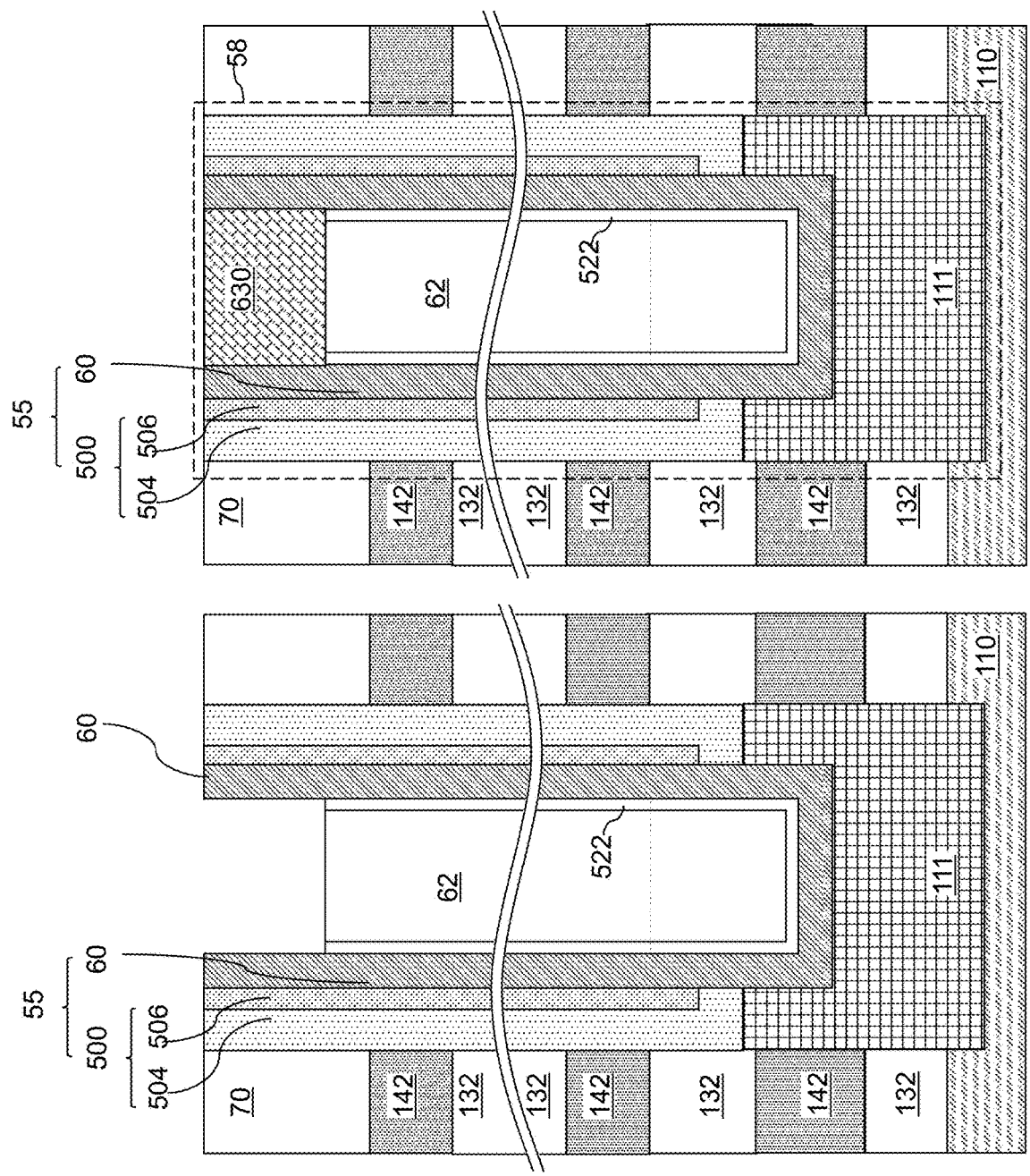

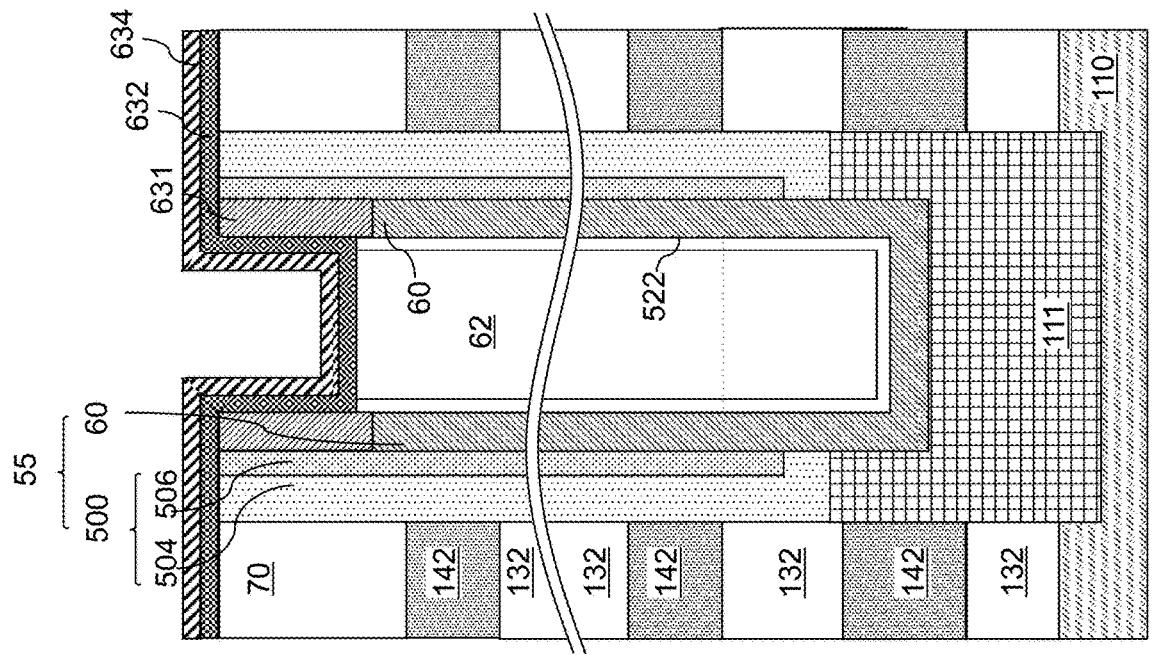
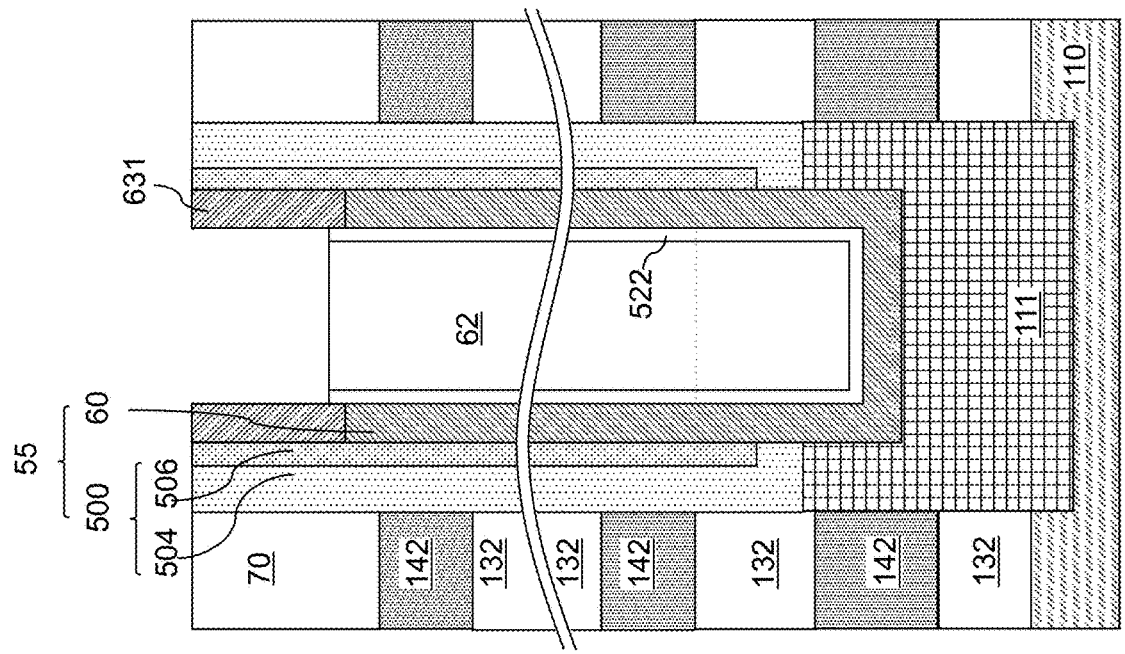

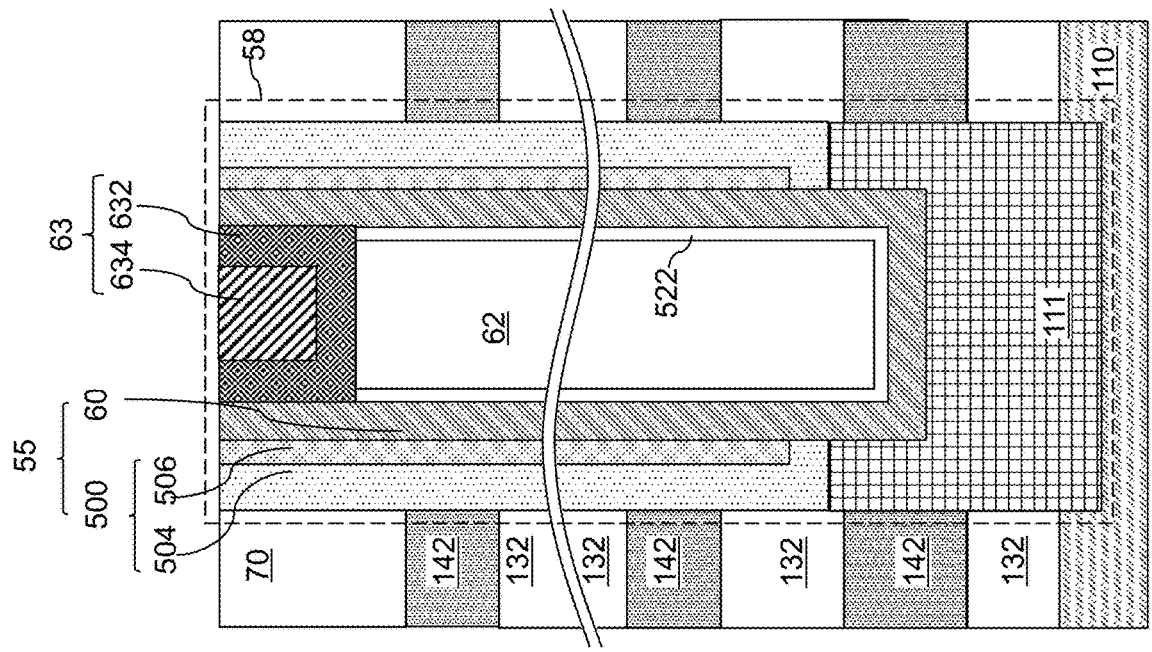
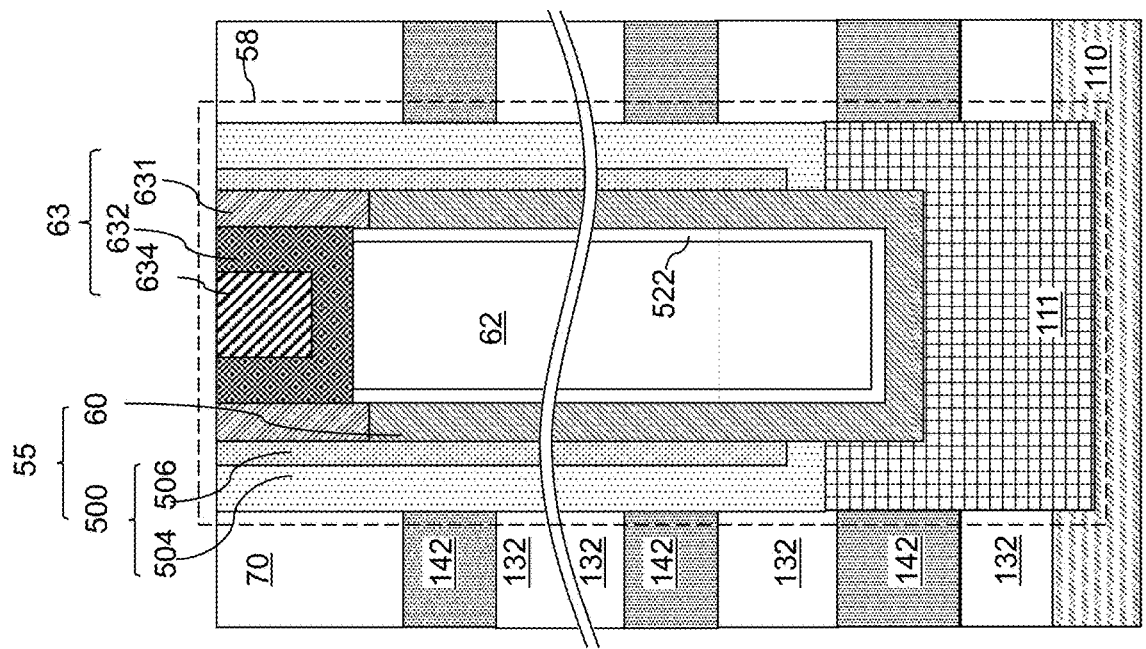

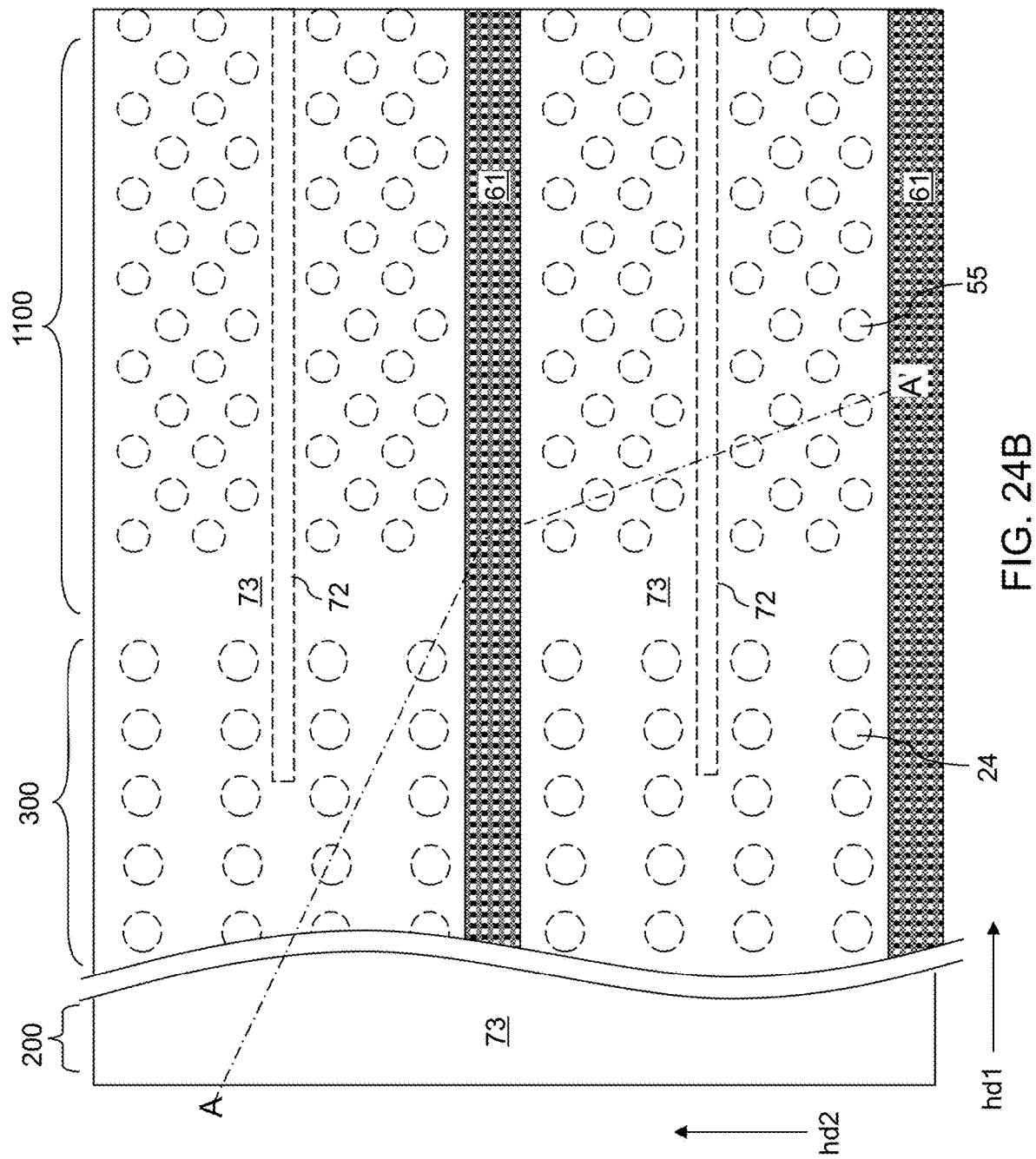

FERROELECTRIC MEMORY DEVICES CONTAINING A TWO-DIMENSIONAL CHARGE CARRIER GAS CHANNEL AND METHODS OF MAKING THE SAME

RELATED APPLICATIONS

This application is a continuation-in-part (CIP) application of U.S. application Ser. No. 16/227,889 filed on Dec. 20, 2018, the entirety of which is incorporated herein by reference.

FIELD

The present disclosure relates generally to the field of semiconductor devices and specifically to ferroelectric memory devices employing a two-dimensional charge carrier gas channel and methods of making the same.

BACKGROUND

A ferroelectric memory device is a memory device containing a ferroelectric material to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material can be detected by the electric field generated by the dipole moment of the ferroelectric material. For example, the orientation of the dipole moment can be detected by measuring electrical current passing through a semiconductor channel provided adjacent to the ferroelectric material in a field effect transistor ferroelectric memory device.

SUMMARY

According to an aspect of the present disclosure, a ferroelectric memory device includes a two-dimensional electron gas channel, a gate electrode, and a ferroelectric element located between the gate electrode and the two-dimensional electron gas channel.

According to another aspect of the present disclosure, a method of forming a monolithic three-dimensional memory device is provided, which comprises: forming an alternating stack of insulating layers and spacer material layers over a substrate, wherein the spacer material layers are formed as, or are subsequently replaced with, electrically conductive layers; forming a memory opening through the alternating stack; forming ferroelectric memory elements at a periphery of the memory opening at each level of the spacer material layers; and forming a two-dimensional electron gas channel directly on the ferroelectric memory elements in the memory opening.

According to yet another aspect of the present disclosure, a memory device is provided, which comprises: at least one unit layer stack located over a substrate, wherein the unit layer stack comprises a metallic source layer, a channel-level insulating layer, a metallic drain layer, and a device-isolation-level insulating layer; and a plurality of memory openings vertically extending through the at least one unit layer stack; memory opening fill structures located within a respective one of the plurality of memory openings, wherein each of the memory opening fill structures comprises a tubular ferroelectric dielectric layer and at least one two-dimensional cylindrical electron gas channel vertically extending between the metallic source layer and the metallic drain layer of the at least one unit layer stack.

According to still another aspect of the present disclosure, a memory device comprises a two-dimensional electron gas channel located on a substrate, a source region and a drain region located at end portions of the two-dimensional electron gas channel, a two-dimensional Van der Waals ferroelectric material layer located on the two-dimensional electron gas channel and comprising a ferroelectric material selected from $CuInP_2S_6$, $a-In_2Se_3$, g-SbP, g-SbAs, or Group IV monochalcogenide material having a formula of MX in which M is selected from Ge, Sn, or Pb, and X is selected from S, Se, or Te, and a at least one gate electrode located over two-dimensional Van der Waals ferroelectric material layer.

According to a further aspect of the present disclosure, a ferroelectric memory device comprises a channel, a gate electrode, a ferroelectric element located between the gate electrode and the channel, wherein the ferroelectric element comprises two-dimensional Van der Waals ferroelectric material layer comprising a ferroelectric material selected from $CuInP_2S_6$, $a-In_2Se_3$, g-SbP, g-SbAs, or Group IV monochalcogenide material having a formula of MX in which M is selected from Ge, Sn, or Pb, and X is selected from S, Se, or Te, and a first interfacial dielectric layer located between the ferroelectric element and the gate electrode.

According to an aspect of the present disclosure, a ferroelectric memory device contains a two-dimensional semiconductor material layer having a band gap of at least 1.1 eV and at least one of a thickness of 1 to 5 monolayers of atoms of the semiconductor material or includes a two-dimensional charge carrier gas layer; a source contact contacting a first portion of the two-dimensional semiconductor material layer; a drain contact contacting a second portion of the two-dimensional semiconductor material layer; a ferroelectric memory element located between the source and drain contacts and adjacent to a first surface of the two-dimensional semiconductor material layer; and a conductive gate electrode located adjacent to the ferroelectric memory element.

According to another aspect of the present disclosure, a method of operating the ferroelectric memory device is provided. A polarization direction of the ferroelectric memory element can be programmed by applying a positive bias voltage or a negative bias voltage to the conductive gate electrode with respective to the two-dimensional semiconductor material layer. The polarization direction of the ferroelectric memory element can be sensed by measuring the magnitude of electrical current between the source contact and the drain contact under a read voltage between the source contact and the drain contact.

According to yet another aspect of the present disclosure, a method of manufacturing the ferroelectric memory device comprises forming the two-dimensional semiconductor material layer; forming the ferroelectric memory element directly on a first surface of the two-dimensional semiconductor material layer, forming the conductive gate electrode on the ferroelectric memory element, forming the source contact on the first end portion of the two-dimensional semiconductor material layer, and forming the drain contact on the second end portion of the two-dimensional semiconductor material layer.

BRIEF DESCRIPTION OF THE DRAWINGS

FIGS. 19A-19J are sequential vertical cross-sectional views of a memory opening during formation of a first exemplary memory opening fill structure according to a fifth embodiment of the present disclosure.

FIGS. 21A-21C are sequential vertical cross-sectional views of a memory opening during formation of a second exemplary memory opening fill structure according to a sixth embodiment of the present disclosure.

FIG. 22A is a vertical cross-sectional view of a memory opening including a third exemplary memory opening fill structure according to a seventh embodiment of the present disclosure.

FIG. 22B is a vertical cross-sectional view of a memory opening including an alternate configuration for the third exemplary memory opening fill structure according to the seventh embodiment of the present disclosure.

FIG. 24B is a partial see-through top-down view of the fourth exemplary structure of FIG. 24A. The vertical plane A-A' is the plane of the vertical cross-sectional view of FIG. 24A.

DETAILED DESCRIPTION

Figure 1:
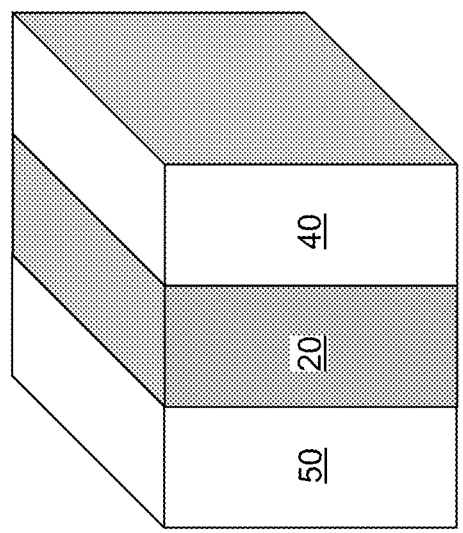
FIG. 1 is a perspective view of a metal-ferroelectric-semiconductor structure.

As discussed above, embodiments of the present disclosure are directed to ferroelectric memory devices employing a two-dimensional electron gas ("2DEG") channel, methods of operating the same, and methods of making the same. In some embodiments, a two-dimensional semiconductor material layer comprising a thickness of 5 monolayers or less, such as 1 to 4 monolayers of atoms of the semiconductor material comprises the 2DEG channel layer. The ferroelectric state of the ferroelectric memory element induces changes in the conductance in the channel by orders of magnitude. In some embodiments, the ferroelectric memory devices can be formed in a three-dimensional memory array with a tubular ferroelectric dielectric layer.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow. As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0\times10^{-6}$ S/m to $1.0\times10^5$ S/m. As used herein, a "semiconductor material" refers to a material having electrical conductivity in the range from $1.0\times10^{-6}$ S/m to 1.0 S/m in the absence of electrical dopants therein, and is capable of producing a doped material having electrical conductivity in a range from 1.0 S/m to $1.0\times10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^5$ S/m. As used herein, an "insulator material" or a "dielectric material" refers to a material having electrical conductivity less than $1.0\times10^{-6}$ S/m. As used herein, a "heavily doped semiconductor material" refers to a semiconductor material that is doped with electrical dopant at a sufficiently high atomic concentration to become a conductive material, i.e., to have electrical conductivity greater than $1.0\times10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/m to $1.0\times10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein.

As used herein, a "metallic material" refers to a conductive material including at least one metallic element therein. All measurements for electrical conductivities are made at the standard condition. As used herein, a "ferroelectric material" refers to any material that exhibits spontaneous electric polarization that can be reversed by the application of an external electric field.

Referring to FIG. 1, a metal-ferroelectric-semiconductor structure according to an embodiment of the present disclosure is illustrated. The metal-ferroelectric-semiconductor structure includes metal portion that comprises as a gate electrode 50, a ferroelectric material portion that comprises a gate dielectric/ferroelectric memory element 20, and a semiconductor portion that comprises a semiconductor channel 40 in a ferroelectric memory device to be described below.

Figure 2:
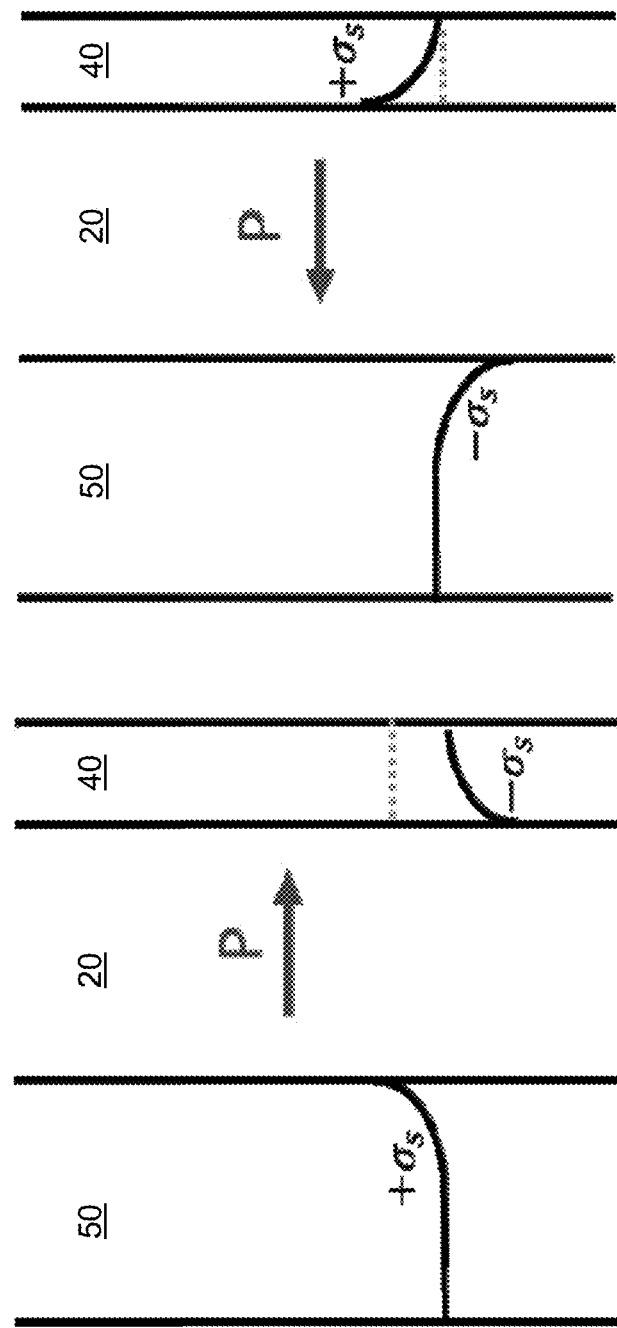
FIG. 2A is a potential diagram for a first polarization state of the metal-ferroelectric-semiconductor structure of FIG. 1.
FIG. 2B is a potential diagram for a second polarization state of the metal-ferroelectric-semiconductor structure of FIG. 1.

Referring to FIGS. 2A and 2B, potential diagrams are illustrated for polarization states of the metal-ferroelectric-semiconductor structure of FIG. 1. FIG. 2A illustrates a first polarization state of the metal-ferroelectric-semiconductor structure of FIG. 1 in which the ferroelectric polarization vector P points in the positive polarization direction from the metal portion (such as a gate electrode 50) to the semiconductor portion (such as a semiconductor channel 40). In this case, positive ferroelectric charges are present on the side of the ferroelectric material portion (such as the gate dielectric 20) at the interface with the semiconductor portion (such as the semiconductor channel 40), and negative ferroelectric charges are present on the side of the ferroelectric material portion (such as the gate dielectric 20) at the interface with the metal portion (such as the gate electrode 50). The ferroelectric charges induce screening charges within the metal portion and within the semiconductor portion. The screening charges are mobile electrical charges (such as electrons or holes) that reduce the electric fields caused by the ferroelectric charges within the ferroelectric material portion. Positive screening charges accumulate within the metal portion (such as a gate electrode 50), and negative screening charges accumulate within the semiconductor portion (such as a semiconductor channel 40).

FIG. 2B illustrates a second polarization state of the metal-ferroelectric-semiconductor structure of FIG. 1 in which the ferroelectric polarization vector P points in the negative polarization direction from the semiconductor portion (such as a semiconductor channel 40) to the metal portion (such as a gate electrode 50). In this case, negative ferroelectric charges are present on the side of the ferroelectric material portion (such as the gate dielectric 20) at the interface with the semiconductor portion (such as the semiconductor channel 40), and positive ferroelectric charges are present on the side of the ferroelectric material portion (such as the gate dielectric 20) at the interface with the metal portion (such as the gate electrode 50). The ferroelectric charges induce screening charges within the metal portion and within the semiconductor portion. Negative screening charges accumulate within the metal portion (such as a gate electrode 50), and positive screening charges accumulate within the semiconductor portion (such as a semiconductor channel 40).

The screening potential at the interface between the ferroelectric material portion and the metal portion can be controlled by switching the polarization direction of the ferroelectric material portion. The electrostatic potential $V_c(x)$ as a function of a distance x from the interface between the metal portion and the ferroelectric material portion decays with a characteristic decay distance, which is referred to as the Thomas-Fermi screening length. If the x-axis is selected such that the x-coordinate is positive within the ferroelectric material portion having a thickness of d and with the semiconductor material portion, the electrostatic potential $V_c(x)$ within the metal portion and the semiconductor material portion is governed by the equation, $$\frac{d^2 V_c(x)}{dx^2} = \frac{V_c(x)}{\lambda^2},$$

in which $\lambda$ is the Thomas-Fermi screening length within the respective material portion. In case the metal portion (such as the gate electrode 50) is much thicker than the screening length $\lambda_1$ for the metal portion, and if the semiconductor material portion (such as the semiconductor channel 40) is thinner, the solution to the electrostatic potential $V_c(x)$ for the semiconductor material portion (i.e., x>d) is given by:

$$V_c(x) = -\frac{dP\lambda'_t}{\varepsilon_0(\varepsilon(\lambda_r + \lambda'_t) + d)} e^{-|x-d|/\lambda'_t},$$

in which d is the thickness of the ferroelectric material portion, P is the ferroelectric polarization of the ferroelectric material portion, $\varepsilon_0$ is the permittivity of vacuum, $\varepsilon$ is the relative permittivity of the ferroelectric material portion (i.e., the ratio of the permittivity of the ferroelectric material portion to the permittivity of vacuum), $\lambda_l$ is the Thomas-Fermi screening length for the metal portion, $\lambda_r$ is the Thomas-Fermi screening length for the semiconductor material portion, l is the thickness of the semiconductor material portion, and $\lambda'_l$ is given by:

$$\lambda'_l \frac{\lambda_l}{1 - e^{-l/\lambda_l}}.$$

According to an aspect of the present disclosure, the electrostatic potential in the interfacial region of the semiconductor material portion in proximity to the ferroelectric material portion can be controlled by reversing the ferroelectric polarization within the ferroelectric material portion. For the positive polarization direction illustrated in FIG. 2A, the screening charges bring the Fermi level into the conduction band of the semiconductor material of the semiconductor material portion. For the negative polarization direction illustrated in FIG. 2B, the screening charges move the Fermi level towards the band gap. Thus, the Fermi level moves between a position in the semiconductor band gap and a position in one of the bands (e.g., conduction or valence band) by reversing the ferroelectric polarization direction, which leads to a large difference between the resistive (e.g., resistivity or resistance) states of the device.

According to an aspect of the present disclosure, the semiconductor material portion includes a two-dimensional semiconductor material providing high conductivity within a two-dimensional plane that is parallel to the interface between the semiconductor material portion and the ferroelectric material portion. As used herein, a two-dimensional semiconductor material refers to a semiconductor material having a thickness of 1 to 5 monolayers, such as 2 to 3 monolayers of the atoms of the semiconductor material and/or which contains a two-dimensional charge carrier gas, such as a two-dimensional electron gas. In one embodiment, the two-dimensional semiconductor material has a lateral extent along one direction that induces quantum mechanical modification of the band structure. In one embodiment, a two-dimensional semiconductor material can have a lateral direction less than 10 nm along one direction, which is herein referred to as the thickness direction of the two-dimensional semiconductor material.

According to an aspect of the present disclosure, the semiconductor material portion includes a two-dimensional semiconductor material layer having a thickness of 1 to 5 monolayer and having a band gap of at least 1 eV, such as at least 1.15 eV, for example 1.15 eV to 5.65 eV. Alternatively, it may include a layer of a two-dimensional charge carrier gas (such as a two-dimensional electron gas) and a band gap of at least 1 eV, such as at least 1.15 eV, for example 1.15 eV to 5.65 eV. As used herein, a two-dimensional charge carrier gas refers to a collection of charge carriers in quantum confinement that provides enhanced conductivity along directions that are perpendicular to the direction of the quantum confinement. For example, a two-dimensional electron gas is a two-dimensional charge carrier gas.

In one embodiment, the semiconductor material portion includes a two-dimensional semiconductor material selected from hexagonal boron nitride having a band gap of 5.62 eV, fluorinated graphene having a band gap of 2.93 eV, molybdenum disulfide having a band gap of 2.24 eV, and germanane having a band gap of 1.16 eV. The list of possible candidates of two-dimensional semiconductor materials is not limited with aforementioned materials.

Figure 3:
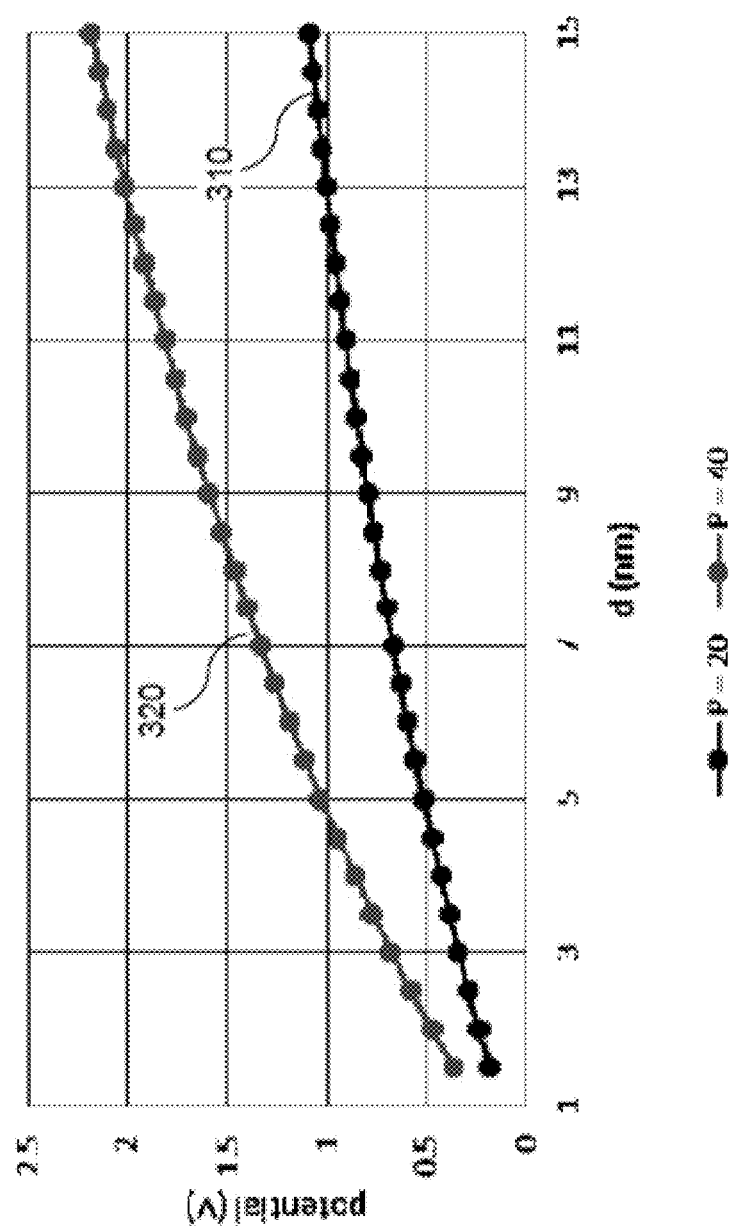
FIG. 3 is a plot of the electrostatic potential at the interface between the ferroelectric material portion and the metal portion as a function of the ferroelectric thickness for the metal-ferroelectric-semiconductor structure for two selected ferroelectric polarization densities.

FIG. 3 is a plot of the electrostatic potential $V_c(0)$ at the interface between the ferroelectric material portion and the metal portion as a function of the ferroelectric thickness d for the metal-ferroelectric-semiconductor structure of FIG. 1 calculated within the Thomas-Fermi model. According to this model the electrostatic potential $V_c(0)$ at the interface between the ferroelectric material portion and the semiconductor portion is given by:

$$V_c(0) = -\frac{dP\lambda'_l}{\varepsilon_0(\varepsilon(\lambda_r + \lambda'_l) + d)}.$$

A first curve 310 corresponds to the case in which the ferroelectric polarization is 20 $\mu C/cm^2$, the relative permittivity of the ferroelectric material portion is 90, the Thomas-Fermi screening length for the metal portion is 0.2 nm, and the Thomas-Fermi screening length for the semiconductor material portion is 0.2 nm. A second curve 320 corresponds to the case in which the ferroelectric polarization is 40 $\mu C/cm^2$, the relative permittivity of the ferroelectric material portion is 90, the Thomas-Fermi screening length for the metal portion is 0.2 nm, and the Thomas-Fermi screening length for the semiconductor material portion is 0.2 nm. Electrostatic potential greater than 1.0 V, and/or greater than 1.5 V, and/or greater than 2.0 V can be generated at the interface between the ferroelectric material portion and the metal portion through ferroelectric polarization effect.

Figure 4:
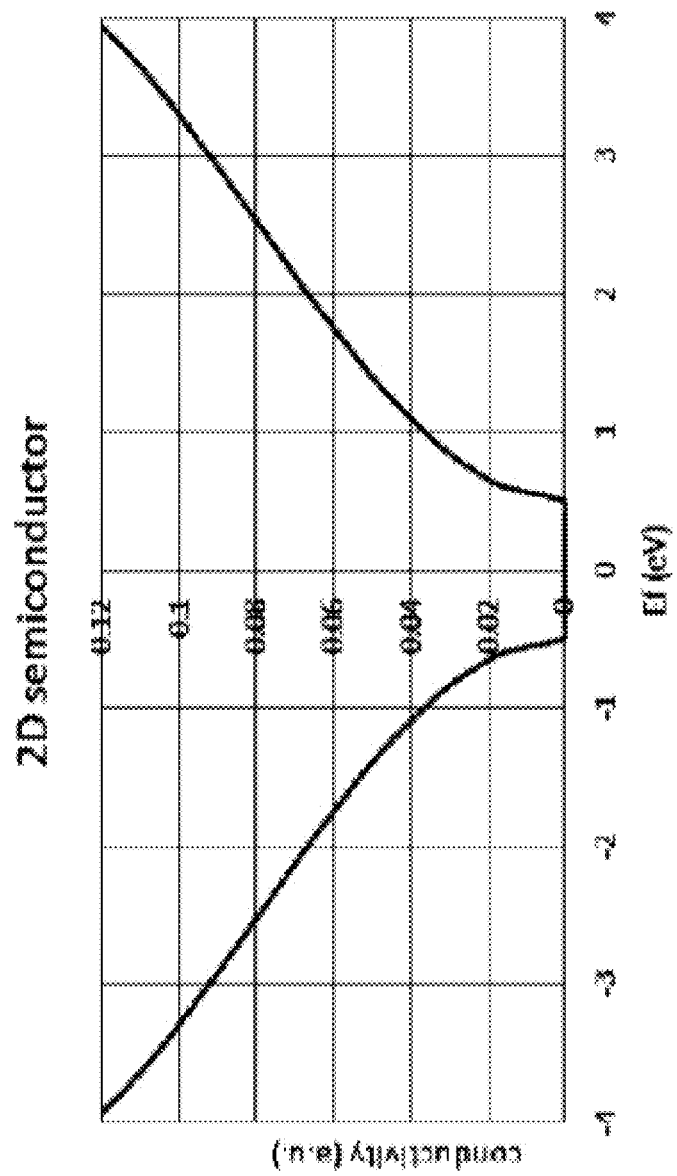
FIG. 4 is a graph of conductivity as a function of the Fermi level for a two-dimensional generic semiconductor material.

FIG. 4 a graph of electrical conductivity as a function of the Fermi level for a hypothetical two-dimensional semiconductor material (e.g., for a monolayer of the semiconductor material). For the purpose of the calculation in FIG. 4, a simple model of a two-dimensional semiconductor material based on the two-band tight binding Hamiltonian was employed. When such a two-dimensional semiconductor material is employed for the semiconductor material portion of the device of FIG. 1, it is possible to switch the state of the two-dimensional semiconductor material between a conducting state and an insulating state by reversing the direction of the ferroelectric polarization as illustrated in FIGS. 2A and 2B. In other words, the shift in the Fermi level in the device of FIG. 1 can be sufficient to provide two distinct resistive states, such as a higher resistive state and a lower resistive state, which may be, for example, a conducting state and an insulating state.

According to an embodiment of the present disclosure, the functional dependence of the electrical conductivity on the Fermi level illustrated in FIG. 4 can be physically manifested in any suitable two-dimensional semiconductor material, such as hexagonal boron nitride, fluorinated graphene, molybdenum disulfide, germanane, etc.

Table 1 below shows calculated values for the band gap and for conduction band onsite energy for the various materials that can be employed in the ferroelectric memory device of the present disclosure. The band gap values were obtained from first principles electronic structure calculations based on the hybrid functional and the tight binding onsite energies were fitted to reproduce calculated band structures.

TABLE 1

Band gap and the conduction band onsite energy for two-dimensional semiconductor materials

| Two-dimensional semiconductor material | Band gap (eV) | Conduction band on site energy (eV) |
|---|---|---|
| Hexagonal BN | 5.62 | 6.81 |
| $MoS_2$ | 2.24 | 5.12 |
| Fluorinated graphene | 2.93 | 5.465 |
| Germanane | 1.16 | 4.58 |

A list of other suitable highly stable two-dimensional semiconductor materials and their band gaps calculated within DFT taken from the following database (https://cmrdb.fysik.dtu.dk/c2db/?x=29127&limit=200) is shown in Table 2. DFT is known to underestimates the band gap values, therefore the real band gaps are expected to be larger.

TABLE 2

Band gap for additional two-dimensional semiconductor materials

| Two-dimensional semiconductor material | Band gap (eV) |
|---|---|
| $Au_2S_2$ | 1.218 |
| GeS | 2.447 |
| GeSe | 2.219 |
| GeTe | 1.468 |
| SnS | 2.288 |
| SnSe | 2.152 |
| AsBrS | 1.387 |
| AsBrSe | 1.228 |
| AsClSe | 1.374 |
| AsISe | 1.152 |
| AsIS | 1.338 |
| AsBrTe | 1.238 |
| BrSSb | 1.220 |
| ISSb | 1.223 |
| ClSbTe | 1.258 |
| VBrCl | 1.290 |
| VBrI | 1.189 |
| $Cu_2Br_2$ | 1.496 |
| $Rb_2F_2$ | 4.557 |
| $Cs_2F_2$ | 4.151 |
| $Al_2S_2$ | 2.142 |
| $Al_2Se_2$ | 2.138 |
| $Ga_2S_2$ | 2.180 |
| $In_2S_2$ | 1.604 |
| $MnCl_2$ | 2.025 |
| $MnBr_2$ | 1.775 |
| $ZnF_2$ | 4.425 |
| $ZnCl_2$ | 4.213 |
| $ZnI_2$ | 2.432 |
| $GeS_2$ | 1.344 |
| $GeO_2$ | 3.006 |
| $MnI_2$ | 1.223 |
| $ZnBr_2$ | 3.272 |
| $SnS_2$ | 1.438 |
| $BaBr_2$ | 4.902 |
| $BaCl_2$ | 5.618 |
| $CaBr_2$ | 4.863 |
| $CaI_2$ | 3.537 |
| $CdI_2$ | 2.136 |
| $GeI_2$ | 1.954 |
| $HgBr_2$ | 1.982 |
| $MgBrI_2$ | 4.588 |
| $MgI_2$ | 3.273 |
| $MnBr_2$ | 1.477 |
| $MnCl_2$ | 1.797 |
| $NiCl_2$ | 1.217 |
| $PbBr_2$ | 2.004 |
| $SrBr_2$ | 4.929 |
| $SrI_2$ | 3.984 |
| $VBr_2$ | 1.252 |
| $VCl_2$ | 1.354 |
| $VI_2$ | 1.206 |
| $ZnBr_2$ | 3.353 |
| $ZnCl_2$ | 4.453 |
| $ZnI_2$ | 1.749 |
| $CaBr_2$ | 4.128 |
| $CaCl_2$ | 4.771 |
| $CaI_2$ | 2.946 |
| $MgCl_2$ | 4.762 |
| $SrCl_2$ | 4.944 |
| $Co_2Cl_6$ | 1.130 |
| $Cr_2Br_6$ | 1.644 |
| $Cr_2Cl_6$ | 1.735 |
| $Mo_2Br_6$ | 1.561 |
| $Rh_2Br_6$ | 1.344 |
| $Rh_2Cl_6$ | 1.590 |
| $Cr_2CF_2$ | 1.166 |
| $Y_2CF_2$ | 1.117 |
| MoSeTe | 1.136 |
| MoSSe | 1.453 |
| WSSe | 1.401 |
| WSTe | 1.142 |
| BiBrS | 1.250 |
| BiClS | 1.497 |
| BiClSe | 1.290 |
| BrSSb | 1.427 |
| BrSbTe | 1.318 |
| BrSbSe | 1.462 |
| AsBrS | 1.417 |
| $Pd_2S_4$ | 1.120 |
| $Pd_2Se_4$ | 1.313 |
| $Pd_2Te_4$ | 1.212 |
| $Pt_2S_4$ | 1.802 |
| $Pt_2Se_4$ | 1.441 |
| $Pt_2Te_4$ | 1.309 |
| $Re_4S_8$ | 1.276 |
| $Re_4Se_8$ | 1.110 |
| $GeO_2$ | 3.641 |
| $HfS_2$ | 1.221 |
| $MoSe_2$ | 1.321 |
| $NiO_2$ | 1.281 |
| $PbO_2$ | 1.346 |
| $PbS_2$ | 1.390 |
| $PdO_2$ | 1.379 |
| $PdS_2$ | 1.171 |
| $PtO_2$ | 1.674 |
| $PtS_2$ | 1.688 |
| $PtSe_2$ | 1.167 |
| $SnO_2$ | 2.683 |
| $SnS_2$ | 1.587 |
| $WO_2$ | 1.340 |
| $WS_2$ | 1.534 |
| $WSe_2$ | 1.238 |
| $ZrS_2$ | 1.159 |
| $CrW_3S_8$ | 1.126 |
| $Mo_2W_2S_8$ | 1.532 |
| $Mo_3WS_8$ | 1.559 |
| $MoW_3S_8$ | 1.258 |
| $Al_2Br_2O_2$ | 4.142 |
| $Al_2Br_2S_2$ | 2.263 |
| $Al_2Br_2Se_2$ | 1.535 |
| $Al_2Cl_2S_2$ | 2.334 |
| $Al_2I_2S_2$ | 1.615 |
| $Al_2I_2Se_2$ | 1.493 |
| $Cr_2Cl_2O_2$ | 1.190 |
| $Ga_2Br_2O_2$ | 2.515 |
| $Hf_2Br_2N_2$ | 2.064 |
| $Hf_2Cl_2N_2$ | 2.101 |
| $Sc_2Br_2S_2$ | 2.130 |
| $Sc_2Br_2Se_2$ | 1.510 |
| $Sc_2Cl_2Se_2$ | 1.409 |
| $Sc_2I_2S_2$ | 1.662 |
| $Sc_2I_2Se_2$ | 1.393 |
| $Al_2S_2$ | 2.085 |
| $Al_2Se_2$ | 1.997 |
| $Al_2Te_2$ | 1.748 |
| $Ga_2O_2$ | 1.556 |
| $Ga_2S_2$ | 2.321 |
| $Ga_2Se_2$ | 1.765 |

TABLE 2-continued

Band gap for additional two-dimensional semiconductor materials

| Two-dimensional semiconductor material | Band gap (eV) |
|---|---|
| $In_2S_2$ | 1.675 |
| $Hf_2O_6$ | 3.470 |
| $Ti_2O_6$ | 2.461 |
| $Zr_2O_6$ | 3.586 |
| $Mn_2Br_4$ | 1.818 |
| $Mn_2Cl_4$ | 2.033 |
| $Mn_2I_4$ | 1.349 |
| $Mn_2O_4$ | 1.287 |
| $Ti_2O_4$ | 2.855 |
| $V_2Br_4$ | 1.294 |
| $V_2Cl_4$ | 1.426 |
| $V_2I_4$ | 1.157 |
| $C_2H_2$ | 3.460 |
| $CH_2Si$ | 4.000 |

Figure 5:
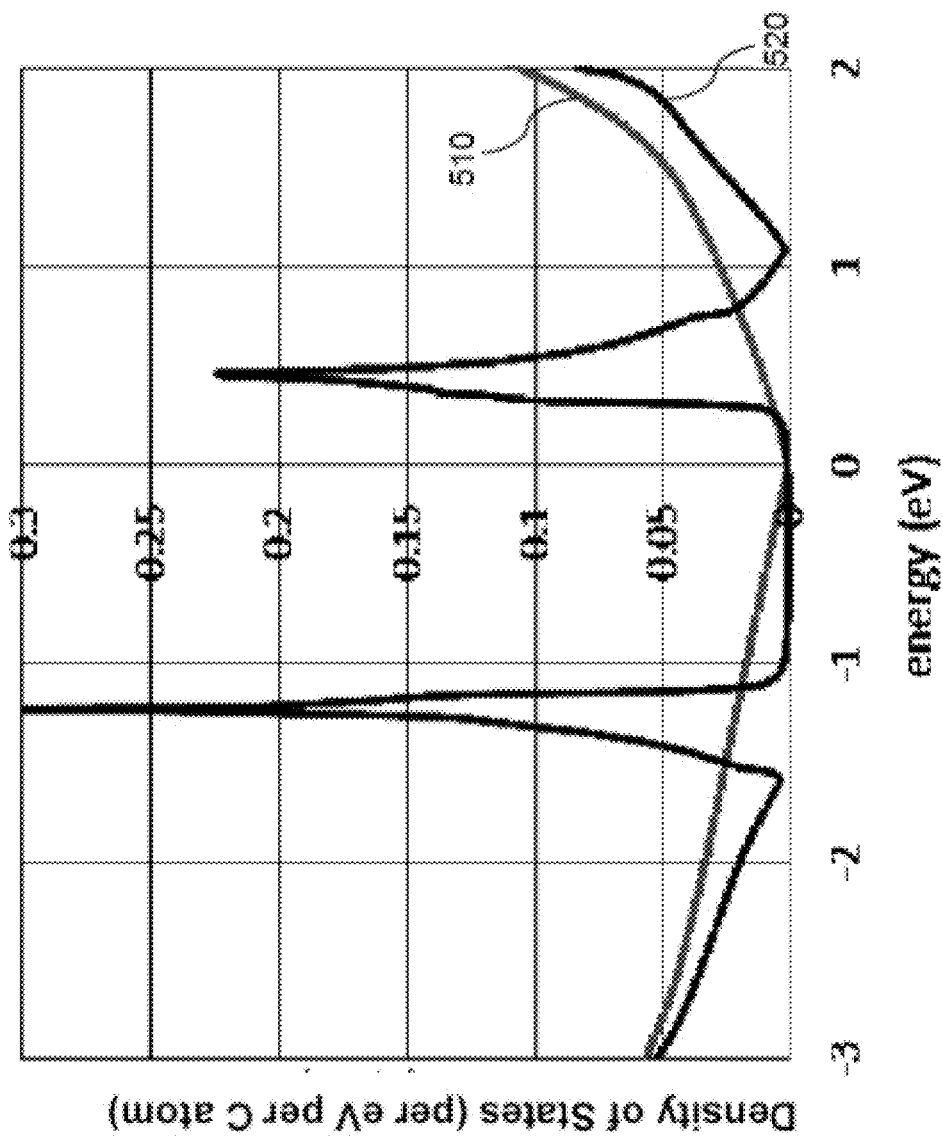
FIG. 5 is a graph of the density of states per eV per atom for pristine graphene and for fluorinated graphene calculated within the tight binding model.

Pristine graphene (i.e., graphene without defects or dopants) is an electrical conductor which lacks a band gap, while a fluorinated graphene is a semiconductor having a band gap. FIG. 5 is a graph of the density of states per eV per carbon atom for pristine graphene and for fluorinated graphene. The tight binding model was employed for the purpose of the calculation for the density of states per energy. Curve 510 represents the density of states per eV per carbon atom for pristine graphene. Curve 520 represents the density of states per eV per carbon atom for fluorinated graphene. Pristine graphene provides non-zero density of states at all energies other than zero, and thus, does not provide a voltage at which pristine graphene becomes insulating. Fluorinated graphene provides an energy band at which the density of states is zero, and thus, provides a voltage range at which fluorinated graphene functions as an insulating material.

Figure 6:
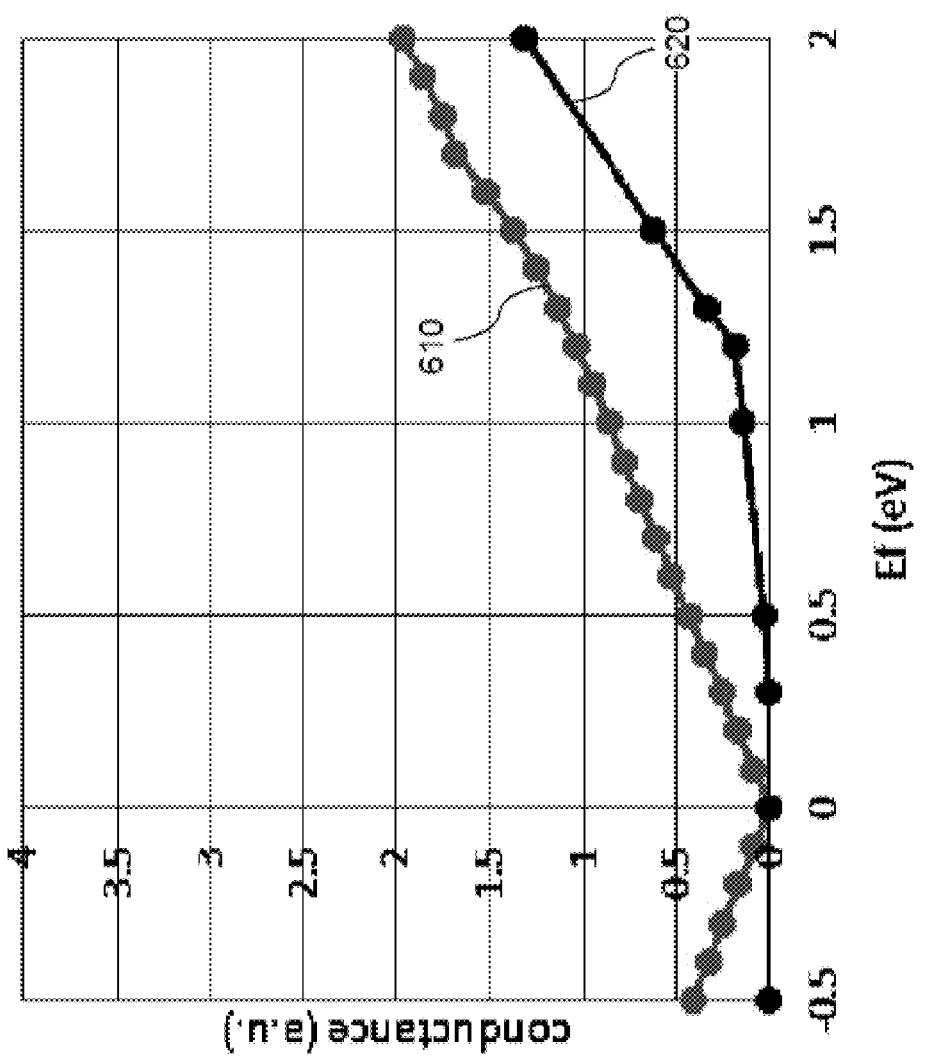
FIG. 6 is a graph of the conductance as a function of Fermi level for pristine graphene and for fluorinated graphene calculated within the tight binding model.

Referring to FIG. 6, the calculated conductance of pristine graphene and fluorinated graphene is plotted as a function of the Fermi energy. Curve 610 represents the conductance of pristine graphene, and curve 620 represents the conductance of fluorinated graphene. Fluorinated graphene provides an energy range in which conductance is negligible and the fluorinated graphene functions as an insulating material for Fermi level of 0.5 eV or less. In contrast, pristine graphene does not provide an energy range in which pristine graphene can function as an insulating material.

The atomic percentage of fluorine in the fluorinated graphene can be in a range from 0.1% to 60%, such as from 0.5% to 50%, including from 0.1% to 0%. Thus, fluorinated graphene can include but is not limited to graphene fluoride having a roughly 1:1 ratio of carbon to fluorine atoms. The location and the width of the energy band at which the density of states is zero in fluorinated graphene changes with the atomic concentration of the fluorine atoms within fluorinated graphene.

Thus, switching between an insulating state and a conducting state within the device of FIG. 1 is possible for fluorinated graphene semiconductor material which functions as the semiconductor material portion. Other semiconductor materials which have a sufficient band gap, such as molybdenum disulfide, hexagonal boron nitride, or germanane may be employed in lieu of fluorinated graphene in the device of FIG. 1.

Figure 7:
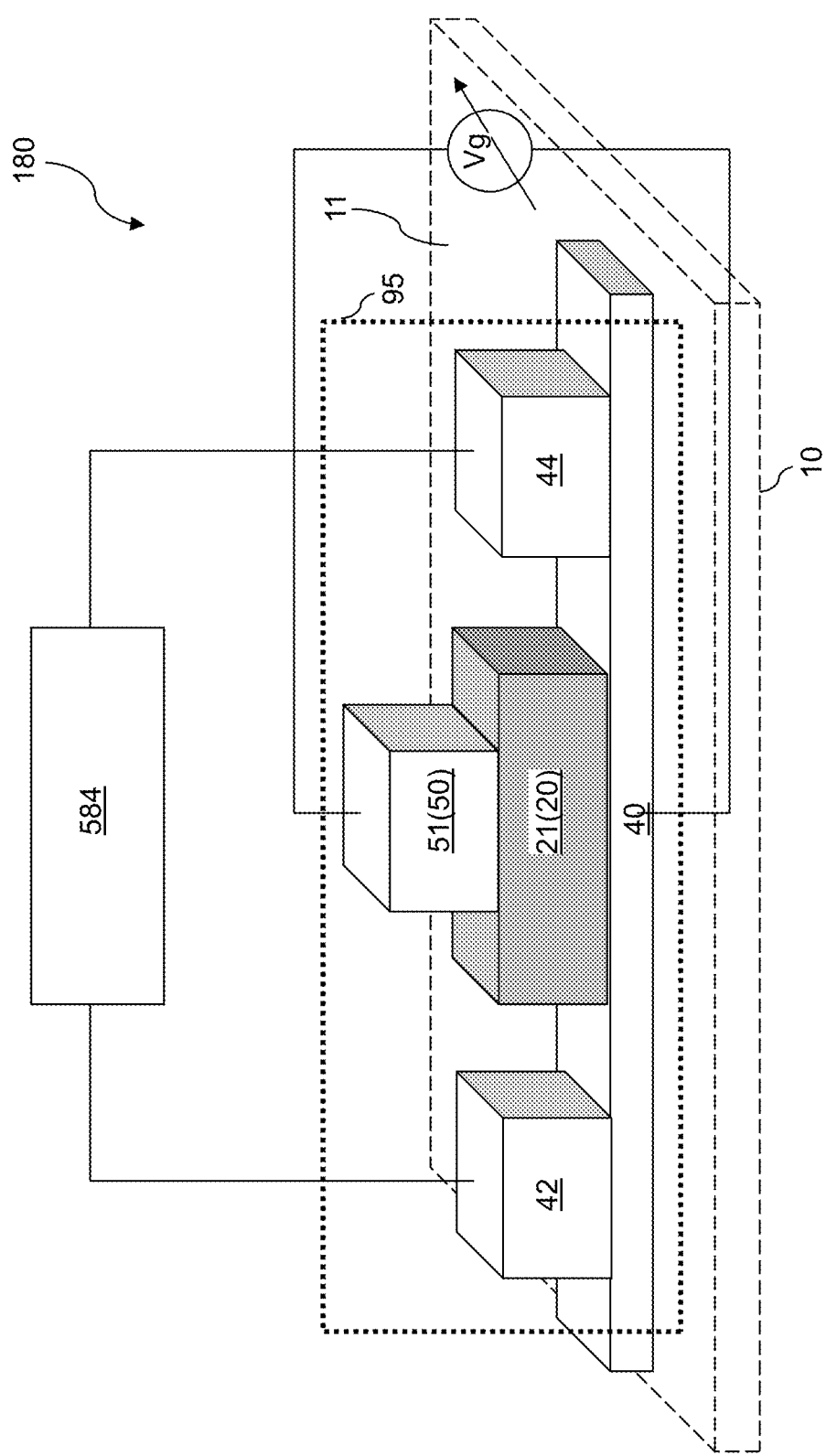
FIG. 7 is a first exemplary structure according to a first embodiment of the present disclosure.

FIG. 7 illustrates a first exemplary structure 180 according to a first embodiment of the present disclosure. The first ferroelectric memory device 180 includes a transistor 95 containing semiconductor channel 40. The semiconductor channel 40 can be configured to provide a two-dimensional charge carrier gas layer, such as a 2DEG layer or a semiconductor material selected from fluorinated graphene, hexagonal boron nitride, molybdenum disulfide, germanane, or a similar two-dimensional material with a sufficient band gap. The semiconductor channel 40 may consist of only the two-dimensional charge carrier gas layer or it may include additional semiconductor material in addition to the two-dimensional charge carrier gas layer. The two-dimensional charge carrier gas layer can be located within a two-dimensional Euclidean plane. In one embodiment, the semiconductor channel 40 can have a thickness in a range from 0.3 nm to 10 nm, such as from 0.6 nm to 5 nm. The two-dimensional charge carrier gas layer functions as a channel within a transistor 95 (e.g., a ferroelectric memory cell) of the first ferroelectric memory device 180.

A ferroelectric memory element 21 is located adjacent to, such as on a surface of, the semiconductor channel 40, i.e., on a surface of the two-dimensional charge carrier gas layer. The ferroelectric memory element 21 functions as a gate dielectric 20 within the transistor 95 of the first ferroelectric memory device 180. The ferroelectric memory element 21 is in contact with a first surface of the semiconductor channel 40. The ferroelectric memory element 21 includes, and/or consists essentially of, at least one ferroelectric material such as barium titanate (such as $BaTiO_3$; BT) colemanite (such as $Ca_2B_6O_{11}.5H_2O$), bismuth titanate (such as $Bi_{12}TiO_{20}$, $Bi_4Ti_3O_{12}$ or $Bi_2Ti_2O_7$), europium barium titanate, ferroelectric polymer, germanium telluride, langbeinite (such as $M_2M'_2(SO_4)_3$ in which M is a monovalent metal and M' is a divalent metal), lead scandium tantalate (such as $Pb(Sc_xTa_{1-x})O_3$), lead titanate (such as $PbTiO_3$; PT), lead zirconate titanate (such as $Pb(Zr,Ti)O_3$; PZT), lithium niobate (such as $LiNbO_3$; LN), ($LaAlO_3$)), polyvinylidene fluoride $(CH_2CF_2)_n$, potassium niobate (such as $KNbO_3$), potassium sodium tartrate (such as $KNaC_4H_4O_6.4H_2O$), potassium titanyl phosphate (such as $KO_5PTi$), sodium bismuth titanate (such as $Na_{0.5}Bi_{0.5}TiO_3$ or $Bi_{0.5}Na_{0.5}TiO_3$), lithium tantalate (such as $LiTaO_3$ (LT)), lead lanthanum titanate (such as $(Pb,La)TiO_3$ (PLT)), lead lanthanum zirconate titanate (such as $(Pb,La)(Zr,Ti)O_3$ (PLZT)), ammonium dihydrogen phosphate (such as $NH_4H_2PO_4$ (ADP)), or potassium dihydrogen phosphate (such as $KH_2PO_4$ (KDP)). In one embodiment, the ferroelectric memory element 21 comprises, and/or consists essentially of, a ferroelectric dielectric material.

A front side conductive gate electrode 51 is located directly on the ferroelectric memory element 21 on the opposite side of the semiconductor channel 40. The front side conductive gate electrode 51 functions as the gate electrode 50 of the transistor 95 of the first ferroelectric memory device 180. The conductive gate electrode 51 is in contact with the ferroelectric memory element 21. The conductive gate electrode 51 can include, and/or consist essentially of, a metallic material such as an elemental metal (Ti, Ta, or W), an intermetallic alloy of at least two elemental metals, a metal-semiconductor compound (such as a metal silicide), or a conductive metallic alloy of at least one elemental metal (such as Ti, Ta, W) and a nonmetallic element (such as nitrogen and/or oxygen, such as TiN or WN).

A source contact 42 contacts a first portion of the semiconductor channel 40 and a drain contact 44 contacts a second portion of the semiconductor channel. The ferroelectric memory element 21 is located between the source contact 42 and the drain contact 44. The source contact 42 and the drain contact 44 can comprise, and/or consist essentially of, a respective metallic contact material. The metallic contact material may be a metal-semiconductor compound, a conductive metallic nitride, an elemental metal, or an intermetallic alloy material. In one embodiment, a metallic material that can be used for the conductive gate electrode 51 can also be used for the source contact 42 and the drain contact 44.

In one embodiment, the two-dimensional charge carrier gas layer is located within 10 nm from a two-dimensional Euclidian plane that includes an interface between the semiconductor channel 40 and the ferroelectric memory element 21.

The transistor 95 of the first exemplary structure 180 can be formed, for example, by forming the semiconductor channel 40 over a substrate 10, by forming the ferroelectric memory element 21 directly on the first surface of the semiconductor channel 40, by forming the conductive gate electrode 51 on the ferroelectric memory element 21, by forming the source contact 42 on the first portion of the semiconductor channel 40, and by forming the drain contact 44 on the second portion of the semiconductor channel 40. The substrate 10 has a planar top surface 11 that contacts a bottom surface of the semiconductor channel 40. In the embodiment shown in FIG. 7, the direction between the semiconductor channel 40 and the conductive gate electrode 51 is normal to the planar top surface 11 of the substrate 10. Alternatively, in the embodiment shown in FIG. 8, the transistor 95 may be rotated 90 degrees with respect to the transistor 95 shown in FIG. 7 such that the direction between the semiconductor channel 40 and the conductive gate electrode 51 is parallel to the plane of the planar top surface 11 of the substrate 10. The substrate 10 may comprise any suitable supporting substrate, such as a semiconductor wafer, an insulating substrate or a conductive substrate containing an insulating layer over its planar top surface 11.

During programming, a variable gate bias voltage $V_g$ can be applied to the conductive gate electrode 51 relative to the semiconductor channel 40 to program the polarization of the ferroelectric memory element 21. During sensing, a source-drain bias voltage is applied between (e.g., across) the source contact 42 and the drain contact 44 and by applying a gate sensing bias voltage to the conductive gate electrode 51. A sense circuitry 584 can measure the source-drain current while applying the source-drain bias voltage between (e.g., across) the source contact 42 and the drain contact 44.

Figure 8:
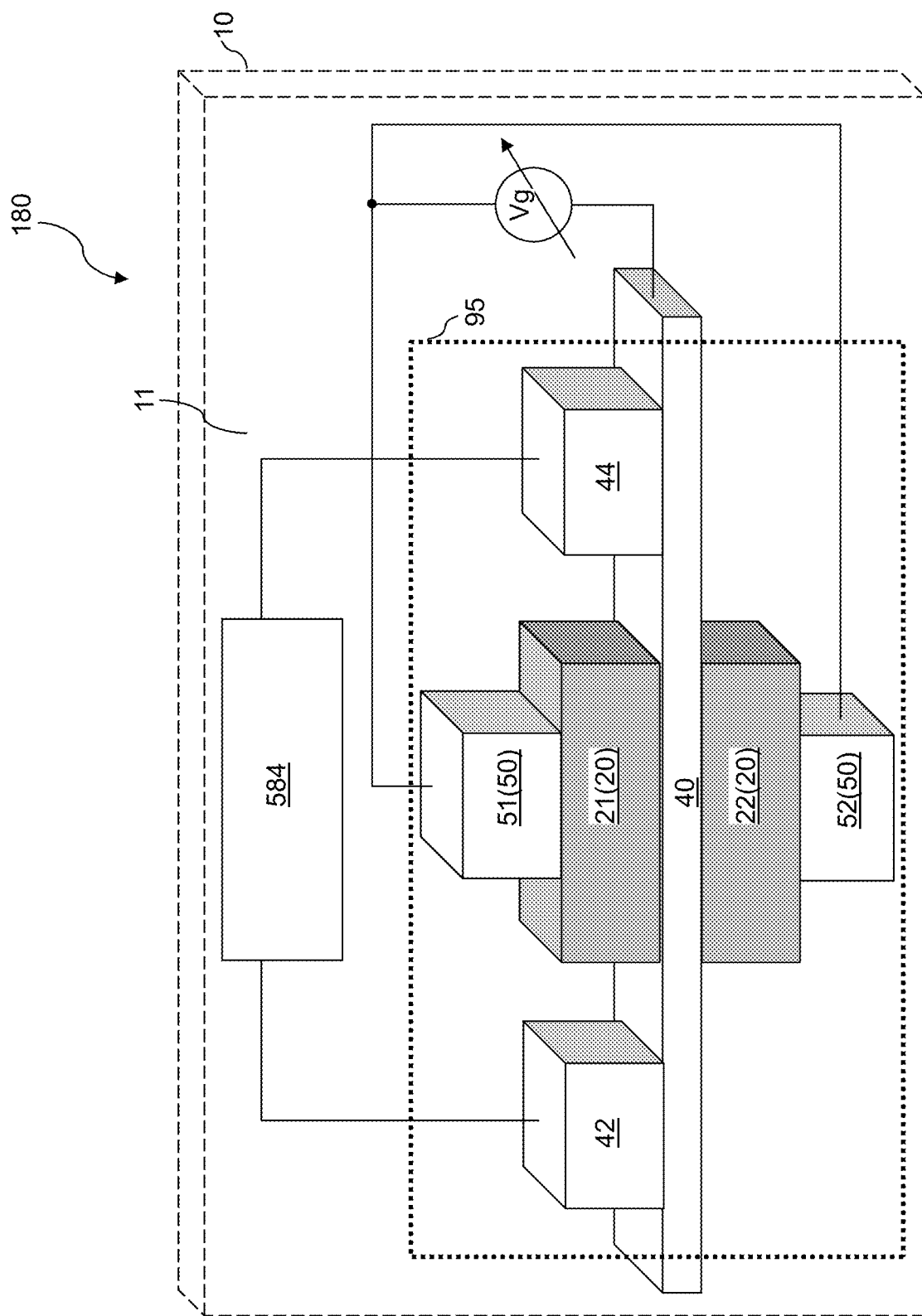
FIG. 8 is a second exemplary structure according to a second embodiment of the present disclosure.

Referring to FIG. 8, a second exemplary structure 180 according to a second embodiment of the present disclosure can be derived from the first exemplary structure 180 of FIG. 7 by providing a backside ferroelectric memory element 22 in contact with a second surface of the semiconductor channel 40. The backside ferroelectric memory element 22 is an additional ferroelectric material portion that functions as an additional gate dielectric 20. The backside ferroelectric memory element 22 is located on a second surface of the semiconductor channel 40, which is parallel to the first surface of the semiconductor channel 40 and is located on the opposite side of the first surface of the semiconductor channel 40. The backside ferroelectric memory element 22 can have the same thickness as the ferroelectric memory element 21, and can include any ferroelectric material that can be employed for the ferroelectric memory element 21.

A conductive backside gate electrode 52 is provided on the backside ferroelectric memory element 22. The conductive backside gate electrode 52 can be in contact with the backside ferroelectric memory element 22. The conductive backside gate electrode 52 can include any material that can be employed for the conductive gate electrode 51. An electrically conductive path connecting the conductive backside gate electrode and the conductive gate electrode, thereby electrically shorting the conductive backside gate electrode 52 to the conductive gate electrode 51.

In one embodiment, the polarization of the ferroelectric memory element 21 and the polarization of the backside ferroelectric memory element 22 can point in opposite directions. Thus, the polarization of the ferroelectric memory element 21 and the polarization of the backside ferroelectric memory element 22 can point toward the semiconductor channel 40 in a first ferroelectric memory state, and the polarization of the ferroelectric memory element 21 and the polarization of the backside ferroelectric memory element 22 can point away from the semiconductor channel 40 in a second ferroelectric memory state. Thus, positive ferroelectric charges are present in the ferroelectric memory element 21 and the backside ferroelectric memory element 22 near the interfaces with the semiconductor channel 40 in the first ferroelectric memory state, which induces negative screening charges (mobile electrons) in the two-dimensional charge carrier gas layer near the interfaces with the ferroelectric memory element 21 and the backside ferroelectric memory element 22. Alternatively, if a semi-conducting layer is used instead of a two-dimensional charge carrier gas layer, the induced charges will act to shift the Fermi energy and change the conductive state of the semiconducting layer. Likewise, negative ferroelectric charges are present in the ferroelectric memory element 21 and the backside ferroelectric memory element 22 near the interfaces with the semiconductor channel 40 in the second ferroelectric memory state, which induces positive screening charges (holes, i.e., absence of elections) in the two-dimensional charge carrier gas layer near the interfaces with the ferroelectric memory element 21 and the backside ferroelectric memory element 22. The second exemplary structure 180 can be operated by applying the same voltage (e.g., the same polarity voltage pulses) to the conductive backside gate electrode 52 as the voltage applied to the front side conductive gate electrode 51.

The thickness of the semiconductor channel 40 in the second exemplary structure 180 can be the same as the thickness of the semiconductor channel in the first exemplary structure 180. Alternatively, the thickness of the semiconductor channel 40 in the second exemplary structure 180 can be in a range from 1.0 times the thickness of the semiconductor channel 40 in the first exemplary structure 180 to 2.0 times the thickness of the semiconductor channel in the first exemplary structure 180. The increased thickness window for the semiconductor channel 40 in the second exemplary structure 180 is due to the dual gate configuration in which the screening charges are induced from two different ferroelectric polarizations in an additive manner.

The transistor 95 of the second exemplary structure 180 can be formed by modifying the method for forming the transistor 95 of the first exemplary structure 180. In addition to the processing steps employed to form the various components of the first exemplary structure 180, the backside ferroelectric memory element 22 can be formed on the second surface of the semiconductor channel 40, and the conductive backside gate electrode 52 can be formed on the backside ferroelectric memory element 22.

In one embodiment, the transistor 95 of the second exemplary structure 180 may be supported by the substrate 10 having the planar top surface 11 that is perpendicular to the plane of the interface between the semiconductor channel 40 and the ferroelectric memory element 21 and is parallel to the direction of the electrical current in the semiconductor channel 40 during a sensing operation, i.e., the direction between the source contact 42 and the drain contact 44.

Alternatively, the transistor 95 shown in FIG. 8 may be rotated by 90 degrees to have configuration similar to that shown in FIG. 7. In this alternative configuration, the conductive backside gate electrode 52 is formed over the substrate 10, the backside ferroelectric memory element 22 is formed over the conductive backside gate electrode 52, the semiconductor channel 40 is formed over the backside ferroelectric memory element 22, the ferroelectric memory element 21, the source contact 42 and the drain contact 44 are formed over the semiconductor channel 40, and the front side conductive gate electrode 51 is formed over the ferroelectric memory element 21.

Figure 9:
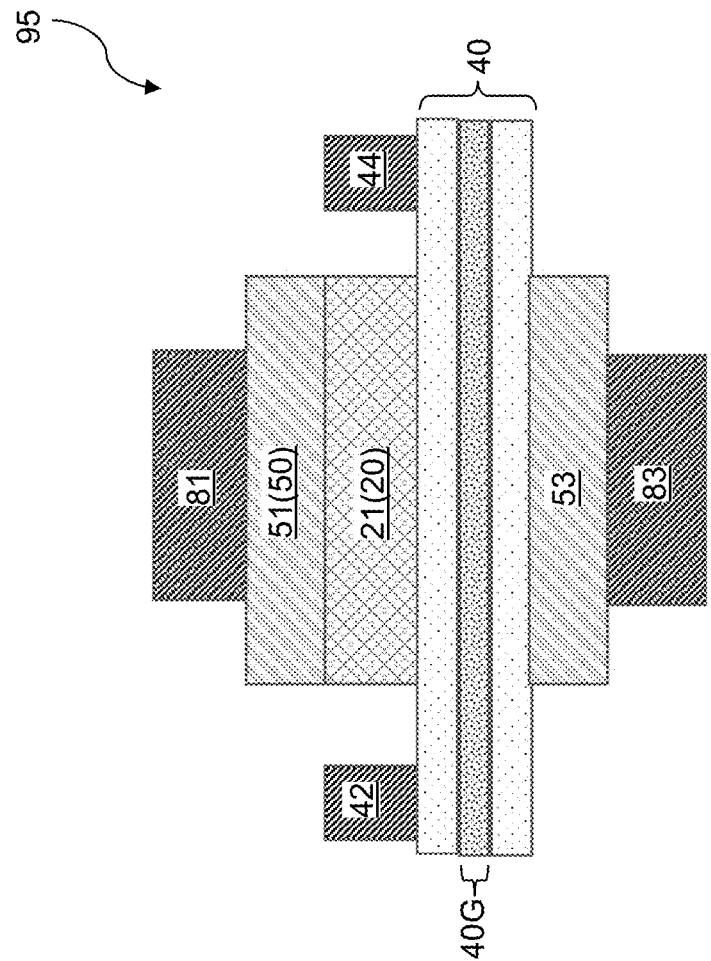
FIG. 9 is a third exemplary structure according to a third embodiment of the present disclosure.

Referring to FIG. 9, a transistor 95 of a third exemplary structure according to an embodiment of the present disclosure is illustrated, which can be derived from the first exemplary structure 180 by forming a backside contact electrode 53 directly on the second surface of the semiconductor channel 40. A two-dimensional semiconductor material layer 40G within the semiconductor channel 40 is expressly illustrated. A described above, the two-dimensional semiconductor material layer 40G may comprise the entire semiconductor channel 40 or just a portion of the semiconductor channel 40. The two-dimensional semiconductor material layer 40G can have a band gap of at least 1.1 eV, can include a thickness of 1 to 5 monolayers of the atoms of the semiconductor material and/or can include a two-dimensional charge carrier gas layer. The second surface of the semiconductor channel 40 is located on the opposite side of the first surface of the semiconductor channel 40. Thus, the backside contact electrode 53 can be in contact with the second surface of the semiconductor channel 40. The backside contact electrode 53 can apply a backside bias voltage to the semiconductor channel 40 during programming of the ferroelectric polarization of the ferroelectric memory element 21. Optionally, a front gate contact 81 and/or a back gate contact 83 may be formed on the conductive gate electrode 51 and on the backside contact electrode 53, respectively, to facilitate application of bias voltages that are employed during operation of the transistor 95 of the third exemplary structure. In an alternative embodiment, layers 51 and/or 53 illustrated in FIG. 9 may comprise gate insulating layers and contacts 81 and/or 83 may comprise the front side conductive gate electrode and the backside contact electrode (e.g., a back gate), respectively.

Figure 10A:
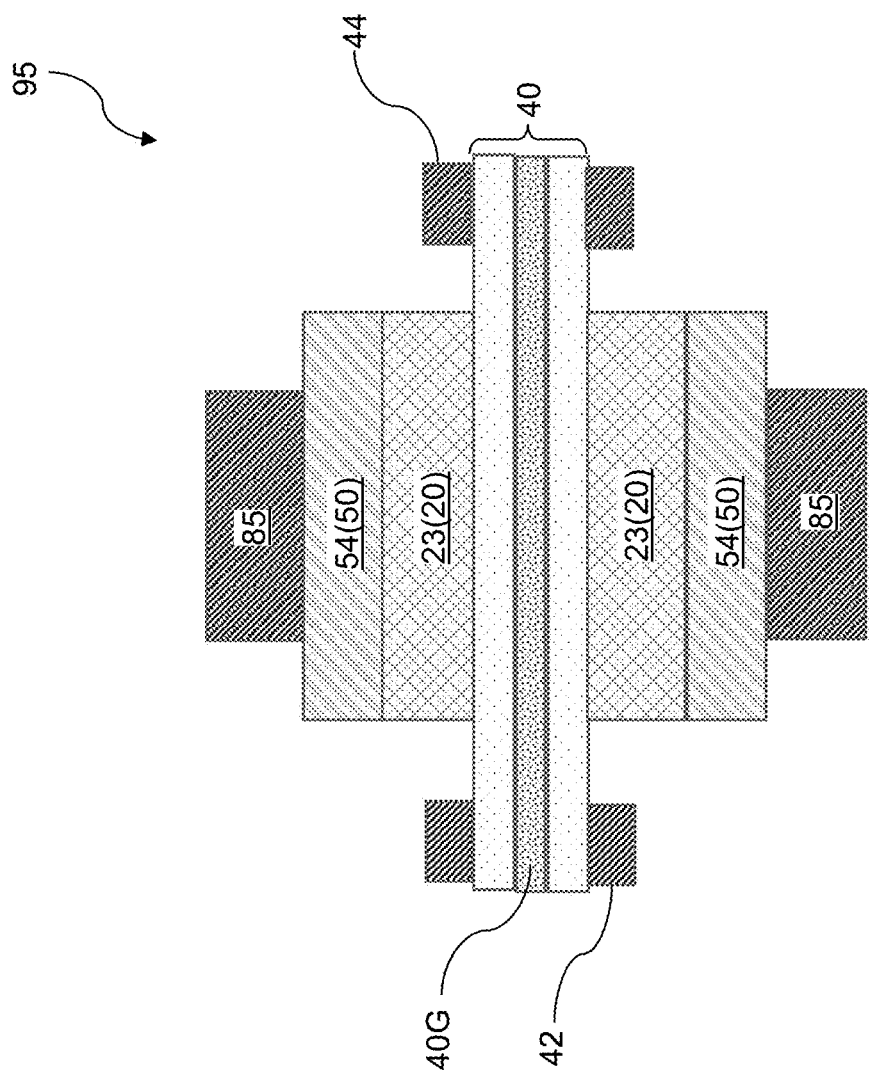
FIG. 10A is vertical cross-sectional view of a fourth exemplary structure according to a fourth embodiment of the present disclosure.
Figure 10B:
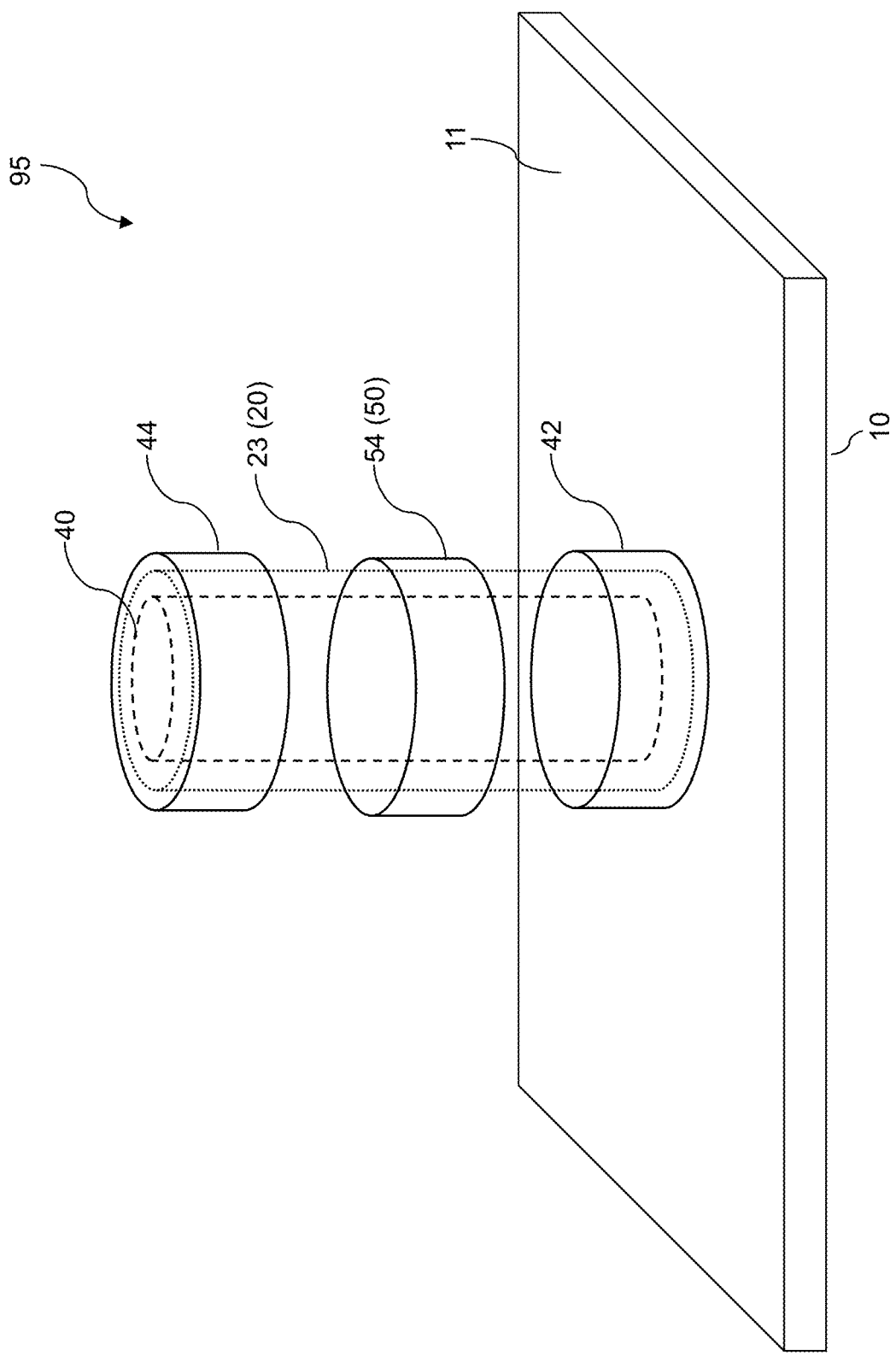
FIG. 10B is schematic see-through perspective view of the fourth exemplary structure of FIG. 10A.

Referring to FIGS. 10A and 10B, a transistor 95 of a fourth exemplary structure according to a fourth embodiment of the present disclosure is illustrated. In the transistor 95 of the fourth exemplary structure, the ferroelectric memory element 20 and/or the gate electrode 50 can have a tubular configuration which surrounds the semiconductor channel 40. In other words, the gate electrode 50 may be a wrap gate electrode 54 which wraps around the ferroelectric memory element 20 which may be a wrap around ferroelectric memory element 23. The wrap around ferroelectric memory element 23 wraps around (i.e., surrounds) the semiconductor channel 40.

In this embodiment, the semiconductor channel 40 may be a vertical pillar or a vertical shell which surrounds a vertical pillar which extends lengthwise perpendicular to the planar top surface 11 of the substrate 10, as shown in FIG. 10B. The wrap around ferroelectric memory element 23 may be an inner shell which wraps around (i.e., surrounds) the semiconductor channel 40. The wrap gate electrode 54 wraps around the middle portion of the wrap around ferroelectric memory element 23. The source and drain contacts (42, 44) contact opposite ends of the semiconductor channel 40 on opposite sides of the wrap gate electrode 54. The source and drain contacts (42, 44) may also wrap around the semiconductor channel 40 or they may contact only a portion of the outer perimeter of the semiconductor channel 40.

Generally, the various ferroelectric memory devices 180 of the embodiments of the present disclosure can be operated by programming a polarization direction of the ferroelectric memory element 21 by applying a positive bias voltage or a negative bias voltage to the conductive gate electrode 51 with respective to the semiconductor channel 40, and by sensing the polarization direction of the ferroelectric memory element 21 by measuring a magnitude of electrical current between the source contact 42 and the drain contact 44 while applying a read voltage (i.e., a measurement bias voltage) between the source contact 42 and the drain contact 44. If a backside ferroelectric memory element 22 is included, then the ferroelectric polarization direction of the backside ferroelectric memory element 22 is opposite of the ferroelectric polarization direction of the ferroelectric memory element 21. The thickness and/or the material composition of the backside ferroelectric memory element 22 may be the same as, or may be different from, the thickness and/or the material composition of the ferroelectric memory element 21. In other words, the polarization of the ferroelectric memory element 21 and the backside ferroelectric memory element 22 are antiparallel to each other, and are flipped simultaneously during programming If a conductive backside gate electrode 52 is included, then the voltage applied to the conductive backside gate electrode 52 can be the same as the voltage applied to the front side conductive gate electrode 51. A read voltage can be applied to the conductive gate electrode 51 while sensing the polarization direction of the ferroelectric memory element 21 and optionally sensing the polarization direction of the backside ferroelectric memory element 22.

The device of the embodiments of the present disclosure provides advantages over ferroelectric-pristine graphene memory elements based on tunneling electroresistance (TER) which have poor polarization retention and which require thick ferroelectric barriers to stabilize polarization. However the thick barriers lead to low tunneling currents and therefore strongly reduce the signal (e.g., reading current) in TER-based devices. In contrast, reading current does not flow through the ferroelectric material in devices of the embodiments of the present disclosure. Thus, a much thicker ferroelectric layer can be used in the device of the embodiments of the present disclosure compared to prior art TER-based devices without reducing the reading current, and the problem of polarization retention is reduced or overcome in the devices of the embodiments of the present disclosure.

Without wishing to be bound by a particular theory and in order to demonstrate advantages of the device of the embodiments of the present disclosure, the inventors calculated a ferroelectric polarization controlled on-off ratio on the semiconductor's band gap in finite size nanostructures at room temperature. The inventors developed quantum mechanical calculations of electrical conductivity based on the ballistic electron transport through finite size semiconductor attached to ferroelectric material and two metallic contacts. The inventors' calculations are based on the Green Function formalism within a two-band tight binding Hamiltonian model. In contrast, first principles electronic structure calculations were used to obtain the density of states and band gaps of two-dimensional semiconductor materials.

Specifically, the structure of FIG. 1 was modeled with a rectangular device size of 10 nm×5 nm (i.e., the area of each interface between adjacent layers). The thickness d of the ferroelectric material portion was 5 nm, and the distance between the ferroelectric material portion and each metallic contact was 1 nm. The electrostatic potential in the semiconductor material portion underneath the ferroelectric material portion was controlled by reversing ferroelectric polarization.

The results of the inventors' simulations are illustrated in FIGS. 11, 12, and 13A-13D. The accuracy of the conductivity simulations was limited by the numerical precision. The values of conductivity below $10^{-2}$ (Ohm·m)$^{-1}$ are outside the range of reliable numerical accuracy, and therefore, the calculations were limited to the range of ferroelectric polarization leading to conductivity values of at least $10^{-2}$ (Ohm·m)$^{-1}$.

Figure 11:
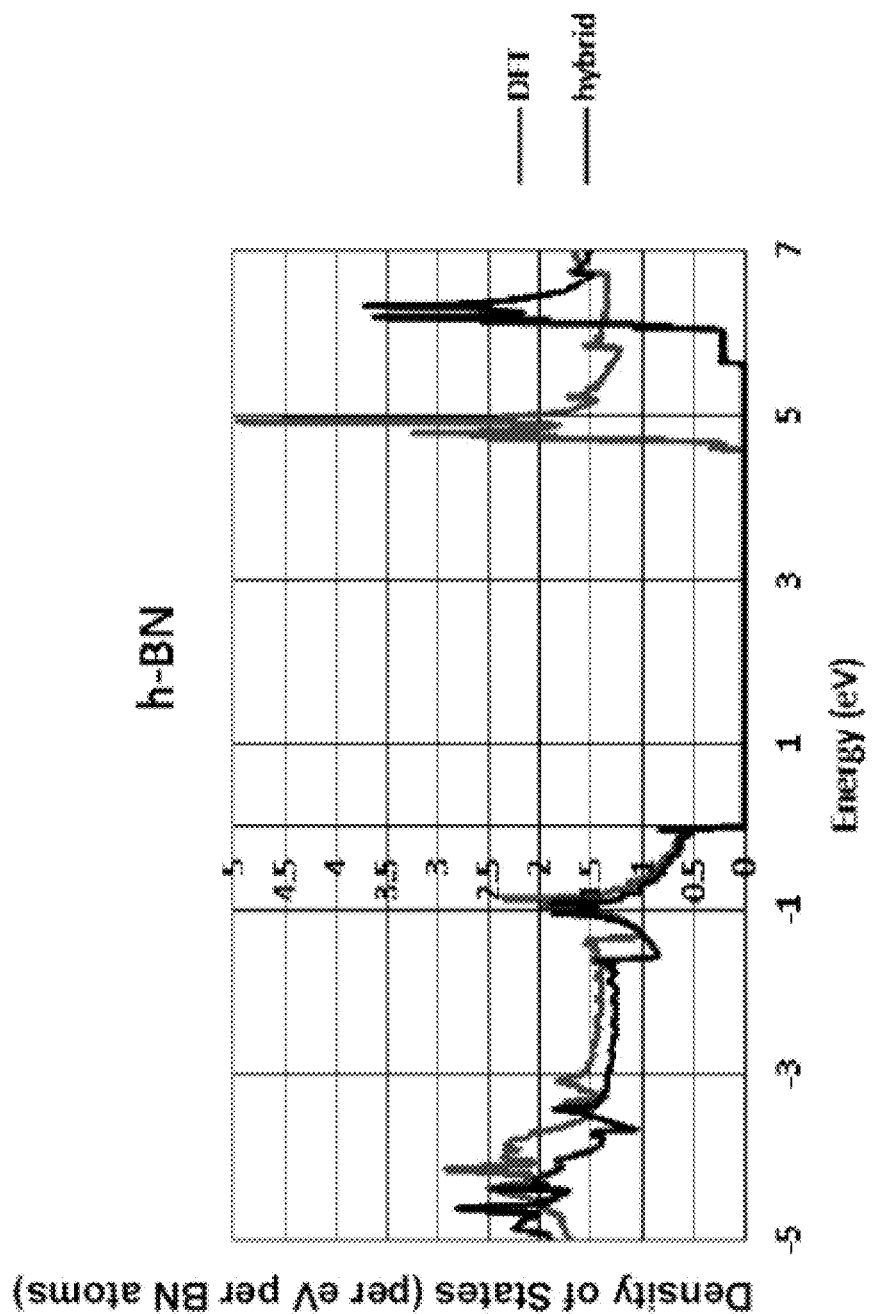
FIG. 11 illustrates calculated density of states per eV per atom for hexagonal boron nitride according to the density function theory (DFT) and the hybrid functional.

Referring to FIG. 11, calculated density of states per eV per atom is shown for hexagonal boron nitride. This calculation was based on the density function theory (DFT) and the hybrid functional.

Figure 12:
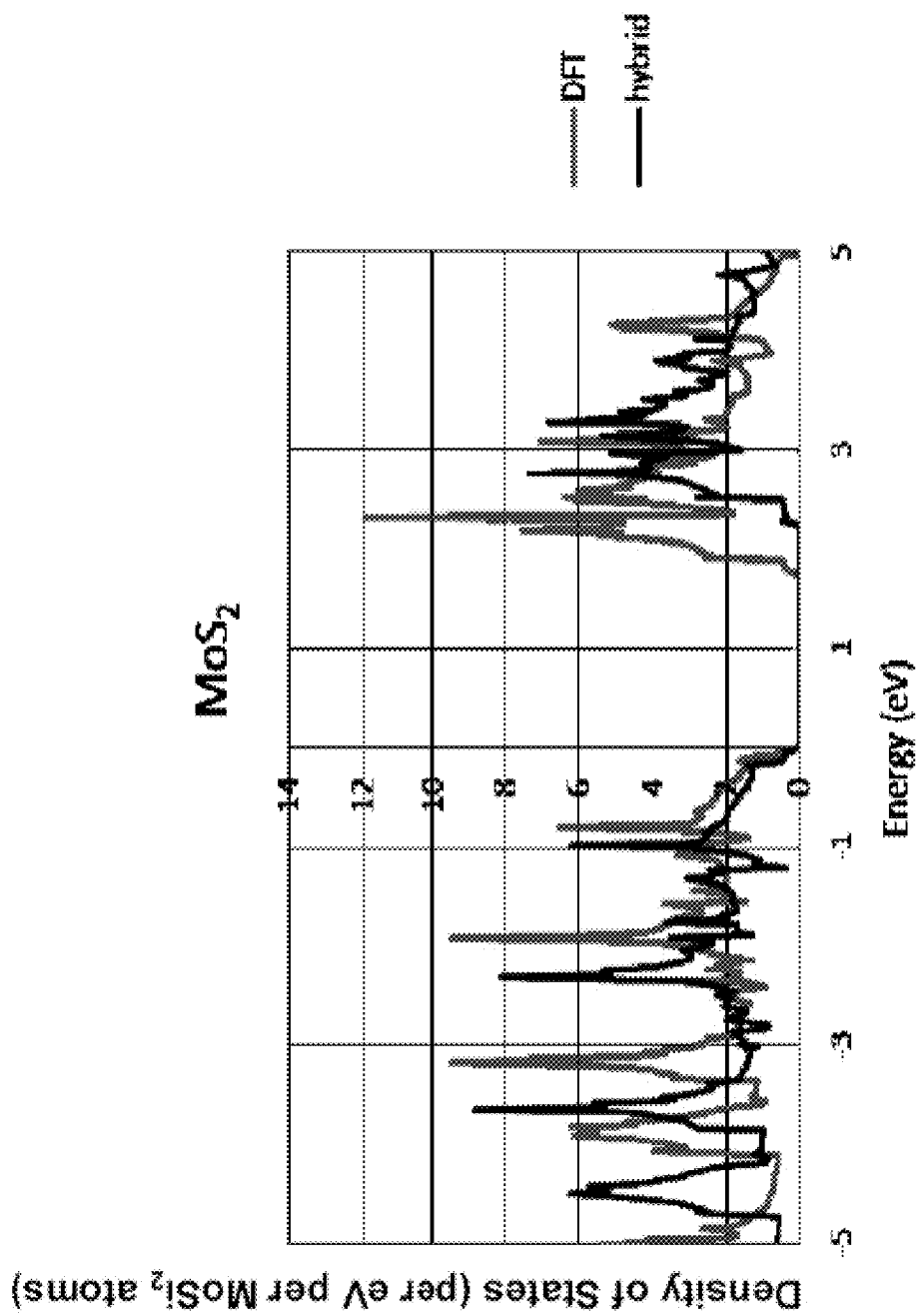
FIG. 12 illustrates calculated density of states per eV per atom for molybdenum disulfide according to the density function theory (DFT) and the hybrid functional.

Referring to FIG. 12, calculated density of states per eV per atom is shown for molybdenum disulfide. This calculation was based on the density function theory (DFT) and the hybrid functional.

Figure 13A:
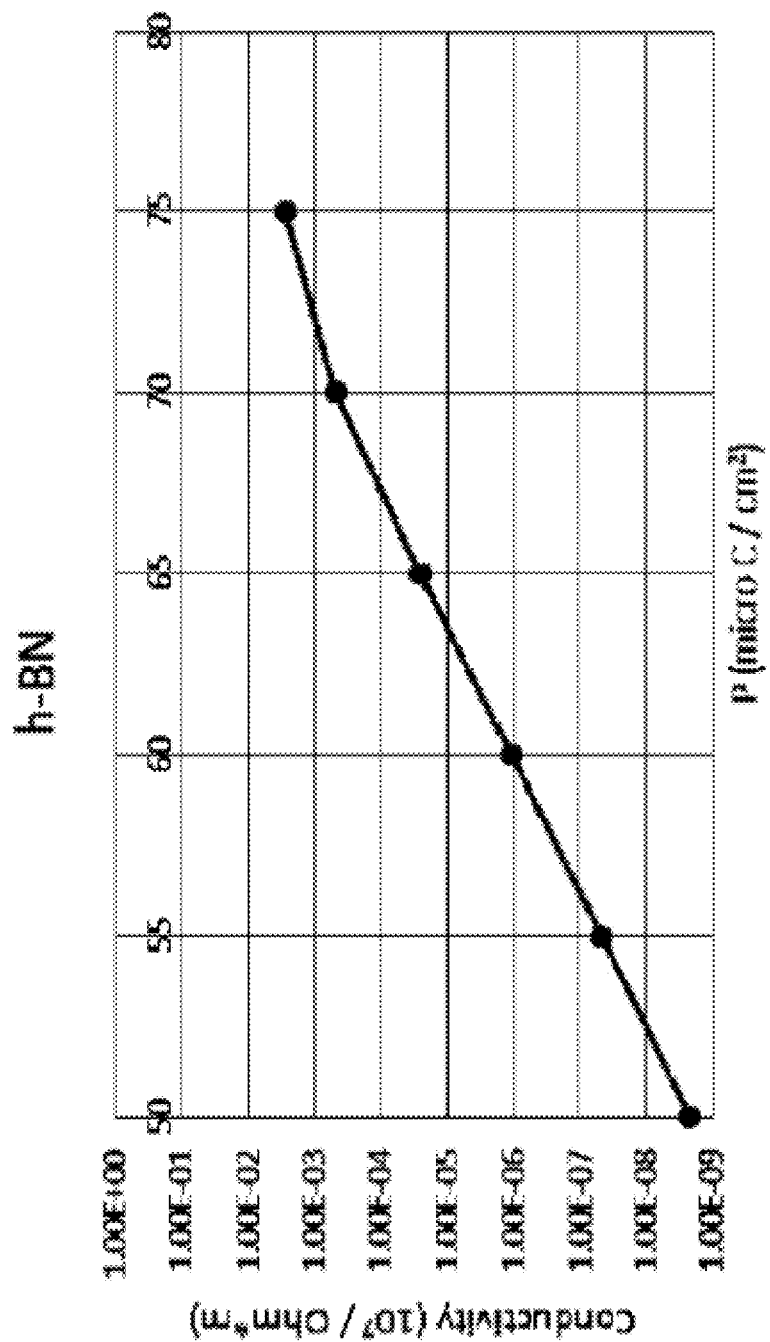
FIG. 13A is a graph of electrical conductivity for hexagonal boron nitride as a function of polarization calculated within the tight binding model.
Figure 13B:
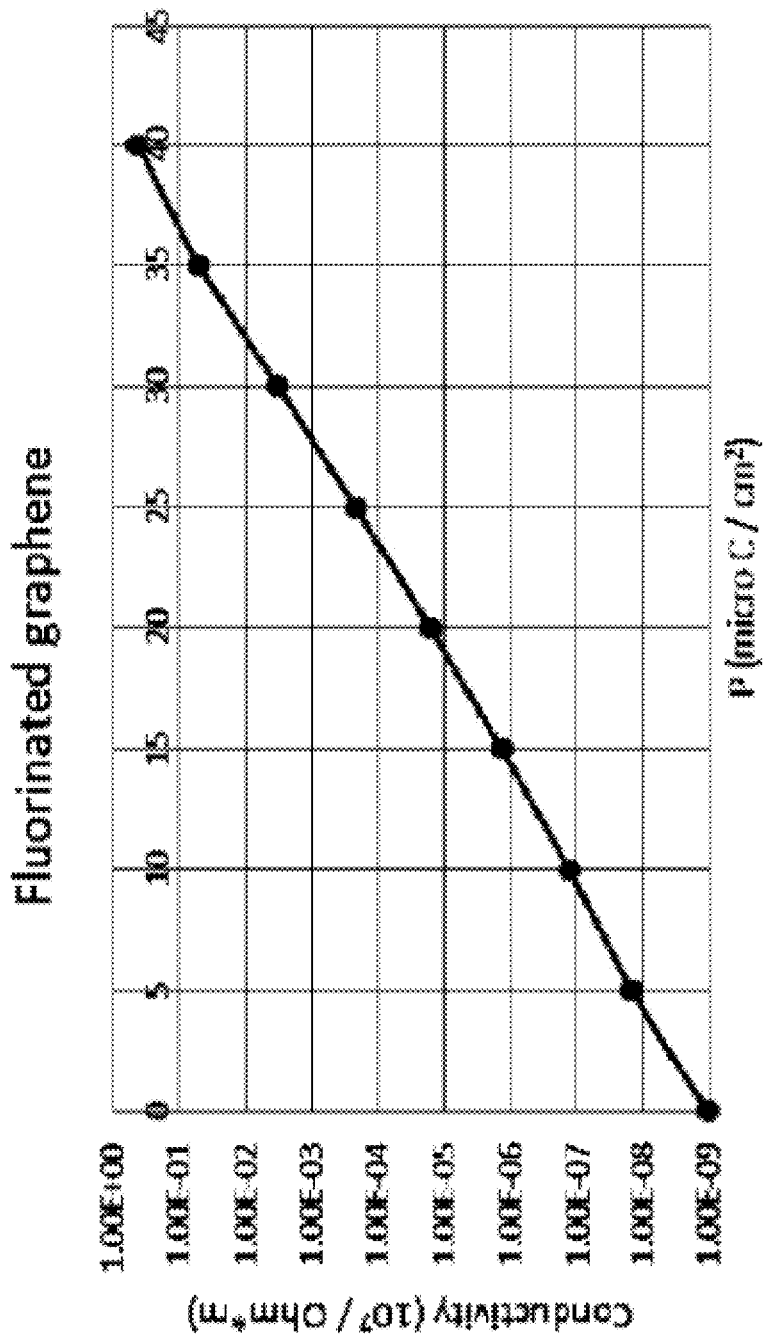
FIG. 13B is a graph of electrical conductivity for fluorinated graphene as a function of polarization calculated within the tight binding model.
Figure 13C:
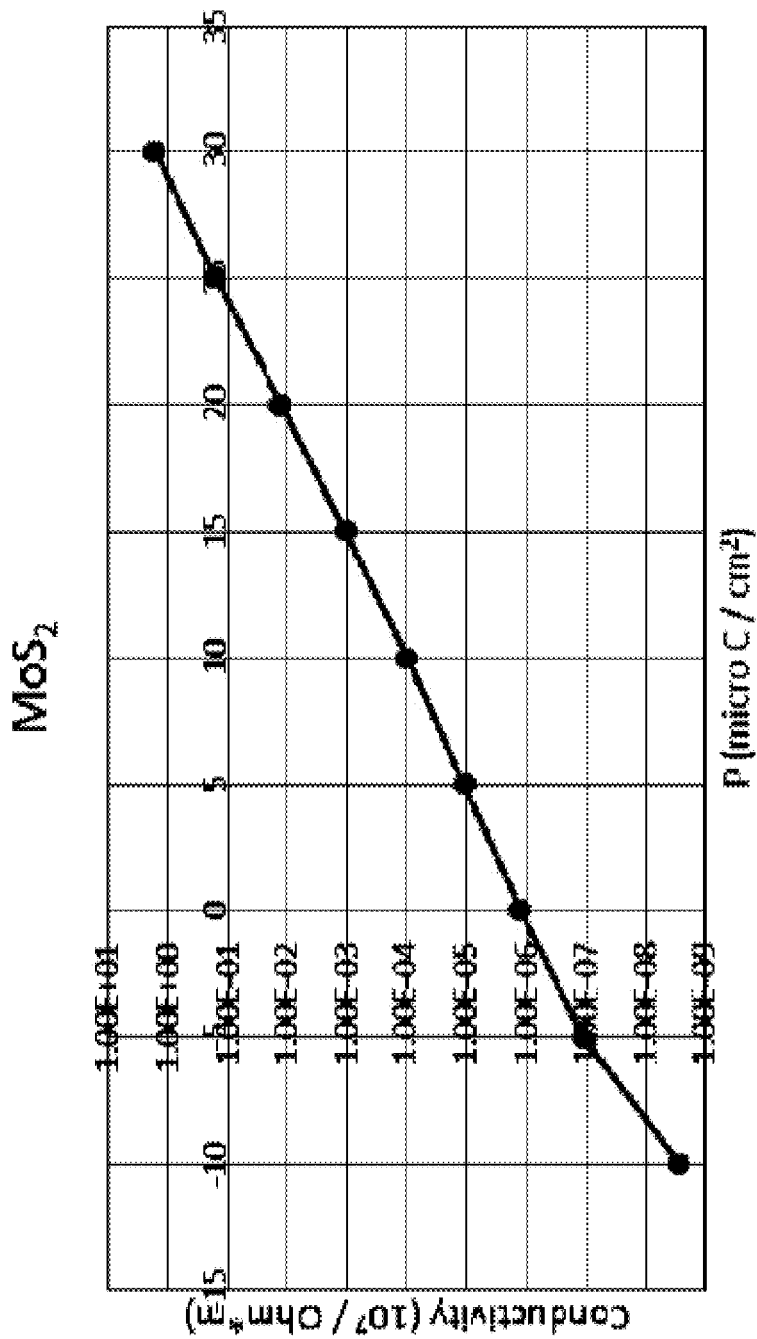
FIG. 13C is a graph of electrical conductivity for molybdenum disulfide as a function of polarization calculated within the tight binding model.
Figure 13D:
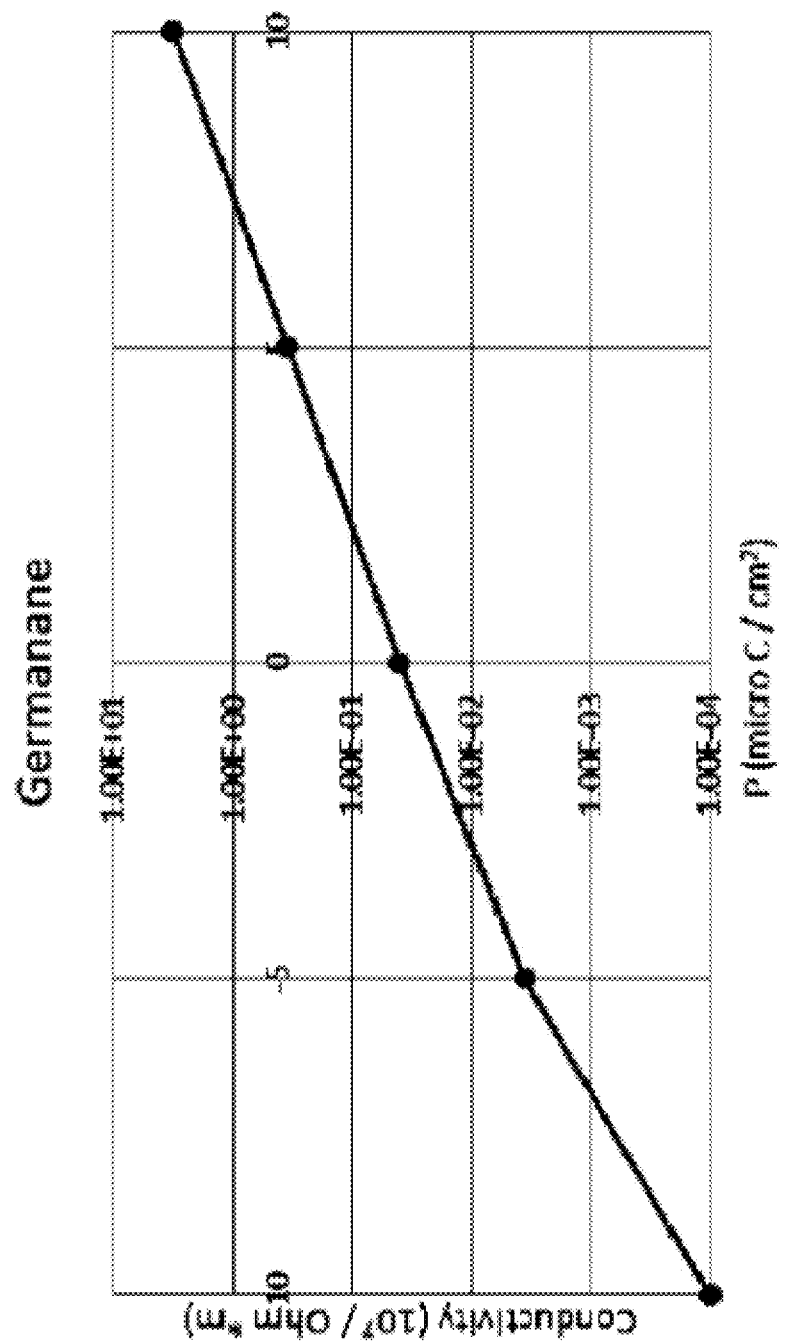
FIG. 13D is a graph of electrical conductivity for germanane as a function of polarization calculated within the tight binding model.

FIGS. 13A-13D show graphs for the calculated electrical conductivity (in units of $10^7$/Ohm·m) for the transistor 95 of the ferroelectric memory device of the embodiments of the present disclosure at room temperature (20 degrees Celsius) as a function of ferroelectric polarization. FIG. 13A shows the calculated electrical conductivity for the case in which the ferroelectric memory element consists of hexagonal boron nitride. FIG. 13B shows the calculated electrical conductivity for the case in which the ferroelectric memory element consists of fluorinated graphene. FIG. 13C shows the calculated electrical conductivity for the case in which the ferroelectric memory element consists of molybdenum disilicide. FIG. 13D shows the calculated electrical conductivity for the case in which the ferroelectric memory element consists of germanane.

FIGS. 13A-13D show that conductivities of all semiconductor channels of the embodiments of the present disclosure exponentially increases (or decreases) with ferroelectric polarization for positive (or negative) direction of ferroelectric polarization. This allows fitting the calculated conductivity σ(P) to a fitting function including the ferroelectric polarization P as a variable. Further, the on-off ratio ON/OFF (i.e., the ratio of the conductivity in the on state to the conductivity in the off state) can be fitted to another fitting function having another variable $P_m$, which is the maximum value of ferroelectric polarization required to push the Fermi level of a two-dimensional semiconductor into the conduction band. The functional forms for σ(P) and ON/OFF are given by:

$$\sigma(P) = \sigma_0 e^{aP}, \text{ and}$$

$$\text{ON/OFF} = e^{2aP_{max}},$$

in which where $\sigma_0 = \sigma(P=0)$ is the conductivity of a semiconductor channel for the paraelectric case. Table 3 tabulates best fit values for the fitting parameters for σ(P) and ON/OFF.

| Ferroelectric material | Optimum value for a (in cm²/μC) | $P_{max}$ (in μC/cm²) |
|---|---|---|
| Hexagonal BN | 0.61 | 75 |
| MoSi₂ | 0.49 | 30 |
| Fluorinated graphene | 0.50 | 40 |
| germanane | 0.44 | 10 |

-continued

While defect states may limit the value for the ON/OFF ratio in practice, the various two-dimensional semiconductor materials provide generally high ON/OFF ratio. The simulations show that higher ON/OFF ratios are possible with wider band gaps two-dimensional semiconductor materials and a thicker ferroelectric material can be used in conjunction with such two-dimensional semiconductor materials. A higher operating voltage is expected with an increase in the thickness of the ferroelectric material in the ferroelectric memory device 180 of the embodiments of the present disclosure.

Figure 14:
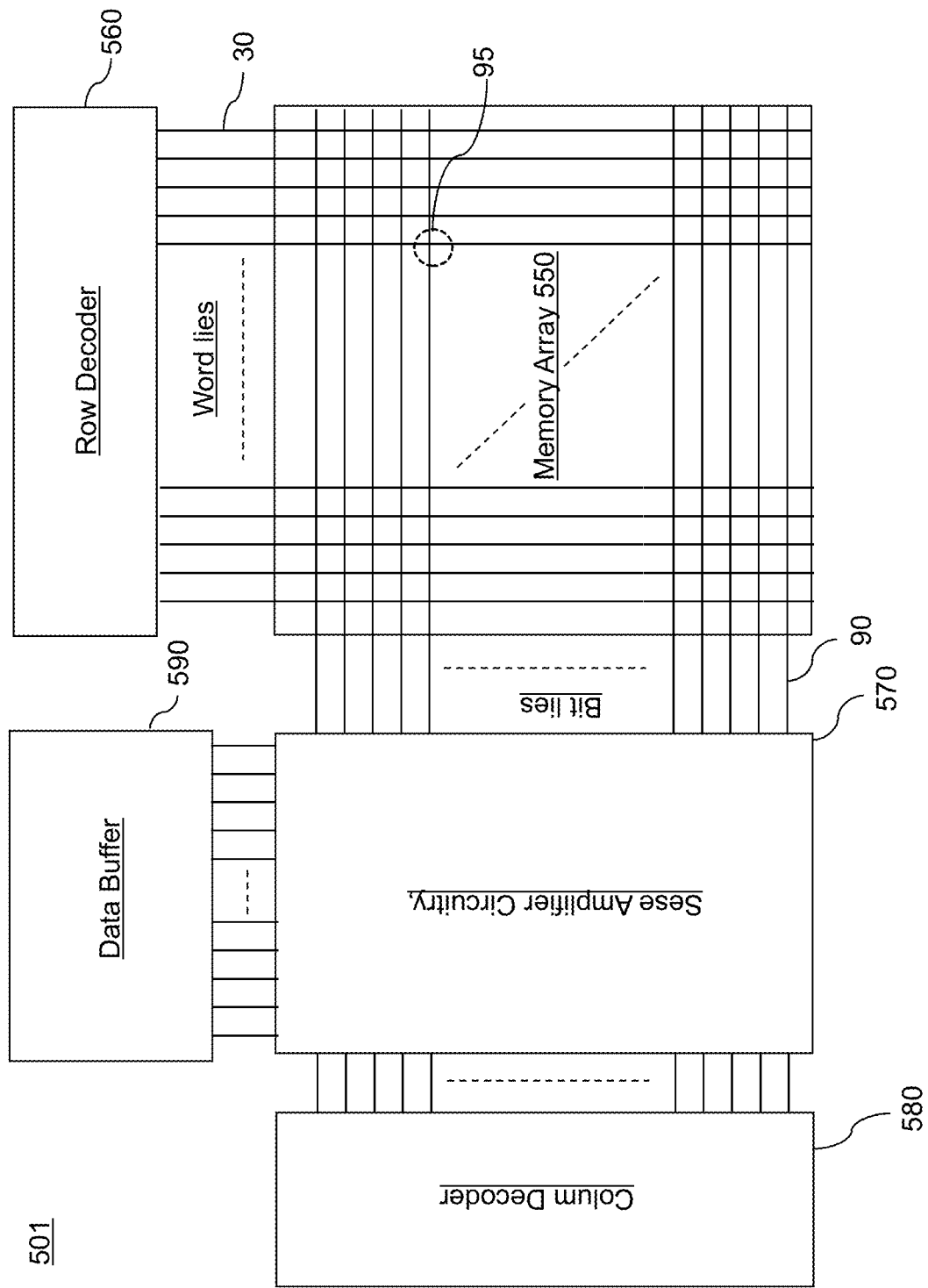
FIG. 14 is a schematic diagram of a ferroelectric memory device according to an embodiment of the present disclosure.

According to an aspect of the present disclosure, a ferroelectric memory array can include an array of memory cells (e.g., transistors) 95 of the embodiments of the present disclosure. Referring to FIG. 14, a schematic diagram is shown for a ferroelectric memory array including the transistors 95 in an array configuration. The ferroelectric memory array can be configured as a random access memory device 501. As used herein, a "random access memory device" refers to a memory device including memory cells that allow random access, i.e., access to any selected memory cell upon a command for reading the contents of the selected memory cell.

The random access memory device 501 of the present disclosure includes a memory array region 550 containing an array of the respective ferroelectric memory cells 180 located at the intersections of word lines (which may comprise first electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). For example, the word lines 30 may be electrically connected to and/or may comprise the gate electrodes 50 of the transistors 95 in the array, while the bit lines 90 may be electrically connected to and/or may comprise the source or drain contacts (42, 44) of the transistors 95 in the array.

The random access memory device 501 may also contain a row decoder 560 connected to the word lines, a sense circuitry 570 (e.g., a sense amplifier and other bit line control circuitry) connected to the bit lines, a column decoder 580 connected to the bit lines, and a data buffer 590 connected to the sense circuitry. Multiple instances of the ferroelectric memory cells (e.g., ferroelectric memory transistors) 95 are provided in an array configuration that forms the random access memory device 501. As such, each of the ferroelectric memory cells 95 can be a two-terminal device including a respective first electrode and a respective second electrode. It should be noted that the location and interconnection of elements are schematic and the elements may be arranged in a different configuration. Further, a ferroelectric memory cell 95 may be manufactured as a discrete device, i.e., a single isolated device.

The embodiments of the present disclosure provide a nonvolatile memory element based on ferroelectric-controlled electrical conductivity of a two-dimensional semiconductor material, or a two-dimensional charge carrier gas layer, such as a 2DEG layer 40G. Information can be written and stored by applying electric pulses that reverse the ferroelectric polarization and thereby induce surface charges in the semiconductor or in the two-dimensional charge carrier gas layer. Information can be read by measuring the resistance of a semiconductor channel including the two-dimensional charge carrier gas layer.

The device of the embodiments of the present disclosure provides significant increase in the difference in electrical resistance of two-dimensional semiconductor material layer compared to previously known three-terminal ferroelectric-graphene structures by replacing gapless pristine graphene (i.e., a band gap of zero) with two-dimensional semiconductor material layer, which can have a band gap of at least 1.1 eV. The device of the embodiments of the present disclosure can strongly improve the stability of ferroelectric polarization compared to previously known two-terminal perpendicular tunnel junction devices because the thickness of a ferroelectric material portion can be increased without signal loss. The device of the embodiments present disclosure is a non-volatile memory device enabling non-volatile storage of information, which is not provided by high-electron-mobility transistors (HEMTs) or heterojunction field effect transistors (HFETs) known in the art. The device of the embodiments of the present disclosure enables low power sensing because the in-plane geometry allows low-current operation during the sensing step.

Figure 15:
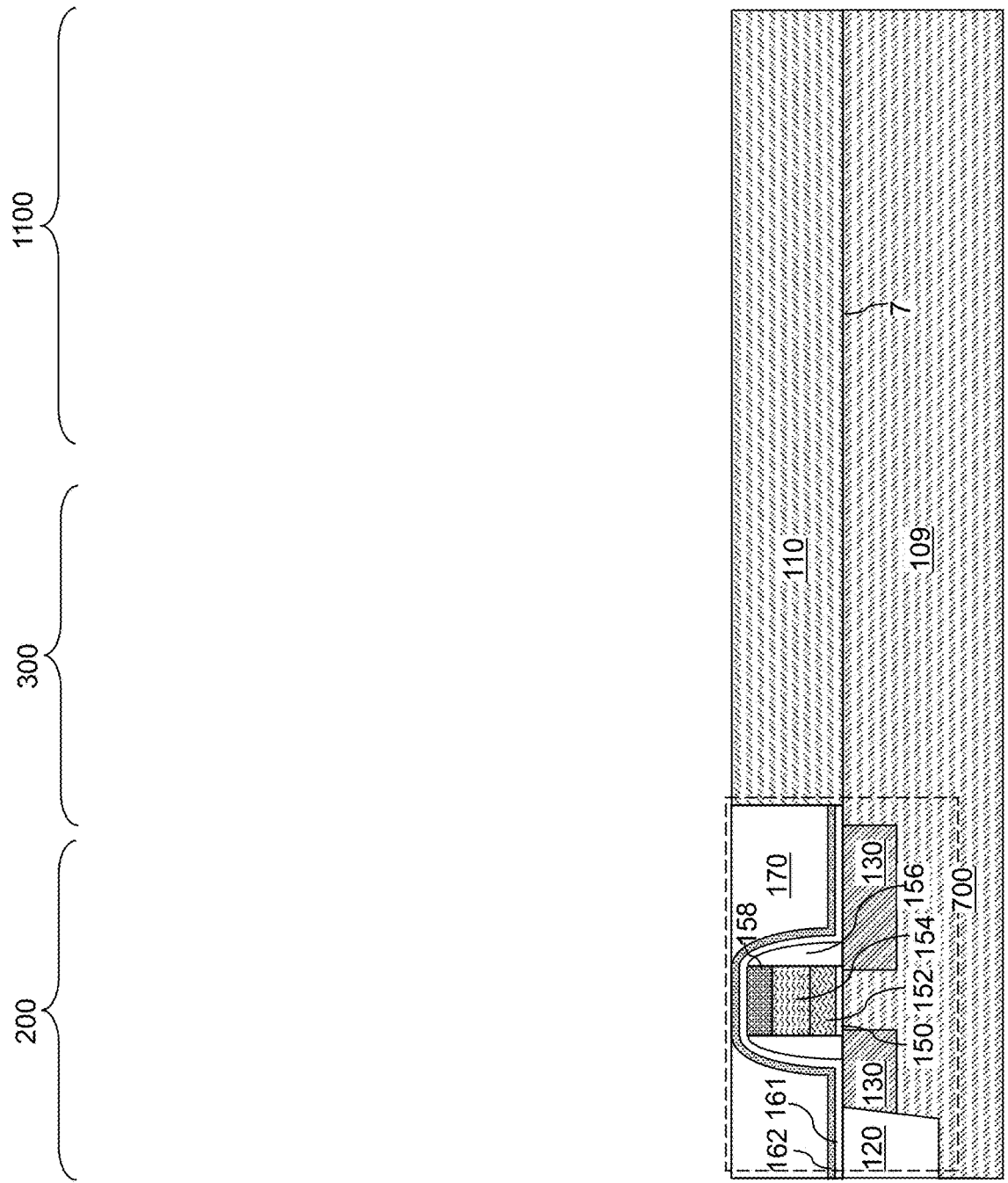
FIG. 15 is a vertical cross-sectional view of a fifth exemplary structure after formation of field effect transistors and a semiconductor material layer according to a fifth embodiment of the present disclosure.

Referring to FIG. 15, a fifth exemplary structure according to the fifth embodiment of the present disclosure is illustrated, which can be employed, for example, to fabricate a device structure containing vertical NAND memory devices. The fifth exemplary structure includes a substrate, which can be a semiconductor substrate. The substrate can include a substrate semiconductor layer 109. The substrate semiconductor layer 109 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 109. The major surface 7 can be a semiconductor surface. In one embodiment, the major surface 7 can be a single crystalline semiconductor (e.g., silicon) surface. For example, the substrate may be a single crystal silicon wafer. Optionally, at least one doped well (not expressly shown) can be formed within the substrate semiconductor layer 109.

At least one semiconductor device 700 for a peripheral circuitry can be formed on a portion of the substrate semiconductor layer 109. The at least one semiconductor device can include, for example, field effect transistors. For example, at least one shallow trench isolation structure 120 can be formed by etching portions of the substrate semiconductor layer 109 and depositing a dielectric material therein. A gate dielectric layer, at least one gate conductor layer, and a gate cap dielectric layer can be formed over the substrate semiconductor layer 109, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 109, for example, by introducing ions employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 109.

An optional semiconductor material layer 110 can be formed on the top surface of the substrate semiconductor layer 109 by deposition of a single crystalline semiconductor material, for example, by selective epitaxy. The deposited semiconductor material can be the same as, or can be different from, the semiconductor material of the substrate semiconductor layer 109. The deposited semiconductor material can be any material that can be employed for the substrate semiconductor layer 109 as described above. The single crystalline semiconductor material of the semiconductor material layer 110 can be in epitaxial alignment with the single crystalline structure of the substrate semiconductor layer 109. Portions of the deposited semiconductor material located above the top surface of the planarization dielectric layer 170 can be removed, for example, by chemical mechanical planarization (CMP). In this case, the semiconductor material layer 110 can have a top surface that is coplanar with the top surface of the planarization dielectric layer 170. The semiconductor material layer 110 can be doped with p-type dopants or n-type dopants. The type of doping of the semiconductor material layer 110 is herein referred to as a first conductivity type. In case a semiconductor material layer 110 is not formed, the substrate semiconductor layer can be doped with p-type dopants or n-type dopants, and the type of doping of the substrate semiconductor layer 109 is referred to as a first conductivity type. In one embodiment, the first conductivity type can be p-type.

Figure 16:
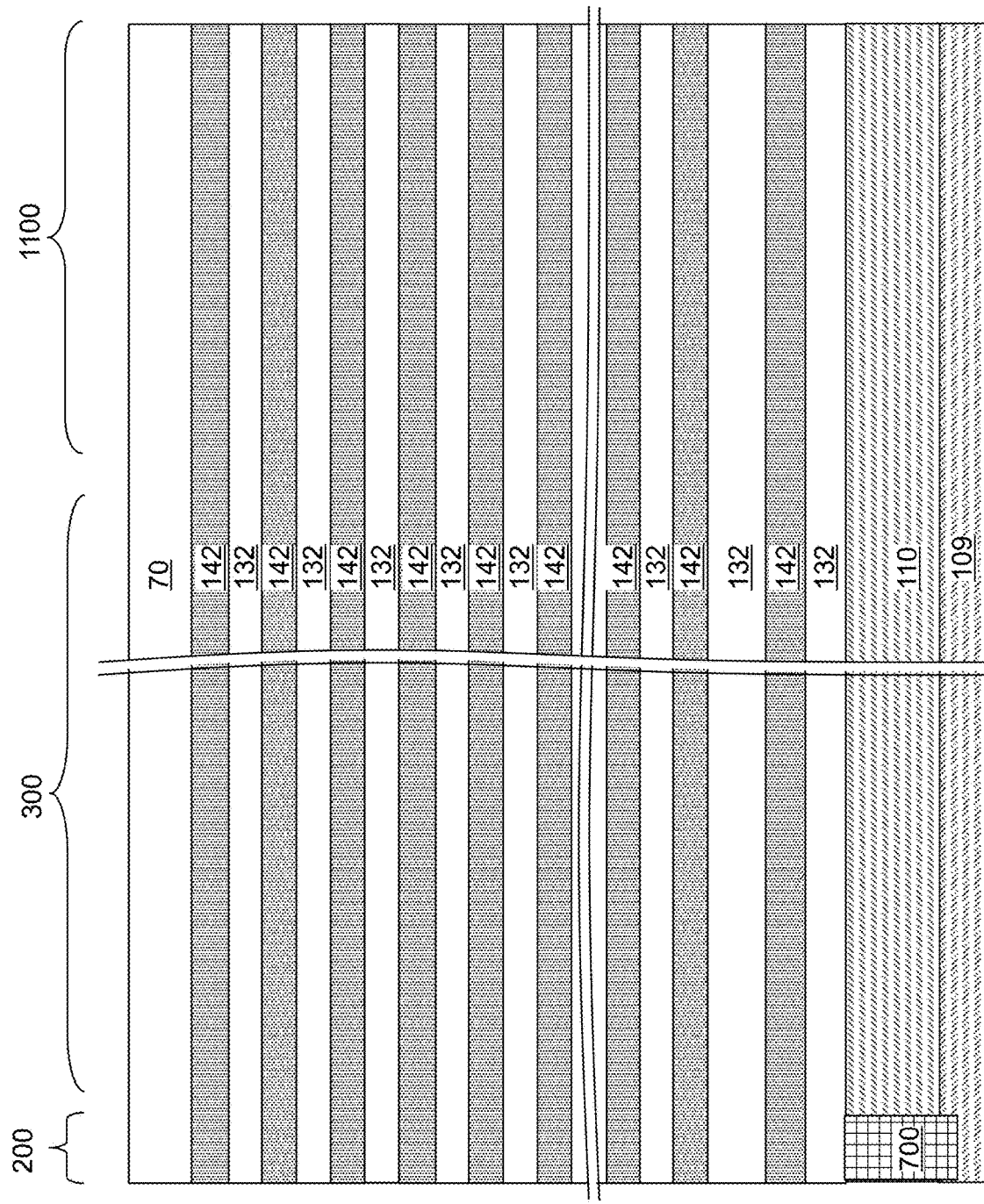
FIG. 16 is a vertical cross-sectional view of the fifth exemplary structure after formation of an alternating stack of insulating layers and sacrificial material layers according to a fifth embodiment of the present disclosure.

Referring to FIG. 16, an alternating stack of insulating layers 132 and spacer material layers can be formed over the substrate, which can include the optional semiconductor material layer 110 and the substrate semiconductor layer 109. The spacer material layers may be formed as electrically conductive layers, or may be formed as sacrificial material layers 142 that are subsequently replaced with electrically conductive layers.

In one embodiment, a stack of an alternating plurality of first material layers (which can be insulating layers 132) and second material layers (which are spacer material layers located between the first material layers 132 and may be sacrificial material layer 142) is formed over the top surface of the substrate. For example, the stack of the alternating plurality of first material layers and second material layers can be formed on the top surface of the semiconductor material layer 110. As used herein, a "material layer" refers to a layer including a material throughout the entirety thereof. As used herein, an alternating plurality of fifth elements and second elements refers to a structure in which instances of the fifth elements and instances of the second elements alternate. Each instance of the fifth elements that is not an end element of the alternating plurality is adjoined by two instances of the second elements on both sides, and each instance of the second elements that is not an end element of the alternating plurality is adjoined by two instances of the fifth elements on both ends. The fifth elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the fifth elements and an instance of the second elements may form a unit that is repeated with periodicity within the alternating plurality.

Each first material layer includes a first material, and each second material layer includes a second material that is different from the first material. In one embodiment, each first material layer can be an insulating layer 132, and each second material layer can be a sacrificial material layer. In this case, the stack can include an alternating plurality of insulating layers 132 and sacrificial material layers 142, and constitutes a prototype stack of alternating layers comprising insulating layers 132 and sacrificial material layers 142. As used herein, a "prototype" structure or an "in-process" structure refers to a transient structure that is subsequently modified in the shape or composition of at least one component therein.

The stack of the alternating plurality is herein referred to as an alternating stack (132, 142). In one embodiment, the alternating stack (132, 142) can include insulating layers 132 composed of the first material, and sacrificial material layers 142 composed of a second material different from that of insulating layers 132. The first material of the insulating layers 132 can be at least one insulating material. As such, each insulating layer 132 can be an insulating material layer. Insulating materials that can be employed for the insulating layers 132 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 132 can be silicon oxide and/or organosilicate glass.

The second material of the sacrificial material layers 142 is a sacrificial material that can be removed selective to the first material of the insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 142 may comprise an insulating material, a semiconductor material, or a conductive material. The second material of the sacrificial material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 142 can be spacer material layers that comprise silicon nitride or a semiconductor material including at least one of silicon and germanium. Alternatively, permanent electrically conductive layers may be employed in lieu of the sacrificial material layers 142. The permanent electrically conductive layers may comprise a conductive material such as a metal, polysilicon, a metal silicide (e.g., NiSi). In this case, the permanent electrically conductive layers are not replaced with a different material, and serve as control gate electrodes of vertical NAND device.

In one embodiment, the insulating layers 132 can include silicon oxide, and sacrificial material layers can include silicon nitride sacrificial material layers. The first material of the insulating layers 132 can be deposited, for example, by chemical vapor deposition (CVD). For example, if silicon oxide is employed for the insulating layers 132, tetraethyl orthosilicate (TEOS) can be employed as the precursor material for the CVD process. The second material of the sacrificial material layers 142 can be formed, for example, CVD or atomic layer deposition (ALD).

The thicknesses of the insulating layers 132 and the sacrificial material layers 142 can be in a range from 20 nm to 50 nm, although lesser and greater thicknesses can be employed for each insulating layer 132 and for each sacrificial material layer 142. The number of repetitions of the pairs of an insulating layer 132 and a sacrificial material layer (e.g., a control gate electrode or a sacrificial material layer) 142 can be in a range from 2 to 1,024, and typically from 8 to 256, although a greater number of repetitions can also be employed. The top and bottom gate electrodes in the stack may function as the select gate electrodes. In one embodiment, each sacrificial material layer 142 in the alternating stack (132, 142) can have a uniform thickness that is substantially invariant within each respective sacrificial material layer 142.

Optionally, an insulating cap layer 70 can be formed over the alternating stack (132, 142). The insulating cap layer 70 includes a dielectric material that is different from the material of the sacrificial material layers 142. In one embodiment, the insulating cap layer 70 can include a dielectric material that can be employed for the insulating layers 132 as described above. The insulating cap layer 70 can have a greater thickness than each of the insulating layers 132. The insulating cap layer 70 can be deposited, for example, by chemical vapor deposition. In one embodiment, the insulating cap layer 70 can be a silicon oxide layer.

Figure 17:
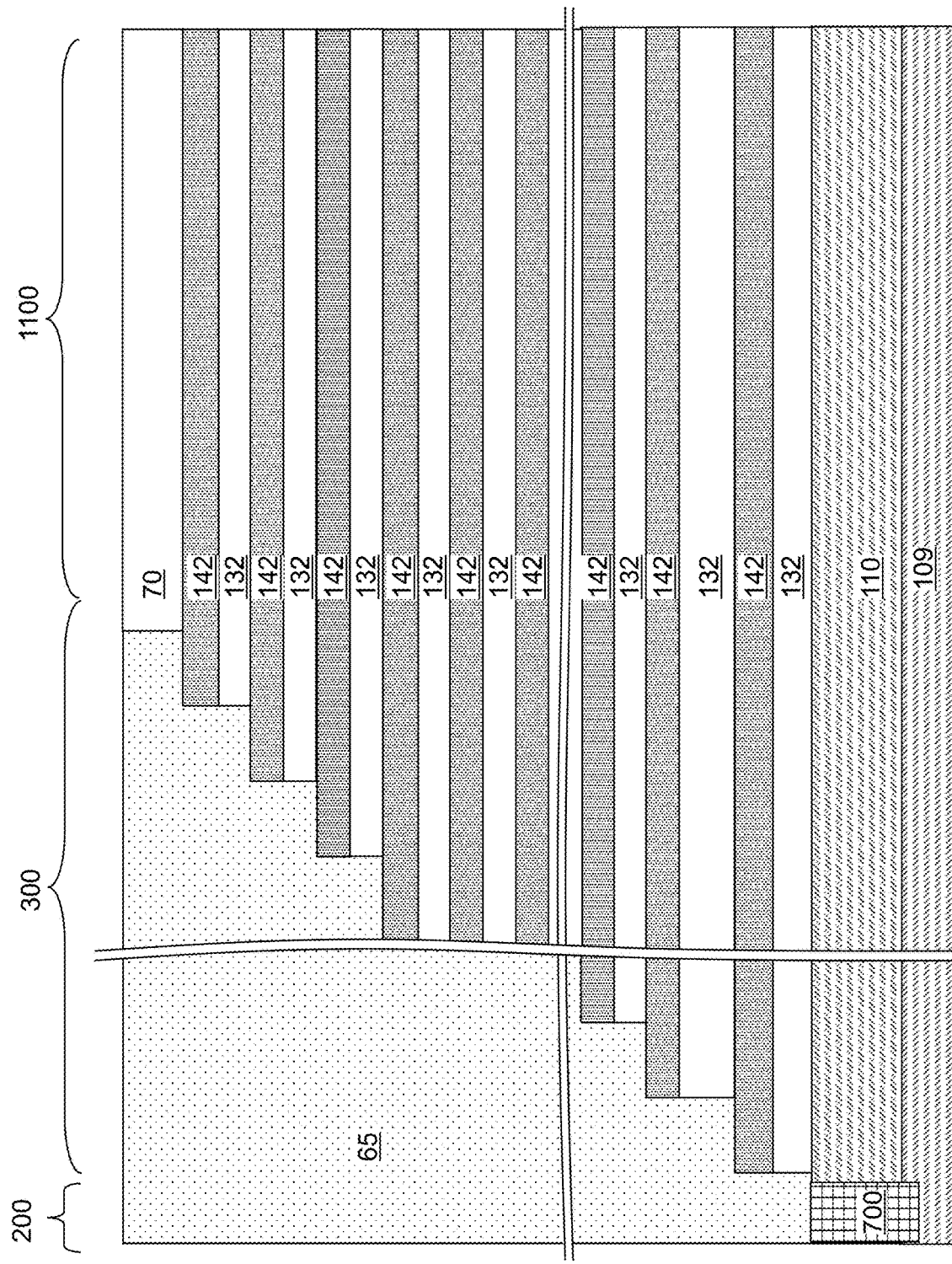
FIG. 17 is a vertical cross-sectional view of the fifth exemplary structure after formation of a retro-stepped dielectric material portion according to the fifth embodiment of the present disclosure.

Referring to FIG. 17, a stepped cavity can be formed within a staircase region 300 and optionally in a peripheral device region 200. The stepped cavity can have various stepped surfaces such that the horizontal cross-sectional shape of the stepped cavity changes in steps as a function of the vertical distance from the top surface of the substrate (109, 110). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

A remaining peripheral portion of the alternating stack (132, 142) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 18A:
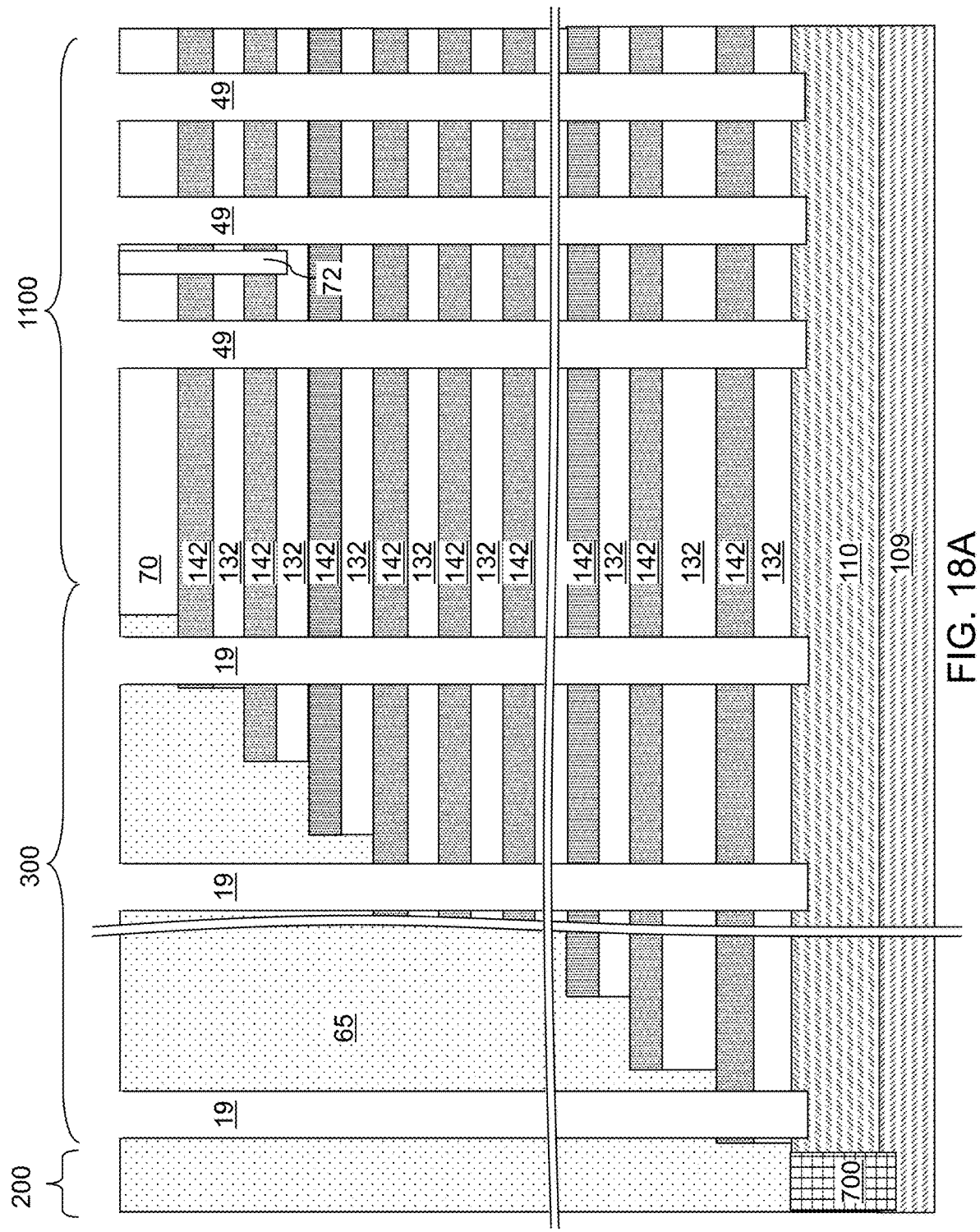
FIG. 18A is a vertical cross-sectional view of the fifth exemplary structure after formation of memory openings and support openings according to the fifth embodiment of the present disclosure.
Figure 18B:
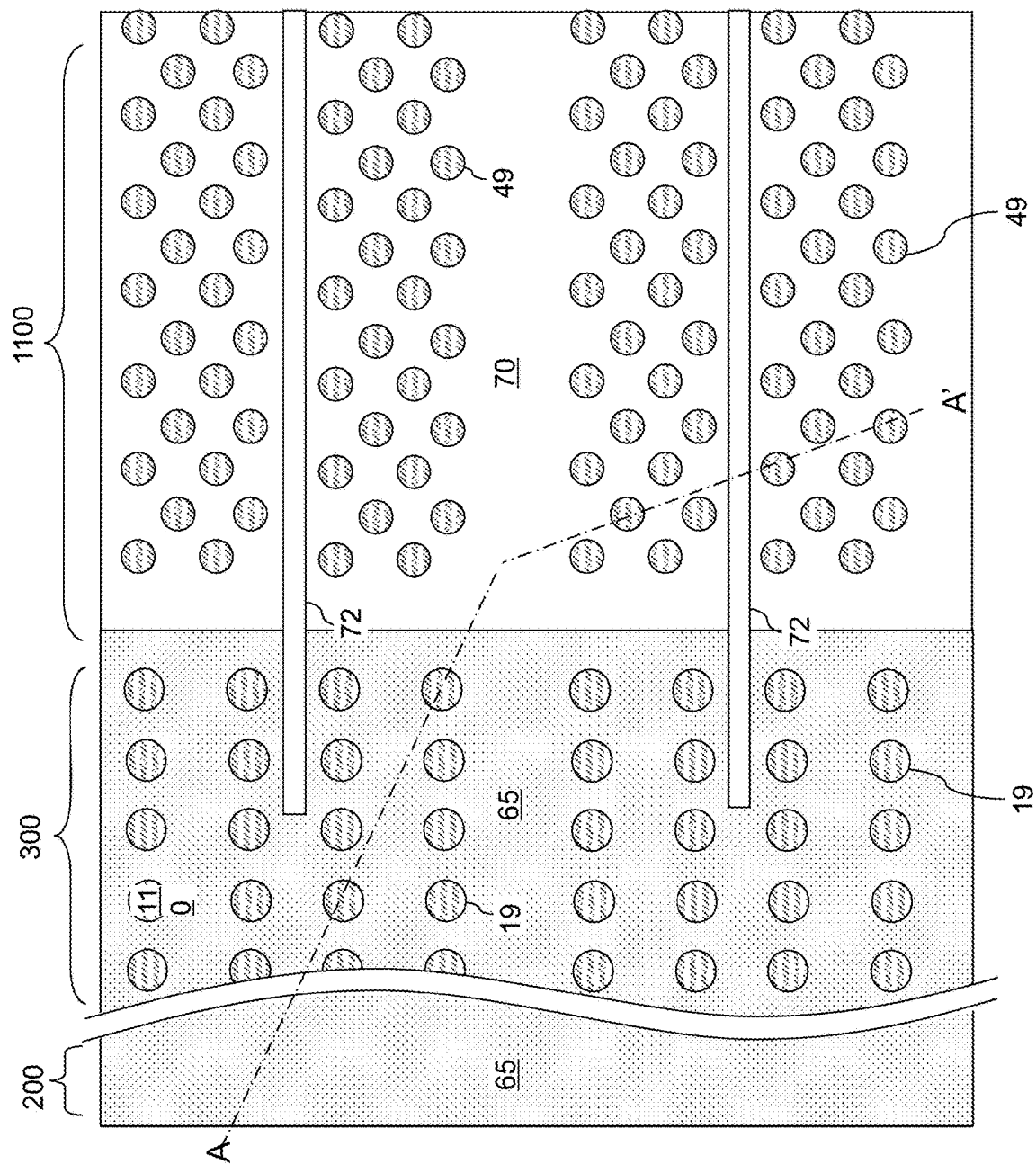
FIG. 18B is a top-down view of the fifth exemplary structure along the vertical plane A-A' of FIG. 18A.

Referring to FIGS. 18A and 18B, a lithographic material stack (not shown) including at least a photoresist layer can be formed over the insulating cap layer 70 and the alternating stack (132, 142), and can be lithographically patterned to form openings therein. The pattern in the lithographic material stack can be transferred through the insulating cap layer 70 and through entirety of the alternating stack (132, 142) by at least one anisotropic etch that employs the patterned lithographic material stack as an etch mask. Portions of the alternating stack (132, 142) underlying the openings in the patterned lithographic material stack are etched to form memory openings 49. In other words, the transfer of the pattern in the patterned lithographic material stack through the alternating stack (132, 142) forms the memory openings 49 that extend through the alternating stack (132, 142). The chemistry of the anisotropic etch process employed to etch through the materials of the alternating stack (132, 142) can alternate to optimize etching of the first and second materials in the alternating stack (132, 142). The anisotropic etch can be, for example, a series of reactive ion etches. The sidewalls of the memory openings 49 can be substantially vertical, or can be tapered. The patterned lithographic material stack can be subsequently removed, for example, by ashing.

In one embodiment, an overetch into the semiconductor material layer 110 may be optionally performed after the top surface of the semiconductor material layer 110 is physically exposed at a bottom of each memory opening 49. The overetch may be performed prior to, or after, removal of the lithographic material stack. In other words, the recessed surfaces of the semiconductor material layer 110 may be vertically offset from the undressed top surfaces of the semiconductor material layer 110 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 110. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 109 and the semiconductor material layer 110 collectively constitutes a substrate (109, 110), which can be a semiconductor substrate. Alternatively, the semiconductor material layer 110 may be omitted, and the memory openings 49 can extend to a top surface of the substrate semiconductor layer 109.

A memory stack structure can be formed in each of the memory opening employing various embodiments of the present disclosure. FIGS. 19A-19K illustrate sequential vertical cross-sectional views of a memory opening within the fifth exemplary structure during formation of a fifth exemplary memory opening fill structure according to a fifth embodiment of the present disclosure. Formation of the exemplary memory opening fill structure can be performed within each of the memory openings 49 and the support openings 19 in the fifth exemplary structure illustrated in FIGS. 18A and 18B.

Referring to FIG. 19A, a memory opening 49 in the fifth exemplary structure of FIGS. 18A and 18B is illustrated. The memory opening 49 extends through the insulating cap layer 70, the alternating stack (132, 142), and optionally into an upper portion of the semiconductor material layer 110. The recess depth of the bottom surface of each memory opening with respect to the top surface of the semiconductor material layer 110 can be in a range from 0 nm to 30 nm, although greater recess depths can also be employed. Optionally, the sacrificial material layers 142 can be laterally recessed partially to form lateral recesses (not shown), for example, by an isotropic etch.

Referring to FIG. 19B, an optional pedestal channel portion 111 can be formed at the bottom portion of each memory opening 49, for example, by selective epitaxy. Each pedestal channel portion 111 comprises a single crystalline semiconductor material in epitaxial alignment with the single crystalline semiconductor material of the semiconductor material layer 110. In one embodiment, the pedestal channel portion 111 can be doped with ions of the same conductivity type as the semiconductor material layer 110. In one embodiment, the top surface of each pedestal channel portion 111 can be formed above a horizontal plane including the top surface of a sacrificial material layer 142. In this case, at least one source select gate electrode can be subsequently formed by replacing each sacrificial material layer 142 located below the horizontal plane including the top surfaces of the pedestal channel portions 111 with a respective conductive material layer. The pedestal channel portion 111 can be a portion of a transistor channel that extends between a source region to be subsequently formed in the substrate (109, 110) and a drain region to be subsequently formed in an upper portion of the memory opening 49. A cavity 49' is present in the unfilled portion of the memory opening 49 above the pedestal channel portion 111. In one embodiment, the pedestal channel portion 111 can comprise single crystalline silicon. In one embodiment, the pedestal channel portion 111 can have a doping of the first conductivity type, which is the same as the conductivity type of the semiconductor material layer 110 that the pedestal channel portion contacts. If a semiconductor material layer 110 is not present, the pedestal channel portion 111 can be formed directly on the substrate semiconductor layer 109, which can have a doping of the first conductivity type.

Optionally, a ferroelectric-side interfacial dielectric layer may formed by conformal deposition of a dielectric material in the memory opening, as will be discussed in more detail with regard to FIG. 26B below. The ferroelectric-side interfacial dielectric layer, if present, includes a dielectric material that improves the interface quality and improves the ferroelectric characteristics of the ferroelectric material layer and gate electrodes to be subsequently formed by replacement of the sacrificial material layers 142 with electrically conductive layers. The ferroelectric-side interfacial dielectric layer 1 comprises hafnium aluminum oxide, hafnium oxide or aluminum oxide. The thickness of the channel-side interfacial dielectric layer can be in a range from 1 nm to 2 nm.

Referring to FIG. 19C, at least one ferroelectric dielectric layer (504, 506) can be formed in each of the memory openings 49, in each of the support openings 19, and over the insulating cap layer 70. If the optional ferroelectric-side interfacial dielectric layer is present in the openings (19, 49), then the at least one ferroelectric dielectric layer (504, 506) can be formed directly on the ferroelectric-side interfacial dielectric layer. The at least one ferroelectric dielectric layer (504, 506) can include any ferroelectric dielectric material. In one embodiment, the at least one ferroelectric dielectric layer (504, 506) includes only one ferroelectric dielectric layer 504. The ferroelectric dielectric layer may include as hafnium oxide (such as hafnium oxide containing at least one dopant selected from Al, Zr, and Si and having a ferroelectric non-centrosymmetric orthorhombic phase), zirconium oxide, hafnium-zirconium oxide, bismuth ferrite, barium titanate (such as $BaTiO_3$; BT), colemanite (such as $Ca_2B_6O_{11} \cdot 5H_2O$), bismuth titanate (such as $Bi_4Ti_3O_{12}$), europium barium titanate, ferroelectric polymer, germanium telluride, langbeinite (such as $M_2M'_2(SO_4)_3$ in which M is a monovalent metal and M' is a divalent metal), lead scandium tantalate (such as $Pb(Sc_xTa_{1-x})O_3$), lead titanate (such as $PbTiO_3$; PT), lead zirconate titanate (such as $Pb(Zr,Ti)O_3$; PZT), lithium niobate (such as $LiNbO_3$; LN), ($LaAlO_3$)), polyvinylidene fluoride $(CH_2CF_2)_n$, potassium niobate (such as $KNbO_3$), potassium sodium tartrate (such as $KNaC_4H_4O_6 \cdot 4H_2O$), potassium titanyl phosphate (such as $KO_5PTi$), sodium bismuth titanate (such as $Na_{0.5}Bi_{0.5}TiO_3$ or $Bi_{0.5}Na_{0.5}TiO_3$), lithium tantalate (such as $LiTaO_3$ (LT)), lead lanthanum titanate (such as (Pb,La)$TiO_3$ (PLT)), lead lanthanum zirconate titanate (such as (Pb,La)(Zr,Ti)$O_3$ (PLZT)), ammonium dihydrogen phosphate (such as $NH_4H_2PO_4$ (ADP)), or potassium dihydrogen phosphate (such as $KH_2PO_4$ (KDP)).

In another embodiment, the at least one ferroelectric dielectric layer (504, 506) includes a first ferroelectric dielectric layer 504 that is deposited first, and a second dielectric layer 506 (which may be a ferroelectric dielectric layer or a non-ferroelectric dielectric layer) that is deposited on the first ferroelectric dielectric layer 504. The first ferroelectric dielectric layer 504 is also referred to as an outer ferroelectric dielectric layer, and the second dielectric layer 506 is also referred to as an inner dielectric layer, which may be a ferroelectric or non-ferroelectric dielectric layer. Each of the at least one ferroelectric dielectric layer (504, 506) can be deposited by a respective conformal deposition process such as an atomic layer deposition (ALD) process or a chemical vapor deposition (CVD) process. In this embodiment, the at least one ferroelectric dielectric layer (504, 506) can include a layer stack configured to reduce electron tunneling from the channel into the at least one ferroelectric dielectric layer (504, 506) and to improve the quality of the interface with the channel to be deposited in a subsequent step. In this case, the first ferroelectric dielectric layer 504 can have a first band gap energy, and the second dielectric layer 506 can have a second band gap energy that is greater than the first band gap energy to reduce electron tunneling from the channel into layer 504. For example, both dielectric layers may include hafnium aluminum oxide, which may optionally be doped with zirconium. The first ferroelectric dielectric layer 504 can have a larger thickness and a higher hafnium to aluminum atomic ratio than the second dielectric layer 506. In this case, the hafnium rich first ferroelectric dielectric layer 504 may be used to store data based on its ferroelectric state, while the aluminum rich second dielectric layer 506 may be used to improve the interface with the channel and to reduce electron tunneling from the channel into layer 504. If the aluminum atomic fraction of the second dielectric layer 506 is sufficiently high, then this layer may lose its ferroelectric properties, and be used as an interface layer to improve the quality of the interface with the channel. Otherwise, layer 506 may be a ferroelectric dielectric layer.

In an illustrative example, the first ferroelectric dielectric layer 504 can have a material composition of $Hf_{1.5(1-\alpha-\beta)}Zr_{1.5\beta}Al_{2\alpha}O_3$, wherein $\alpha$ is in a range from 0.01 to 0.2, such as 0.025 to 0.05, and $\beta$ is in a range from 0 to 0.2. The second dielectric layer 506 can have a material composition of $Hf_{1.5\gamma}Zr_{1.5\delta}Al_{2(1-\gamma-\delta)}O_3$, wherein $\gamma$ is in a range from 0 to 0.2, such as 0.05 to 0.15, and $\delta$ is in a range from 0 to 0.2. For example, the first ferroelectric dielectric layer 504 can be hafnium aluminum oxide having an aluminum mole fraction of 0.05 to 0.08 (i.e., aluminum doped orthorhombic ferroelectric hafnium oxide), while and the second dielectric layer 506 can have an aluminum mole fraction of 0.6 to 1 (i.e., it may consist essentially of aluminum oxide or hafnium doped aluminum oxide which is not ferroelectric).

The thickness of the first ferroelectric dielectric layer 504 can be in a range from 6 nm to 16 nm, such as from 8 nm to 12 nm. The thickness of the second dielectric layer 506 can be in a range from 0.5 nm to 3 nm, such as from 1 nm to 2 nm, although lesser and greater thicknesses can also be employed.

In case aluminum-doped hafnium oxide layers are employed for the first ferroelectric dielectric layer 504 and the second dielectric layer 506, the molar fraction of the aluminum atoms within each of the first ferroelectric dielectric layer 504 and the second dielectric layer 506 can be provided by adjusting the cycle ratio of the hafnium deposition cycles and the aluminum deposition cycles. The cycle ratio may be in a range from 20:1 to 10:1 for the deposition of the first ferroelectric dielectric layer 504, and may be in a range from 1:1.5 to 1:10 for deposition of the second dielectric layer 506.

A sacrificial cover material layer 508 can be formed over the at least one ferroelectric dielectric layer (504, 506). The sacrificial cover material layer 508 includes a thin layer of a sacrificial material that protects the at least one ferroelectric dielectric layer (504, 506) during a subsequently anisotropic etch process, and can be removed selective to the material of the at least one ferroelectric dielectric layer (504, 506). For example, the sacrificial cover material layer 508 can include amorphous silicon, and can have a thickness in a range from 1 nm to 5 nm. A thermal anneal process, such as a rapid thermal anneal (RTA), at a temperature of at least 1,000 degrees Celsius can be performed for 1 to 2 seconds to induce crystallization of the at least one ferroelectric dielectric layer (504, 506), thereby inducing ferroelectricity in the at least one ferroelectric dielectric layer (504, 506).

Referring to FIG. 19D, an anisotropic etch process can be performed to remove horizontal portions of the sacrificial cover material layer 508 and the at least one ferroelectric dielectric layer (504, 506). The anisotropic etch process can comprise a reactive ion etch process including a first step having an etch chemistry that etches the material of the sacrificial cover material layer 508 and a second step having an etch chemistry that etches the material of the at least one ferroelectric dielectric layer (504, 506). The center portion of each pedestal channel portion 111 can be collaterally recessed by the anisotropic etch process. A tubular ferroelectric dielectric layer 500 including a cylindrical remaining portion of the first ferroelectric dielectric layer 504 a cylindrical remaining portion of the second ferroelectric dielectric layer 506 can be formed in each memory opening 49 and in each support opening 19 after anisotropically etching the first ferroelectric dielectric layer 504 and the second ferroelectric dielectric layer 506.

Referring to FIG. 19E, the sacrificial cover material layer 508 can be removed selective to the at least one ferroelectric dielectric layer (504, 506) by an isotropic etch process. For example, a wet etch process employing hot trimethyl-2 hydroxyethyl ammonium hydroxide ("hot TMY") or tetramethyl ammonium hydroxide (TMAH) can be employed to remove the sacrificial cover material layer 508 selective to the at least one ferroelectric dielectric layer (504, 506).

Referring to FIG. 19F, a two-dimensional electron gas ("2DEG") channel layer, such as a metal dichalcogenide layer 60L is deposited on the physically exposed surfaces of the pedestal channel portion 111, the tubular ferroelectric dielectric layer 500, and the insulating cap layer 70. In one embodiment, the metal dichalcogenide in the metal dichalcogenide layer 60L can include a transition metal dichalcogenide, i.e., a dichalcogenide of a transition metal. For example, the transition metal dichalcogenide can comprise $Mo_{1-x}W_xS_{2-y}Se_y$, in which x is a number in a range from, and including, 0 to, and including, 1, and y is a number in a range from, and including, 0 and to, and including, 2. Thus, the transition metal dichalcogenide can comprise $MoS_2$, $WS_2$, $MoSe_2$, $WSe_2$, or a ternary or quaternary alloy thereof.

In one embodiment, the metal dichalcogenide layer 60L can have a thickness which may be in a range from 1 monolayer to 5 monolayers of $Mo_{1-x}W_xS_{2-y}Se_y$. In one embodiment, the metal dichalcogenide layer 60L can have a substantially uniform thickness in a range from 0.6 nm to 4 nm of $Mo_{1-x}W_xS_{2-y}Se_y$. In one embodiment, the metal dichalcogenide layer 60L can have a thickness in a range from 1 monolayer to 3 monolayers of $Mo_{1-x}W_xS_{2-y}Se_y$. In such thickness ranges, the metal dichalcogenide layer 60L can provide a two-dimensional electron gas with quantum confinement along a radial direction of the memory opening, i.e., with quantum confinement in the direction of the thickness of the metal dichalcogenide layer 60L. In case a pedestal channel portion 111 is formed at a lower end of the memory opening, the metal dichalcogenide layer 60L can be formed directly on a top surface of the pedestal channel portion.

In one embodiment, the $Mo_{1-x}W_xS_{2-y}Se_y$ material of the two-dimensional electron gas channel layer 60L can be formed directly on the tubular ferroelectric dielectric layer 500 by deposition and chalcogenation (e.g., sulfurization) of a $Mo_{1-x}W_xO_y$ alloy (i.e., molybdenum oxide, tungsten oxide or molybdenum tungsten oxide) thin film, in which x ranges from 0 to 1 and y ranges from 2 to 3. The $Mo_{1-x}W_xO_y$ alloy thin film may be deposited using a super-cycle atomic layer deposition (ALD) process, in which one super-cycle includes n cycles of $MoO_x$ deposition and m cycles of $WO_3$ deposition, as described for example in J. Song, et al., Nature Communications, 6:7817 (2015). The chalcogenation of the $Mo_{1-x}W_xO_y$ alloy thin film to form the $Mo_{1-x}W_xS_{2-y}Se_y$ material may be conducted by a one or two step anneal in a chalcogen (e.g., sulfur and/or selenium containing ambient). For example, to form a $Mo_{1-x}W_xS_2$ thin film, the $Mo_{1-x}W_xO_y$ alloy thin film may be annealed in an argon and $H_2S$ containing ambient at a temperature of 600 to 850° C. for 30 to 60 minutes. Optionally, a second annealing step at a higher temperature of 950 to 1050° C. using rapid thermal processing (RTP) or a 15 to 30 minute furnace anneal in the same ambient may also be carried out after the initial anneal.

The composition and the number of atomic layers of $Mo_{1-x}W_xS_{2-y}Se_y$ alloys can be optimized by controlling the ALD cycle ratio between the atomic layer deposition of $MoO_x$ and $WO_3$. The bandgaps of the $Mo_{1-x}W_xS_{2-y}Se_y$ alloys can be precisely controlled as functions of the composition and layer numbers of each respective alloy. A vertical-composition-controlled (VCC) multilayer stack for a $Mo_{1-x}W_xS_{2-y}Se_y$ multilayer stack can be formed employing a sequential super-cycle atomic layer deposition process. For example, 5 continuous super-cycles of atomic layer deposition steps can be employed with different cycle ratios for each super-cycle. A VCC $Mo_{1-x}W_xS_{2-y}Se_y$ multilayer stack synthesized employing this method may have stronger interlayer coupling than the interlayer coupling within a VCC $Mo_{1-x}W_xS_{2-y}Se_y$ multilayer stack fabricated by individual transfer of monolayers of $Mo_{1-x}W_xS_{2-y}Se_y$.

Thus, in one embodiment, the two-dimensional electron gas channel layer 60L can be formed by performing multiple consecutive cycles of a molybdenum oxide layer deposition step and multiple consecutive cycles of a tungsten oxide layer deposition step, followed by a chalcogenation at an elevated temperature.

The metal dichalcogenide material of the two-dimensional electron gas channel layer 60L can be deposited as a crystalline semiconductor material or an amorphous semiconductor material that can be subsequently annealed to be converted into a crystalline semiconductor material. As used herein, a "crystalline material" refers to a material that is single crystalline or polycrystalline. In one embodiment, the metal dichalcogenide material of the two-dimensional electron gas channel layer 60L can be formed as, or can be converted during an anneal process into, a polycrystalline material. The two-dimensional semiconductor channel material of the two-dimensional electron gas channel layer 60L is formed directly on the physically exposed surfaces of the tubular ferroelectric dielectric layer 500.

A non-single crystal semiconductor film can be crystalline to a different degree. For instance, a polycrystalline semiconductor film is comprised of "grains". Within each grain, the material is in the crystalline phase. That is, within each grain, the crystalline structure is oriented in the same way. However, in different grains, the crystal orientation may be different. As the term is used herein, a polycrystalline semiconductor material includes nanocrystals, microcrystals, or even larger crystals. The terminology depends on the grain size. Nanocrystals have an average grain size on the order of one nanometer ($1 \times 10^{-9}$ meter) to hundreds of nanometers. Microcrystals have an average grain size on the order of one micrometer ($1 \times 10^{-6}$ meter) to hundreds of micrometers. Thus, a polycrystalline semiconductor material can have a higher degree of atomic order than an amorphous semiconductor material. Hence, the density of defect states of the polycrystalline semiconductor film is lower than that of the amorphous semiconductor film.

Referring to FIG. 19G, a channel-side interfacial dielectric layer 522 can be optionally formed on the inner sidewall of the two-dimensional electron gas channel layer 60L. The channel-side interfacial dielectric layer 522 includes a dielectric material that improves the interface quality and reduces the trap density of the two-dimensional electron gas channel layer 60L at the interface with the channel-side interfacial dielectric layer 522, thereby improving the charge carrier mobility in the two-dimensional electron gas channel layer 60L. In one embodiment, the channel-side interfacial dielectric layer 522 comprises hafnium aluminum oxide, hafnium oxide or aluminum oxide. The thickness of the channel-side interfacial dielectric layer 522 can be in a range from 1 nm to 2 nm.

Referring to FIG. 19H, a dielectric core 62 is formed within each cavity 49' that is laterally surrounded by the channel-side interfacial dielectric layer 522. For example, a dielectric material such as silicon oxide or organosilicate glass can be deposited in each cavity 49' by a conformal deposition method such as low pressure chemical vapor deposition (LPCVD), or by a self-planarizing deposition process such as spin coating.

The horizontal portions of the dielectric material, the optional channel-side interfacial dielectric layer 522 (if present), and the two-dimensional electron gas channel layer 60L can be removed from above the top surface of the insulating cap layer 70 by a planarization process. The planarization process can employ, for example, by a recess etch or chemical mechanical planarization. Each remaining portion of the two-dimensional electron gas channel layer 60L constitutes a two-dimensional electron gas channel 60 extending through a memory opening and located inside a tubular ferroelectric dielectric layer 500. Each remaining portion of the dielectric material constitutes a dielectric core 62 located inside a two-dimensional electron gas channel 60 and the optional channel-side interfacial dielectric layer 522.

Referring to FIG. 19I, the top surface of the remaining portion of the dielectric core layer can be recessed to form a recess region within each memory opening 49, for example, by a recess etch to a depth that is located between the top surface of the insulating cap layer 70 and the bottom surface of the insulating cap layer 70. The top surface of the dielectric core 62 is located between a first horizontal plane including the top surface of the insulating cap layer 70 and a second horizontal plane including the bottom surface of the insulating cap layer 70.

Referring to FIG. 19J, a doped semiconductor drain portion 630 can be formed by depositing a doped semiconductor material within the recessed region above the dielectric cores 62. The doped semiconductor drain portion 630 is a drain region including a doped semiconductor material. The doped semiconductor material can be, for example, doped polysilicon or a doped compound semiconductor material. In one embodiment, the atomic concentration of the dopants of the second conductivity type in the doped semiconductor material can be in a range from $1.0 \times 10^{19}/\text{cm}^3$ to $2.0 \times 10^{21}/\text{cm}^3$, although lesser and greater atomic concentrations can also be employed. The dopants may be introduced in-situ during growth and/or ex-situ after growth by ion implantation.

Excess portions of the deposited semiconductor material can be removed from above the top surface of the insulating cap layer 70, for example, by chemical mechanical planarization (CMP) or a recess etch to form the doped semiconductor drain portion 630 that is embedded within the two-dimensional electron gas channel 60. In one embodiment, a top surface of the doped semiconductor drain portion 630 can be coplanar with the top surface of the insulating cap layer 70. In one embodiment, the top surfaces of the doped semiconductor drain portion 630, the optional channel-side interfacial dielectric layer 522, the two-dimensional electron gas channel 60, and the tubular ferroelectric dielectric layer 500 can be coplanar with the top surface of the insulating cap layer 70. The doped semiconductor drain portion 630 including a doped semiconductor material portion can be formed directly on a sidewall of the two-dimensional electron gas channel 60.

Due to the two-dimensional or pseudo-two-dimensional nature of the two-dimensional electron gas channel 60 a two-dimensional electron gas can be formed in the two-dimensional electron gas channel 60. The two-dimensional electron gas can be a cylindrically confined electron gas. As used herein, "cylindrically confined" refers to a two-dimensional confinement in which a global topology of the two-dimensional space is homeomorphic to a sidewall surface of a cylinder. As used herein, "cylindrically confined electron gas" refers to electron gas that is cylindrically confined. Quantum confinement (e.g., quantization) of electrons occurs in the channel. Electron current can flow vertically with high mobility in the cylindrically confined electron gas.

Each contiguous combination of a tubular ferroelectric dielectric layer 500 and a two-dimensional electron gas channel 60 within a memory opening 49 constitutes a memory stack structure 55. The set of all material portions that fills a memory opening 49 constitutes a memory opening fill structure 58. FIG. 19J illustrates a first exemplary memory opening fill structure 58, which comprises an optional pedestal channel portion 111, a memory stack structure 55, an optional channel-side interfacial dielectric layer 522, a dielectric core 62, and a drain region 63.

Figure 19K:
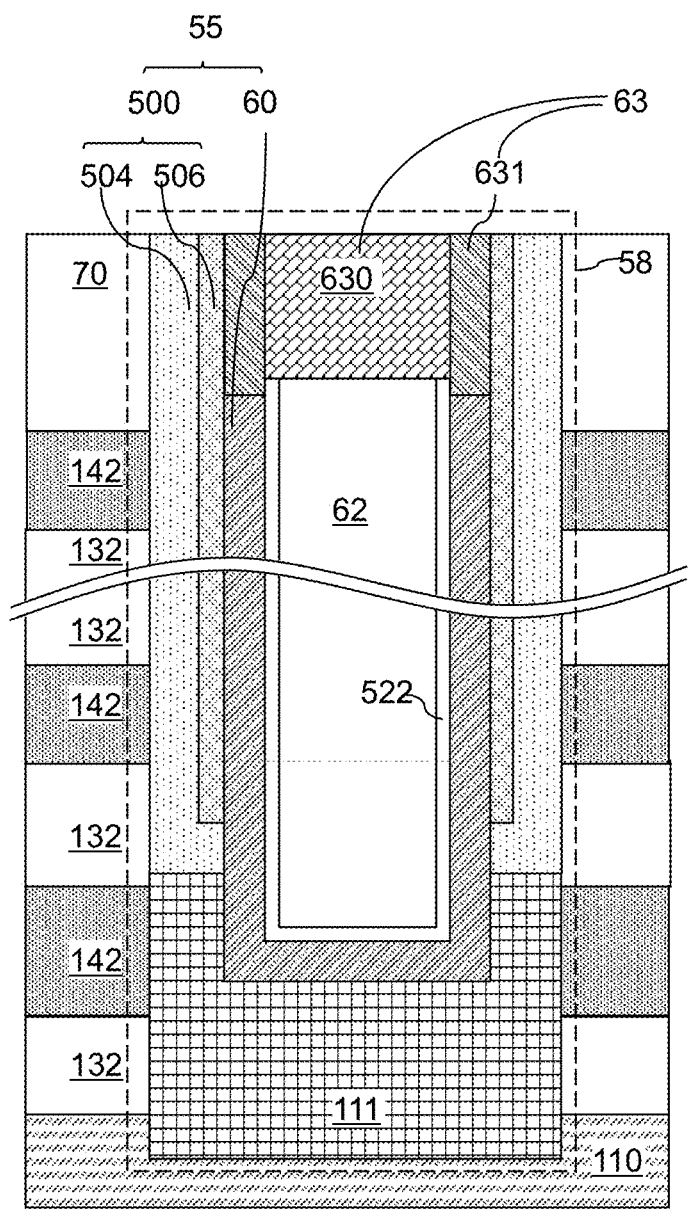
FIG. 19K is an alternative configuration for the first exemplary memory opening fill structure according to the fifth embodiment of the present disclosure.

Referring to FIG. 19K, an alternative embodiment of the first exemplary memory opening fill structure 58 is illustrated. The alternate embodiment of the first exemplary memory opening fill structure 58 can be derived from the structure of FIG. 19I or the structure of FIG. 3J by implanting ions (such as n-type dopants) into an upper portion of the two-dimensional electron gas channel 60. The implanted upper portion of the two-dimensional electron gas channel 60 is converted into a doped annular metal dichalcogenide portion, which is herein referred to as an annular doped metal dichalcogenide drain portion 631. Each drain region 63 can include a set of an annular doped metal dichalcogenide drain portion 631 and a doped semiconductor drain portion 630. In one embodiment, the ion implantation can be performed after the processing steps of FIG. 19I and before the processing steps of FIG. 19J. In another embodiment, the ion implantation can be performed after the processing steps of FIG. 19J. In this case, the doped semiconductor drain portion 630 can be formed directly on an inner sidewall of the annular doped metal dichalcogenide drain portion 631 as another component of the drain region 63.

Generally, a vertical stack of ferroelectric memory elements can be formed at a periphery of each memory opening 49 at each level of the spacer material layers (which may be the sacrificial material layers 142). The ferroelectric memory elements can be formed by conformally depositing and anisotropically etching at least one ferroelectric dielectric layer (504, 506). The ferroelectric memory elements comprise respective portions of a tubular ferroelectric dielectric layer 500 located at the level of a respective sacrificial material layer 142. A two-dimensional electron gas channel 60 is formed inside each tubular ferroelectric dielectric layer 500. A dielectric core 62 can be formed inside each two-dimensional electron gas channel 60.

Figure 20A:
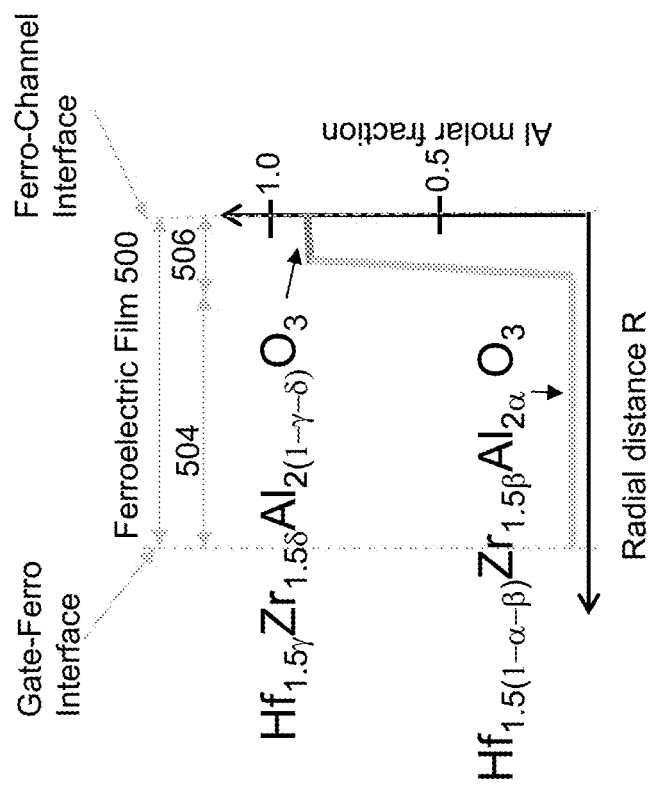
FIG. 20A is a diagram illustrating a compositional change in a tubular ferroelectric dielectric layer according to the fifth embodiment of the present disclosure.

Referring to FIG. 20A, a compositional change in a tubular ferroelectric dielectric layer 500 as a function of a radial distance R from a vertical axis passing through the geometrical center of a memory opening fill structure 58 is illustrated. The interface between a sacrificial material layer 142 and the tubular ferroelectric dielectric layer 500 corresponds to the interface between a gate electrode to be subsequently formed and a ferroelectric memory element. The interface between the tubular ferroelectric dielectric layer 500 and the two-dimensional electron gas channel 60 corresponds to the interface between a ferroelectric memory element and a semiconductor channel of a transistor. The portion of the tubular ferroelectric dielectric layer 500 that includes the first ferroelectric dielectric layer 504 can have a material composition of $Hf_{1.5(1-\alpha-\beta)}Zr_{1.5\beta}Al_{2\alpha}O_3$, wherein α is in a range from 0.01 to 0.2, and β is in a range from 0 to 0.2. The portion of the tubular ferroelectric dielectric layer 500 that includes the second dielectric layer 506 can have a material composition of $Hf_{1.5\gamma}Zr_{1.5\delta}Al_{2(1-\gamma-\delta)}O_3$, wherein γ is in a range from 0.05 to 0.2, and δ is in a range from 0 to 0.2. Thus, the first ferroelectric dielectric layer 504 comprises a first hafnium aluminum oxide or hafnium zirconium aluminum oxide layer, and the second dielectric layer 506 comprises a second hafnium aluminum oxide or hafnium zirconium aluminum oxide layer having a higher aluminum concentration than the first hafnium aluminum oxide or hafnium zirconium aluminum oxide layer.

Figure 20C:
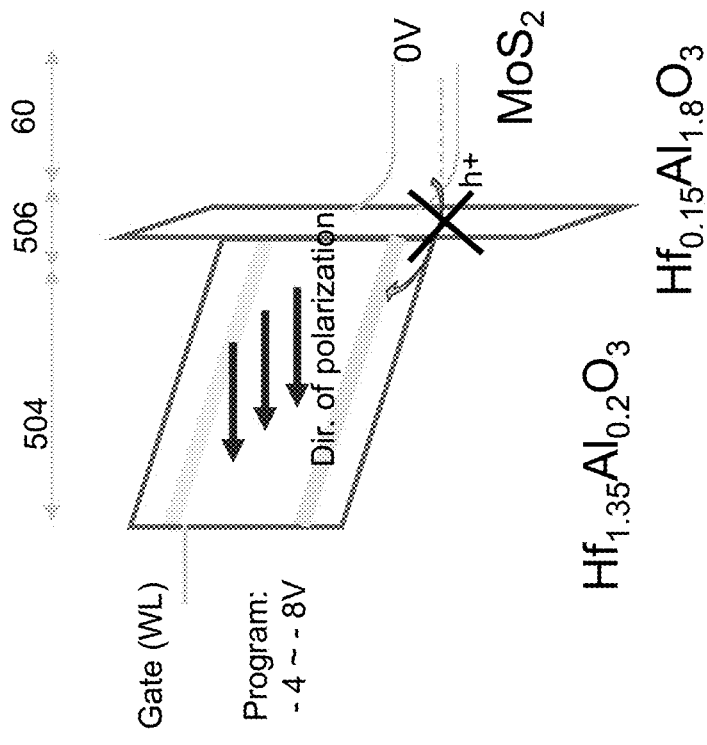
FIG. 20C is a band diagram of the tubular ferroelectric dielectric layer during a programming operation according to the fifth embodiment of the present disclosure.
Figure 20B:
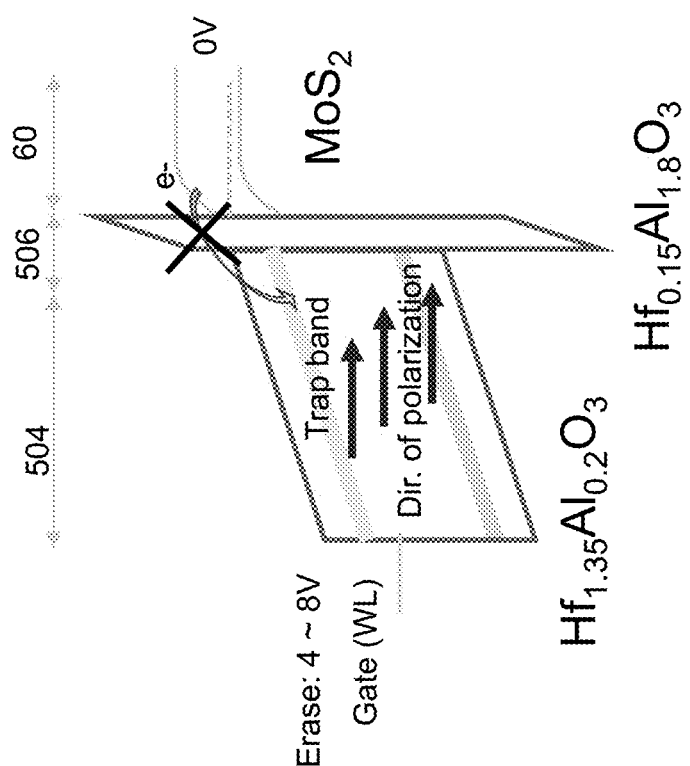
FIG. 20B is a band diagram of the tubular ferroelectric dielectric layer during an erase operation according to the fifth embodiment of the present disclosure.

Referring to FIGS. 20B and 20C, a band diagram of the tubular ferroelectric dielectric layer 500 is illustrated for the case in which the first ferroelectric dielectric layer 504 has a material composition of $Hf_{1.35}Al_{0.2}O_3$ and the second dielectric layer 506 has a material composition $Hf_{0.15}Al_{1.8}O_3$ with a higher aluminum to hafnium atomic ratio than the first ferroelectric dielectric layer 504. As shown in FIG. 20B, for an exemplary gate bias voltage of 4~8 V applied during an erase operation, electron tunneling from the two-dimensional electron gas channel 60 into the first ferroelectric dielectric layer 504 may be reduced due to the wider band gap of the $Hf_{1.35}Al_{0.2}O_3$ in the second dielectric layer 506.

As shown in FIG. 20C, for an exemplary gate bias voltage of −4~−8 V applied during a program operation, hole tunneling from the two-dimensional electron gas channel 60 into the first ferroelectric dielectric layer 504 may also be reduced due to the wider band gap of the $Hf_{1.35}Al_{0.2}O_3$ in the second dielectric layer 506.

Figure 21D:
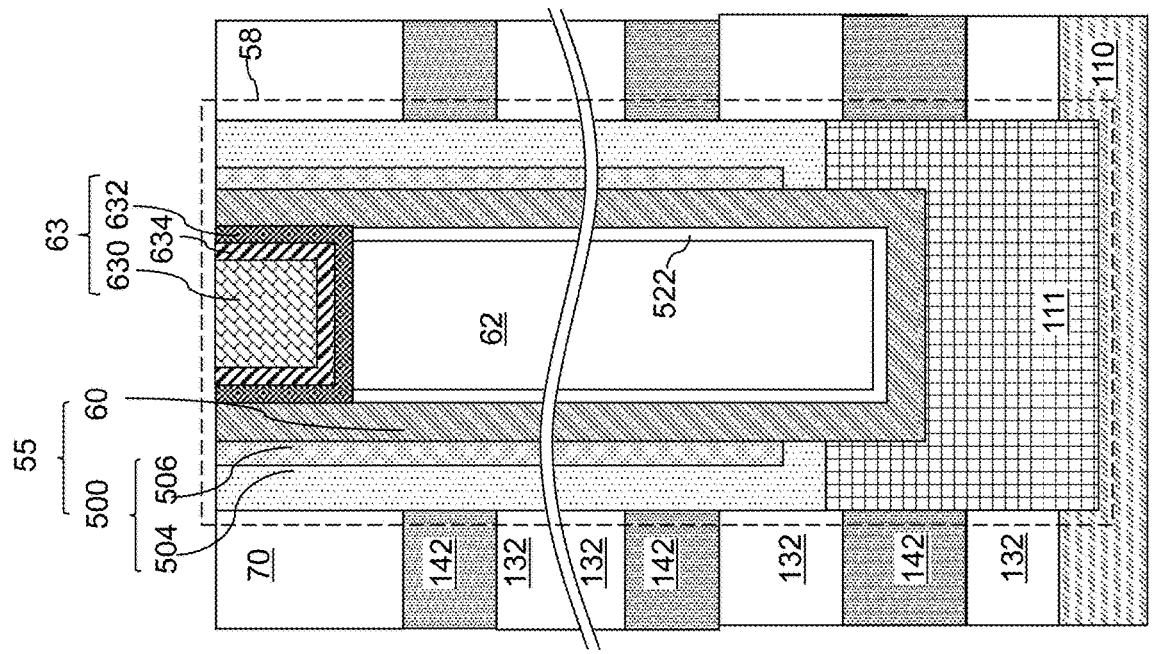
FIG. 21D is an alternative embodiment of the second exemplary structure according to the sixth embodiment of the present disclosure.
Figure 21C:
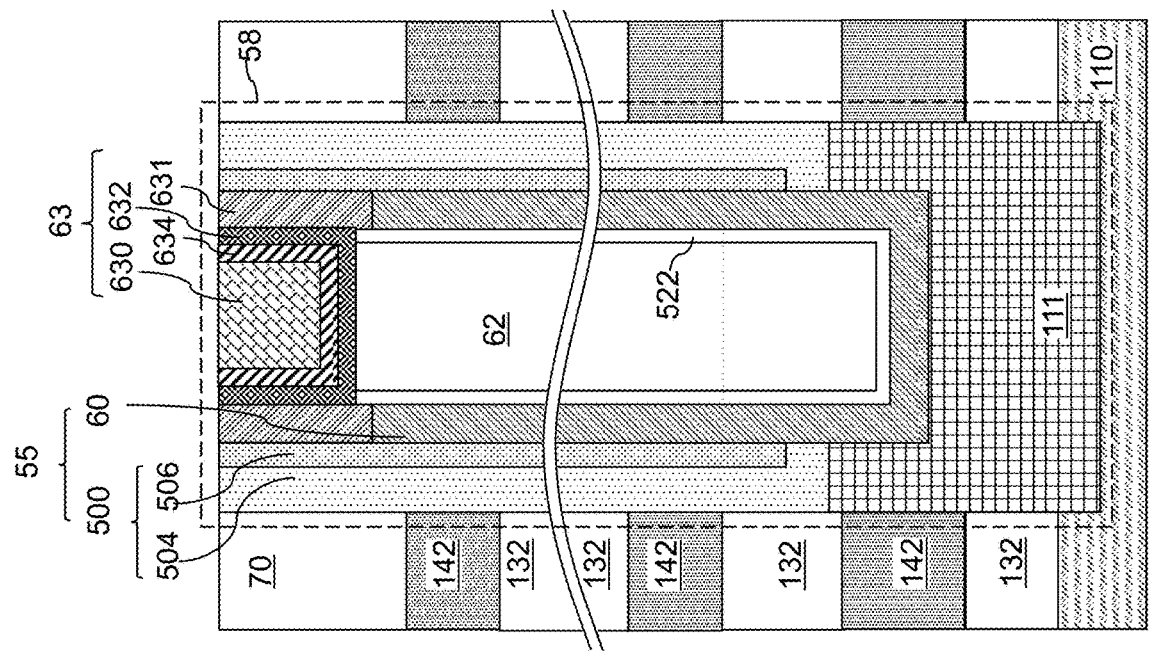

FIGS. 21A-21C illustrate a process of forming a second exemplary memory opening fill structure according to the sixth embodiment. Referring to FIG. 21A, the first exemplary memory opening fill structure of FIG. 19I may be modified by forming an annular doped metal dichalcogenide drain portion 631. The annular doped metal dichalcogenide drain portion 631 can be formed, for example, by implanting ions into an upper portion of the two-dimensional electron gas channel 60 employing an ion implantation process or a plasma doping process. An upper portion of the two-dimensional electron gas channel 60 is converted into the annular doped metal dichalcogenide drain portion 631. Thus, the annular doped metal dichalcogenide drain portion 631 contacts an upper end of the remaining portion of the two-dimensional electron gas channel 60. The annular doped metal dichalcogenide drain portion 631 is a component of a drain region.

Referring to FIG. 21B, a metallic material layer can be deposited directly on the annular doped metal dichalcogenide drain portion 631. The metallic material layer can include, and/or can consist of, a nickel layer, a nickel silicide layer, a heavily N+ doped polysilicon layer, a stack of a titanium layer and a gold layer, or a stack of a nickel layer and a gold layer. In an illustrative example, a stack of a titanium layer 632 and a gold layer 634 can be deposited directly on the annular doped metal dichalcogenide drain portion 631. The titanium layer 632 can consist essentially of titanium, and can have a thickness in a range from 1 nm to 30 nm, although lesser and greater thicknesses can also be employed. The gold layer 634 can consist essentially of gold, and can have a thickness in a range from 1 nm to 30 nm, although lesser and greater thicknesses can also be employed. A recessed region can be present over the dielectric core 62 and within sidewalls of the stack of the titanium layer 632 and the gold layer 634.

Referring to FIG. 21C, a doped semiconductor material (such as n-doped polysilicon) can be deposited within the recessed region. The doped semiconductor material can be deposited employing the same method as the deposition method employed at the processing step of FIG. 19J to form the doped semiconductor drain portion 630. In one embodiment, the atomic concentration of the dopants of the second conductivity type in the doped semiconductor material can be in a range from $1.0 \times 10^{19}/cm^3$ to $2.0 \times 10^{21}/cm^3$, although lesser and greater atomic concentrations can also be employed. The dopants may be introduced in-situ during growth and/or ex-situ after growth by ion implantation.

Portions of the doped semiconductor material, the gold layer 634, and the titanium layer 632 located above the horizontal plane including the top surface of the insulating cap layer 70 can be removed by a planarization process, which can include at least one recess etch and/or chemical mechanical planarization. Each remaining portion of the doped semiconductor material is a doped semiconductor drain portion 630. Each remaining portion of the gold layer 634 can include a cylindrical portion and a horizontal bottom portion. Each remaining portion of the titanium layer 632 can include a cylindrical portion and a horizontal bottom portion. Each drain region 63 can include an annular doped metal dichalcogenide drain portion 631, a titanium layer 632 contacting the annular doped metal dichalcogenide drain portion 631, a gold layer 634 contacting the titanium layer 632, and a doped semiconductor drain portion 630 that is embedded within, and laterally surrounded by, the stack of the titanium layer 632 and the gold layer 634. Thus, the doped semiconductor drain portion 630 is formed within a cavity laterally surrounded by the stack of the titanium layer 632 and the gold layer 634. A second exemplary memory opening fill structure 58 is provided within each memory opening 49.

Referring to FIG. 21D, an alternative embodiment of the second exemplary memory opening fill structure 58 can be derived from the second exemplary memory opening fill structure 58 by omitting formation of the annular doped metal dichalcogenide drain portion 631. In this case, the titanium layer 632 can be formed directly on the sidewall of the two-dimensional electron gas channel 60. The doped semiconductor drain portion 630 can be formed by in-situ doping of the deposited semiconductor material.

Referring to FIG. 22A, a memory opening 49 including a third exemplary memory opening fill structure 58 according to the seventh embodiment is illustrated. The third exemplary memory opening fill structure 58 can be derived from the second exemplary memory opening fill structure 58 of FIG. 21B by selecting the thicknesses of the titanium layer 632 and the gold layer 634 such that the entire cavity above the dielectric core 62 is filled with the stack of the titanium layer 632 and the gold layer 634, and by removing portions of the stack of the titanium layer 632 and the gold layer 634 from above a horizontal plane including the top surface of the insulating cap layer 70 employing a planarization process. In this case, each drain region 63 can include an annular doped metal dichalcogenide drain portion 631, a titanium layer 632, and a gold layer 634.

Referring to FIG. 22B, an alternate embodiment of the third exemplary memory opening fill structure 58 is illustrated, which can be derived from the third exemplary memory opening fill structure 58 of FIG. 22A by omitting formation of the annular doped metal dichalcogenide drain portion 631. In this case, the titanium layer 632 can be formed directly on the sidewall of the two-dimensional electron gas channel 60.

Figure 23:
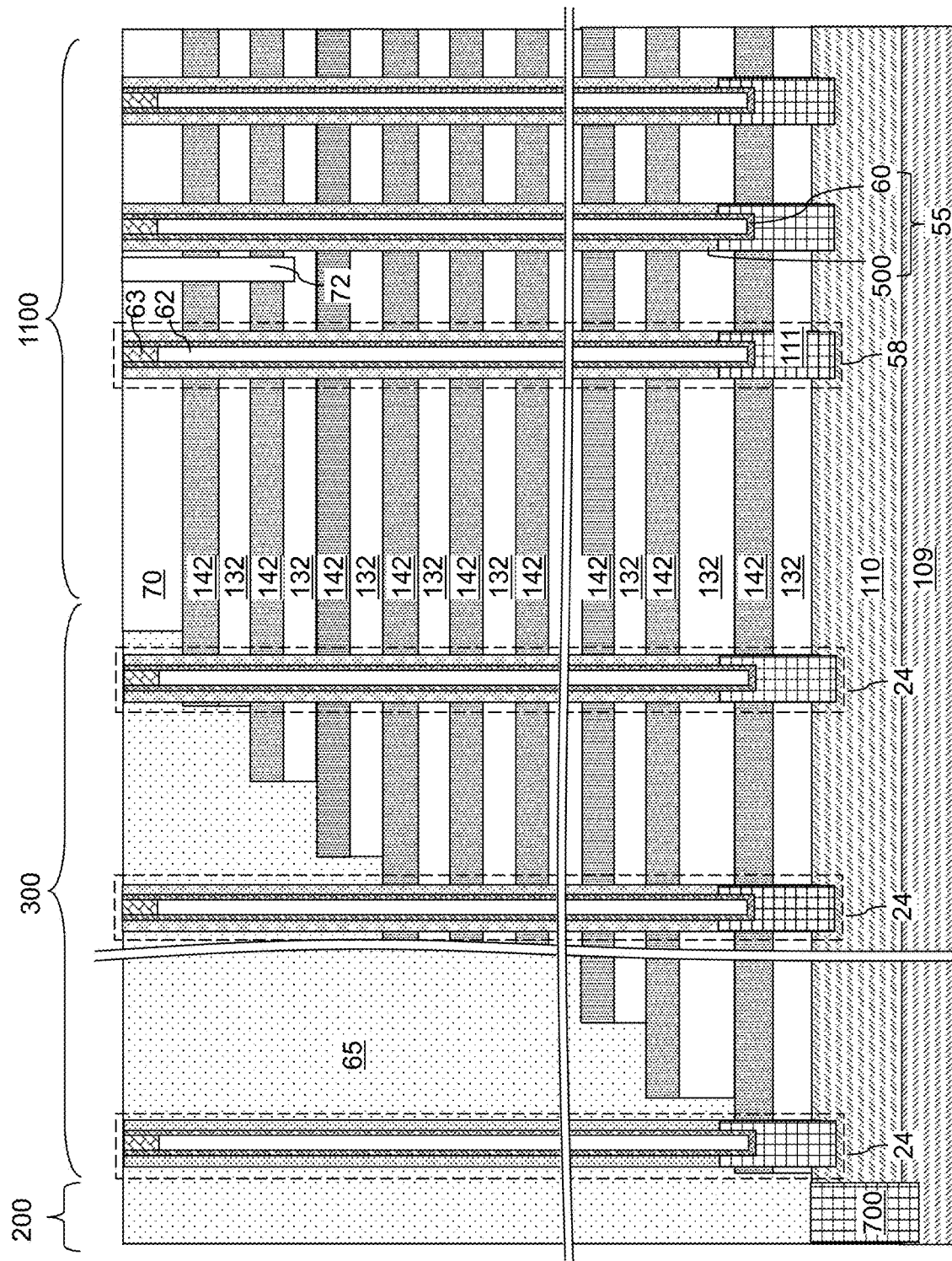
FIG. 23 is a vertical cross-sectional view of the fourth exemplary structure after formation of memory stack structures according to the eighth embodiment of the present disclosure.

Multiple instances of any of the exemplary memory opening fill structures 58 described above can be formed in the fifth exemplary structure illustrated in FIGS. 18A and 18B. FIG. 23 illustrates the fourth exemplary structure that incorporates multiple instances of an exemplary memory opening fill structure 58, which can be any of the exemplary memory opening fill structures of FIG. 19J, 19K, 21C, 21D, 22A, or 22B.

Figure 24A:
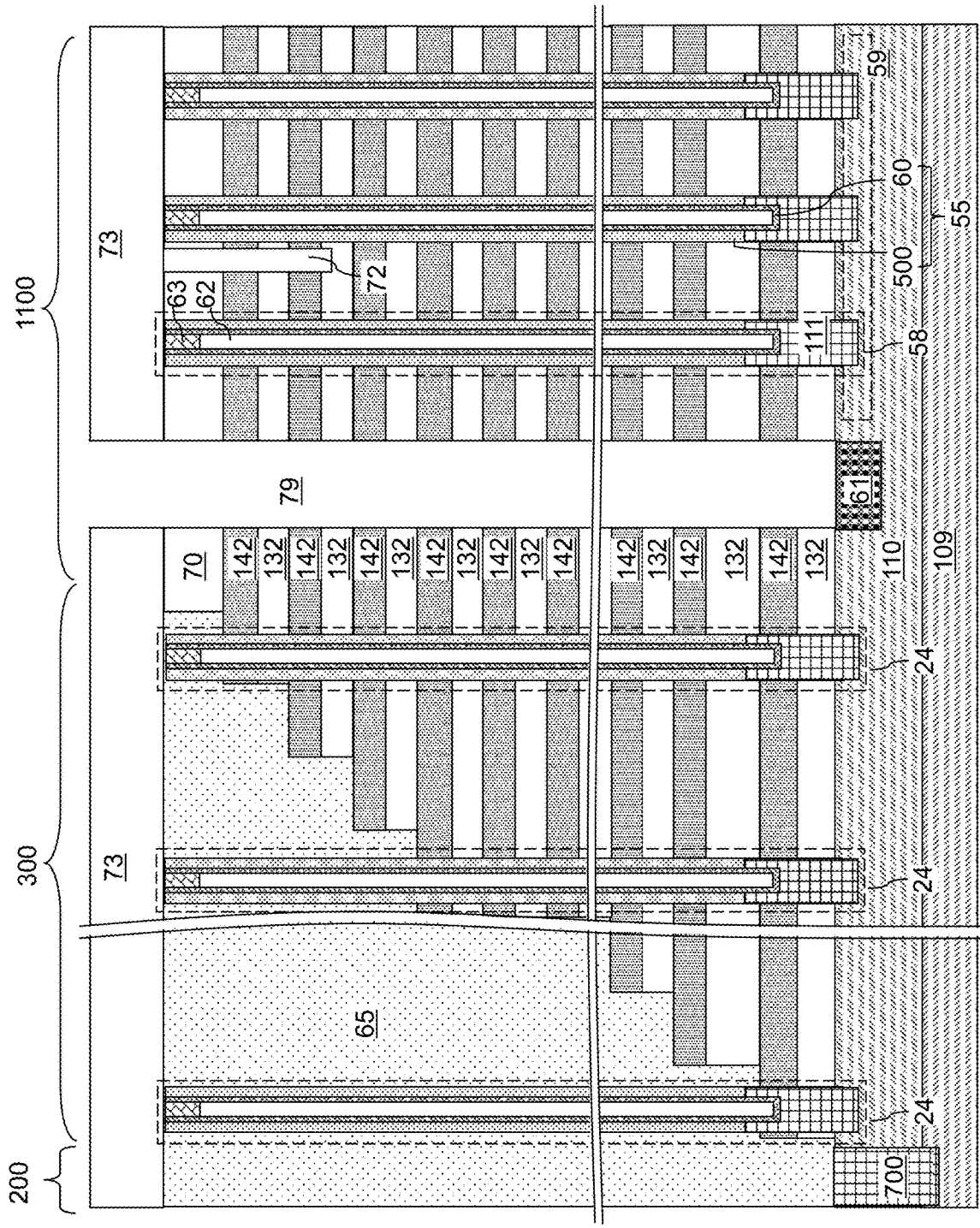
FIG. 24A is a vertical cross-sectional view of the fourth exemplary structure after formation of a backside contact trench according to the eighth embodiment of the present disclosure.

Referring to FIGS. 24A and 24B, a contact level dielectric layer 73 can be formed over the alternating stack (132, 142) of insulating layer 132 and sacrificial material layers 142, and over the memory opening fill structures 58 and the support pillar structures 24. The contact level dielectric layer 73 includes a dielectric material that is different from the dielectric material of the sacrificial material layers 142. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (132, 142) and/or the retro-stepped dielectric material portion 65 employing an anisotropic etch to form backside trenches 79, which vertically extend from the top surface of the contact level dielectric layer 73 at least to the top surface of the substrate (109, 110), and laterally extend through the memory array region 1100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Dopants of the second conductivity type can be implanted into portions of the semiconductor material layer 110 that underlie the backside trenches 79 to form source regions 61. The atomic concentration of the dopants of the second conductivity type in the source regions 61 can be in a range from $5.0 \times 10^{19}/cm^3$ to $2.0 \times 10^{21}/cm^3$, although lesser and greater atomic concentrations can also be employed. Surface portions of the semiconductor material layer 110 that extend between each source region 61 and adjacent memory opening fill structures 58 comprise horizontal semiconductor channels 59.

Figure 25:
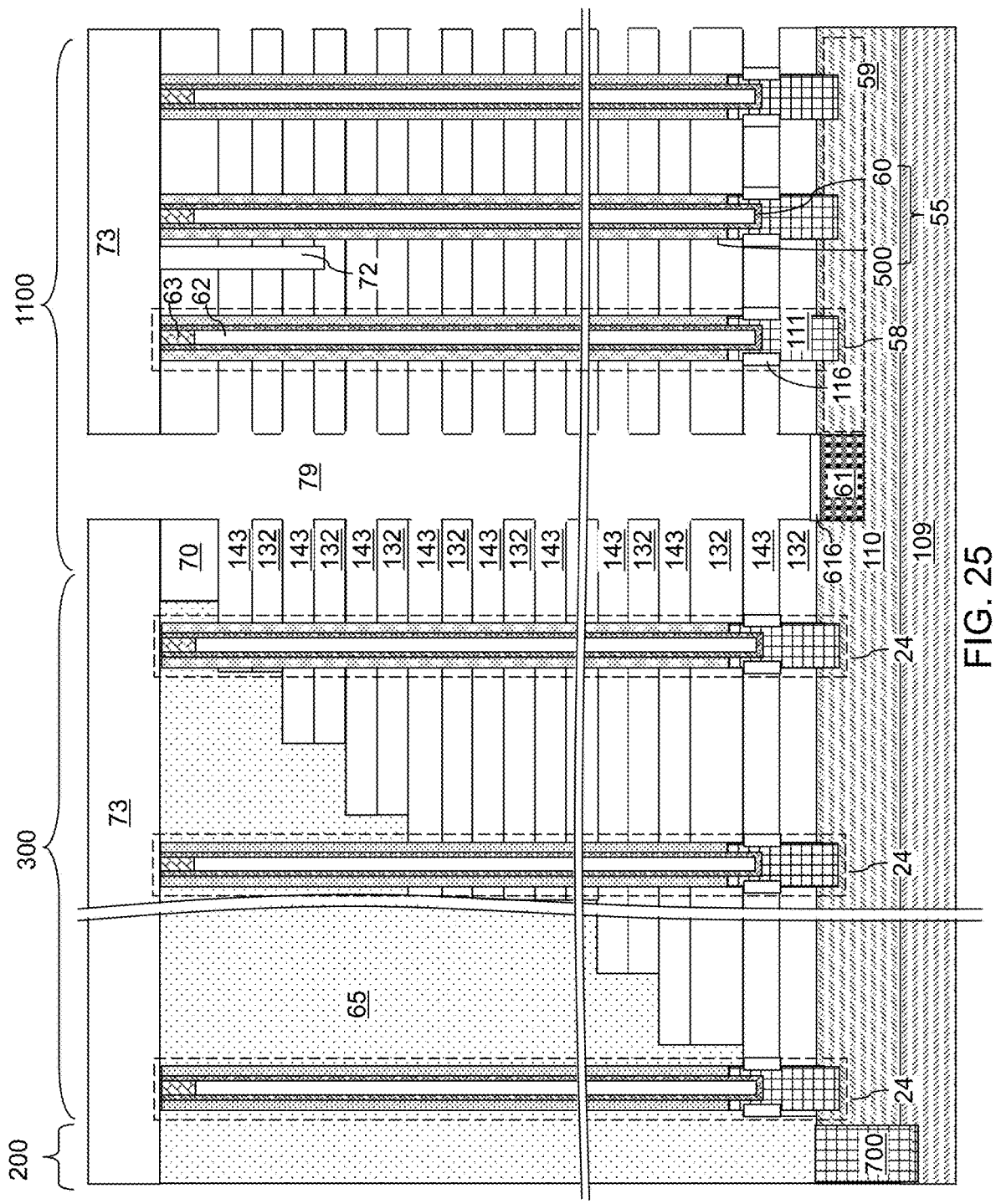
FIG. 25 is a vertical cross-sectional view of the fourth exemplary structure after formation of backside recesses according to the embodiment of the present disclosure.

Referring to FIG. 25, an etchant that selectively etches the second material of the sacrificial material layers 142 with respect to the first material of the insulating layers 132 can be introduced into the backside trenches 79, for example, employing an etch process. Backside recesses 143 are formed in volumes from which the sacrificial material layers 142 are removed. The removal of the second material of the sacrificial material layers 142 can be selective to the first material of the insulating layers 132, the material of the retro-stepped dielectric material portion 65, the semiconductor material of the semiconductor material layer 110, and the material of the outermost layer of the tubular ferroelectric dielectric layers 500. In one embodiment, the sacrificial material layers 142 can include silicon nitride, and the materials of the insulating layers 132 and the retro-stepped dielectric material portion 65 can be selected from silicon oxide and dielectric metal oxides.

The etch process that removes the second material selective to the first material and the outermost layer of the tubular ferroelectric dielectric layers 500 can be a wet etch process employing a wet etch solution, or can be a gas phase (dry) etch process in which the etchant is introduced in a vapor phase into the backside trenches 79. For example, if the sacrificial material layers 142 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structures 24, the retro-stepped dielectric material portion 65, and the memory opening fill structures 58 provide structural support while the backside recesses 143 are present within volumes previously occupied by the sacrificial material layers 142.

Each backside recess 143 can be a laterally extending cavity having a lateral dimension that is greater than the vertical extent of the cavity. In other words, the lateral dimension of each backside recess 143 can be greater than the height of the backside recess 143. A plurality of backside recesses 143 can be formed in the volumes from which the second material of the sacrificial material layers 142 is removed. The memory openings in which the memory stack structures 55 are formed are herein referred to as front openings or front cavities in contrast with the backside recesses 143. In one embodiment, the memory array region 1100 comprises an array of monolithic three-dimensional NAND strings having a plurality of device levels disposed above the substrate (109, 110). In this case, each backside recess 143 can define a space for receiving a respective word line of the array of monolithic three-dimensional NAND strings.

Each of the plurality of backside recesses 143 can extend substantially parallel to the top surface of the substrate (109, 110). A backside recess 143 can be vertically bounded by a top surface of an underlying insulating layer 132 and a bottom surface of an overlying insulating layer 132. In one embodiment, each backside recess 143 can have a uniform height throughout.

Physically exposed surface portions of the optional pedestal channel portions 111 and the semiconductor material layer 110 can be converted into dielectric material portions by thermal conversion and/or plasma conversion of the semiconductor materials into dielectric materials. For example, thermal conversion and/or plasma conversion can be employed to convert a surface portion of each pedestal channel portion 111 into a tubular dielectric spacer 116, and to convert each physically exposed surface portion of the semiconductor material layer 110 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 111 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 111. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 110. Dopants in the drain regions 63 and the source regions 61 can be activated during the anneal process that forms the planar dielectric portions 616 and the tubular dielectric spacers 116. Alternatively, an additional anneal process may be performed to active the ions in the drain regions 63 and the source regions 61.

Figure 26A:
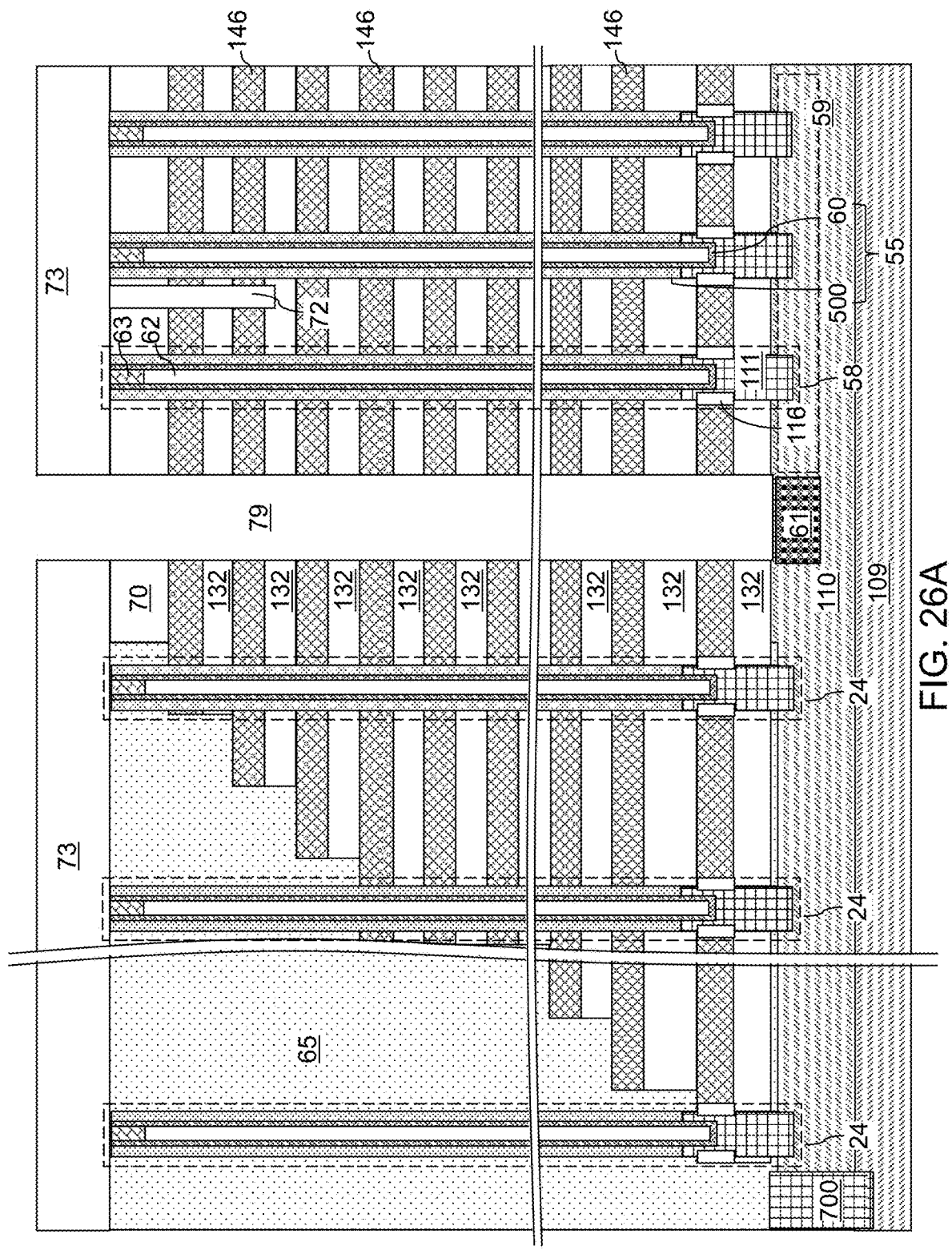
FIG. 26A is a vertical cross-sectional view of the fourth exemplary structure after formation of electrically conductive layers according to the eighth embodiment of the present disclosure.

Referring to FIG. 26A, at least one metallic material can be deposited in the backside recesses 143 by at least one conformal deposition process. The at least one metallic material can include, for example, a metallic barrier layer a metallic fill material. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metallic fill material can be subsequently deposited over the metallic barrier layer by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 132 and the memory opening fill structures 58 by the metallic barrier layer, which can block diffusion of fluorine atoms therethrough.

A plurality of electrically conductive layers 146 can be formed in the plurality of backside recesses 143, and a continuous electrically conductive material layer can be formed on the sidewalls of each backside trench 79 and over the contact level dielectric layer 73. Each electrically conductive layer 146 includes a portion of the metallic barrier layer and a portion of the metallic fill material layer that are located between a vertically neighboring pair of dielectric material layers such as a pair of insulating layers 132. The continuous electrically conductive material layer includes a continuous portion of the metallic barrier layer and a continuous portion of the metallic fill material layer that are located in the backside trenches 79 or above the contact level dielectric layer 73.

Each sacrificial material layer 142 can be replaced with an electrically conductive layer 146. A backside cavity is present in the portion of each backside trench 79 that is not filled with the continuous electrically conductive material layer. A tubular dielectric spacer 116 laterally surrounds a pedestal channel portion 111. A bottommost electrically conductive layer 146 laterally surrounds each tubular dielectric spacer 116 upon formation of the electrically conductive layers 146.

The deposited metallic material of the continuous electrically conductive material layer is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 143 constitutes an electrically conductive layer 146. Each electrically conductive layer 146 can be a conductive line structure. Thus, the sacrificial material layers 142 are replaced with the electrically conductive layers 146. The planar dielectric portions 616 can be removed during removal of the continuous electrically conductive material layer. A backside cavity is present within each backside trench 79.

Each of the middle electrically conductive layers 146 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 146 are the control gate electrodes for the vertical memory devices including the memory stack structures 55. In other words, each electrically conductive layer 146 can be a word line that functions as a common control gate electrode for the plurality of vertical memory devices.

At least one topmost electrically conductive layer 146 can function as a drain side select gate electrode (SGD). At least one bottommost electrically conductive layer 146 can function as a source side select gate electrode (SGS). Optionally, at least one electrically conductive layer 146 located between SGD and the word lines may comprise a drain side dummy word line to mitigate impact on the drain side edge memory cell in the memory string. Optionally, at least one additional electrically conductive layer 146 located between SGS and the word lines may comprise a source side dummy word line to mitigate impact on the source side edge memory cell in the memory string.

Figures 26B, 26C:
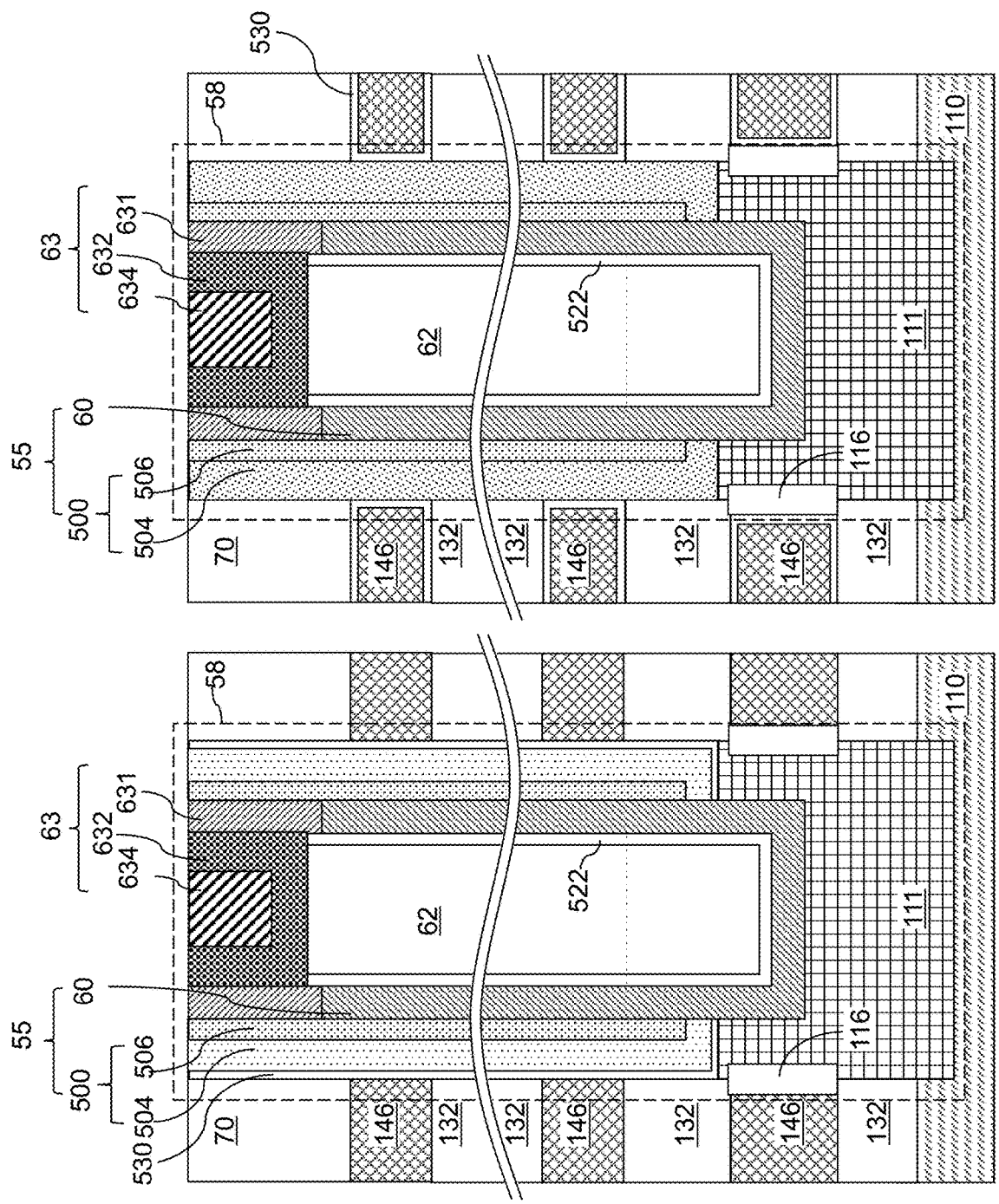
FIG. 26B is a magnified view of a region around a memory opening fill structure in an alternative embodiment of the fourth exemplary structure of FIG. 26A.
FIG. 26C is a magnified view of a region around a memory opening fill structure in another alternative embodiment of the fourth exemplary structure of FIG. 26A.

Referring to FIGS. 26B and 26C, alternative embodiments of a region of the fourth exemplary structure containing ferroelectric-side interfacial dielectric layer 530 around a memory opening fill structure 58 are illustrated, which can be derived from the fourth exemplary structure illustrated in FIG. 26A. In the embodiment of FIG. 26B, the ferroelectric-side interfacial dielectric layer 530 is formed in the memory opening 49 prior to forming the tubular ferroelectric dielectric layer 500. In the embodiment of FIG. 26C, the ferroelectric-side interfacial dielectric layer 530 is formed in the backside recesses 143 directly on physically exposed cylindrical outer sidewalls segments of the tubular ferroelectric dielectric layer 500 of each memory opening fill structure 58, and directly on physically exposed horizontal surfaces of the insulating layers 132 and the insulating cap layer prior to the formation of the electrically conductive layers 146. The ferroelectric-side interfacial dielectric layer 530 includes a dielectric material that improves the interface quality and improves the ferroelectric characteristics of the tubular ferroelectric dielectric layer 500 and the electrically conductive layers 146. The ferroelectric-side interfacial dielectric layer 530 comprises hafnium aluminum oxide, hafnium oxide or aluminum oxide. The thickness of the channel-side interfacial dielectric layer 522 can be in a range from 1 nm to 2 nm.

Figure 27:
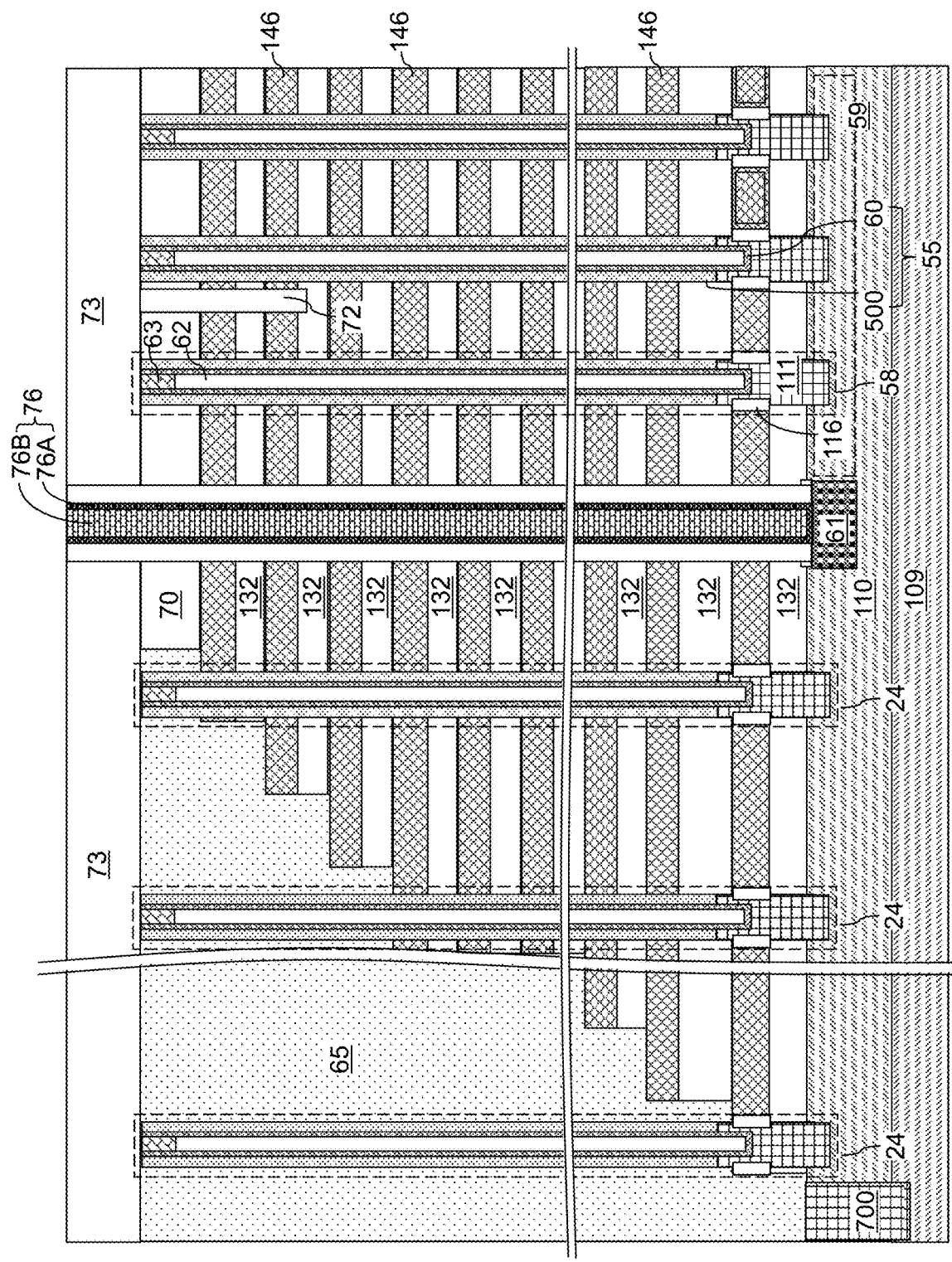
FIG. 27 is a vertical cross-sectional view of the fourth exemplary structure after formation of backside contact via structures according to the eighth embodiment of the present disclosure.

Referring to FIG. 27, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 110 can be physically exposed at the bottom of each backside trench 79.

An upper portion of the semiconductor material layer 110 that extends between the source region 61 and the plurality of pedestal channel portions 111 constitutes a horizontal semiconductor channel 59 for a plurality of field effect transistors. The horizontal semiconductor channel 59 is connected to multiple metal dichalcogenide channels 60 through respective pedestal channel portions 111. The horizontal semiconductor channel 59 contacts the source region 61 and the plurality of pedestal channel portions 111. Each source region 61 is formed in an upper portion of the substrate (109, 110). Semiconductor channels (59, 111, 60) extend between each source region 61 and a respective set of drain regions 63. The semiconductor channels (59, 111, 60) include the two-dimensional electron gas channels 60 of the memory stack structures 55.

A backside contact via structure 76 can be formed within each backside cavity. Each contact via structure 76 can fill a respective backside cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (132, 146) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (132, 146), and contacts a top surface of the source region 61.

Figure 28A:
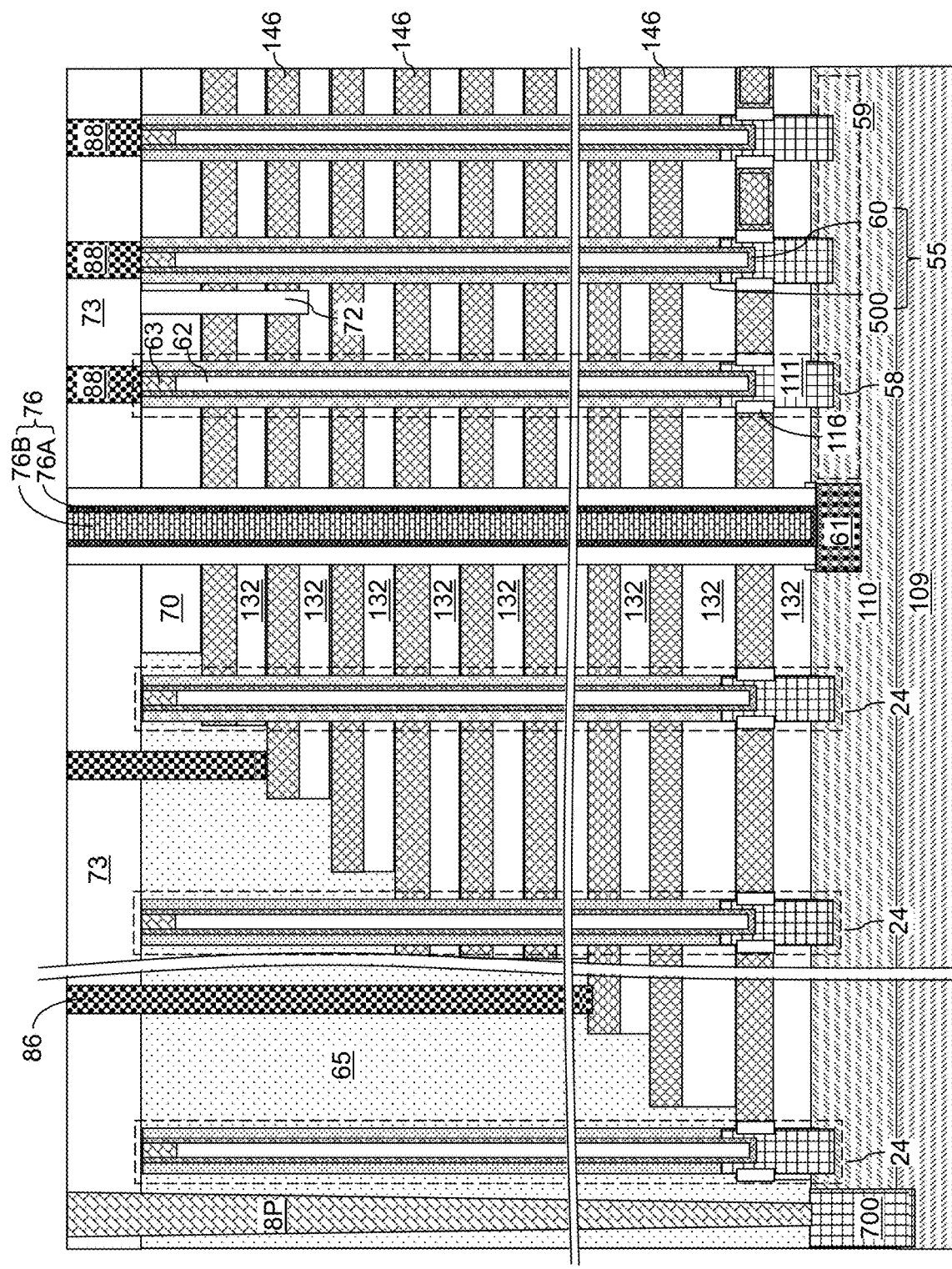
FIG. 28A is a vertical cross-sectional view of the fourth exemplary structure after formation of additional contact via structures according to the eighth embodiment of the present disclosure.
Figure 28B:
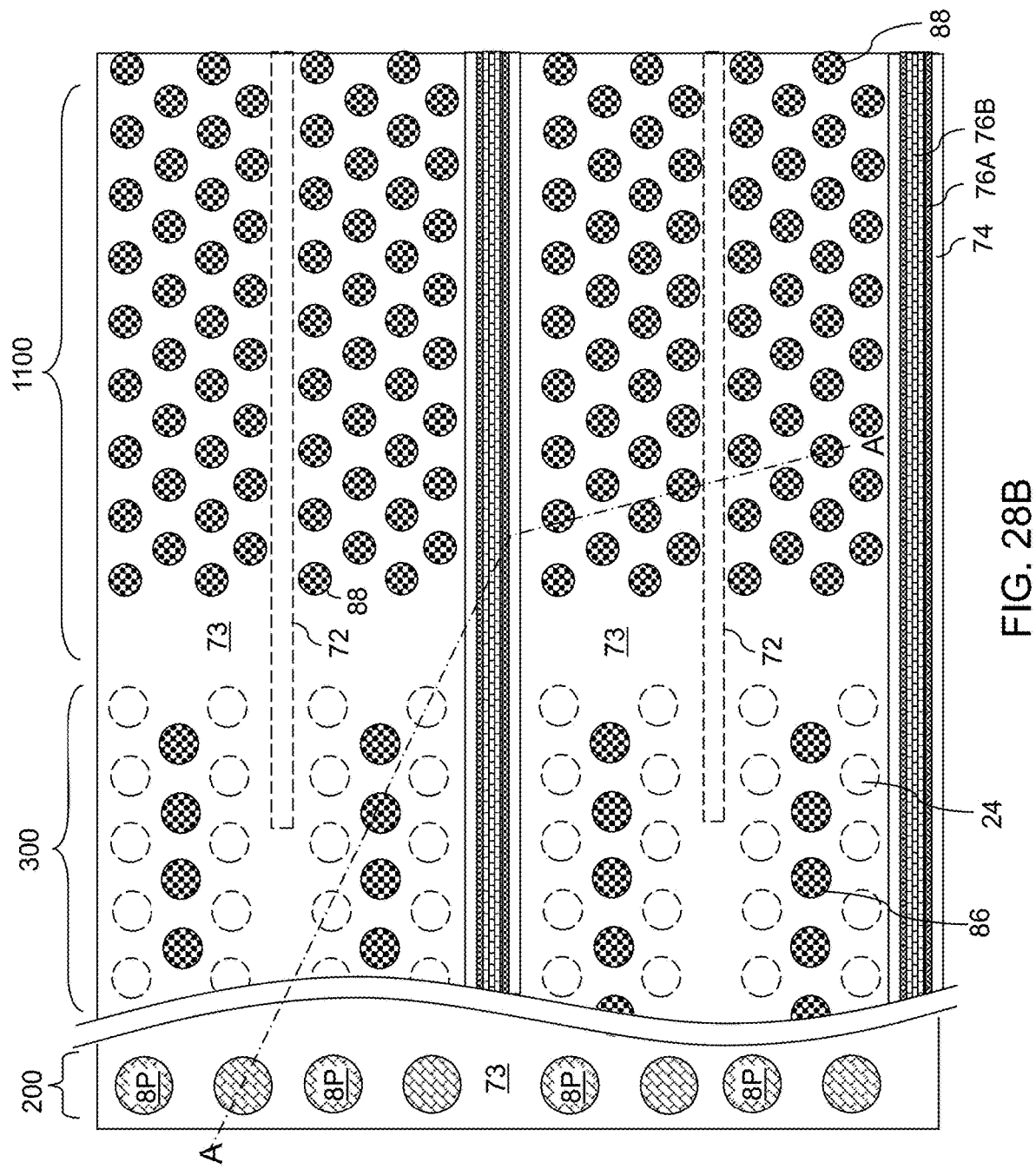
FIG. 28B is a partial see-through top-down view of the fourth exemplary structure of FIG. 28A. The vertical plane A-A' is the plane of the vertical cross-sectional view of FIG. 28A.

Referring to FIGS. 28A and 28B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 146 through the contact level dielectric layer 73, and through the retro-stepped dielectric material portion 65. Peripheral device contact via structures 8P can be formed through the retro-stepped dielectric material portion 65 directly on respective nodes of the peripheral devices.

Referring to all embodiments of the present disclosure, a ferroelectric memory device includes a two-dimensional electron gas channel 60, a gate electrode (46, 146), and a ferroelectric memory element (21, 22, 23, 500) located between the gate electrode and the two-dimensional electron gas channel.

Each configuration of the second through fourth exemplary structures of the present disclosure can include an alternating stack of insulating layers 132 and electrically conductive layers 146 (one of which comprises the above mentioned gate electrode) located over a substrate (109, 110), a memory opening 49 vertically extending through the alternating stack, the two-dimensional electron gas channel 60 located inside memory opening, ferroelectric memory elements (e.g., portions of layer 500) located between the channel 60 and the electrically conductive layers 146, and a dielectric core 62 surrounded by the channel.

In one embodiment, the two-dimensional electron gas channel 60 comprises a metal dichalcogenide channel. In one embodiment, the ferroelectric memory elements comprise portions of a tubular ferroelectric dielectric layer 500 vertically extending through the electrically conductive layers 146 of the alternating stack.

In one embodiment, the tubular ferroelectric dielectric layer 500 comprises: a first ferroelectric dielectric layer 504 having a first band gap energy; and a second dielectric layer 506 having a second band gap energy that is greater than the first band gap energy and located between the first ferroelectric dielectric layer 504 and the metal dichalcogenide channel.

In one embodiment, the first ferroelectric dielectric layer 504 comprises a first hafnium aluminum oxide or hafnium zirconium aluminum oxide layer; and the second dielectric layer 506 comprises a second hafnium aluminum oxide or hafnium zirconium aluminum oxide layer having a higher aluminum concentration than the first hafnium aluminum oxide or hafnium zirconium aluminum oxide layer. In one embodiment, the first ferroelectric dielectric layer 504 has a material composition of $Hf_{1.5(1-\alpha-\beta)}Zr_{1.5\beta}Al_{2\alpha}O_3$, wherein $\alpha$ is in a range from 0.01 to 0.2, and $\beta$ is in a range from 0 to 0.2; and the second dielectric layer 506 has a material composition of $Hf_{1.5\gamma}Zr_{1.5\delta}Al_{2(1-\gamma-\delta)}O_3$, wherein $\gamma$ is in a range from 0.05 to 0.2, and $\delta$ is in a range from 0 to 0.2.

In one embodiment, the metal dichalcogenide channel has a thickness in a range from 1 monolayer to 5 monolayers. In one embodiment, the metal dichalcogenide channel comprises a material having a composition of $Mo_{1-x}W_xS_{2-y}Se_y$, wherein x is in a range from 0 to 1, and y is independent of x and is in a range from 0 to 2.

In one embodiment, the substrate (109, 110) comprises a semiconductor material layer 110. A bottom end of the metal dichalcogenide channel is electrically connected to the semiconductor material layer. In one embodiment, the monolithic three-dimensional memory device comprises a pedestal channel portion 111 that is located at a bottom end of the memory opening 49 and epitaxially aligned to the semiconductor material layer 110, wherein the metal dichalcogenide channel contacts a top surface of the pedestal channel portion 111.

In one embodiment, the monolithic three-dimensional memory device comprises a drain region 63 contacting an upper end of the metal dichalcogenide channel. In one embodiment, the drain region 63 comprises an annular doped metal dichalcogenide drain portion 631. In one embodiment, the drain region 63 further comprises a nickel layer, a nickel silicide layer, a N+ doped polysilicon layer, a stack of a titanium layer and a gold layer, or a stack of a nickel layer and a gold layer, such as a stack of a titanium layer 632 and a gold layer 634 embedded within the annular doped metal dichalcogenide drain portion 631; and a doped semiconductor drain portion 630 embedded within the stack of the titanium layer 632 and the gold layer 634. The drain region 63 comprises a doped semiconductor drain portion 630 contacting an inner sidewall of the annular doped metal dichalcogenide drain portion 631. In one embodiment, the drain region 63 comprises a stack of a titanium layer 632 and a gold layer 634; and the titanium layer 632 contacts the sidewall of the metal dichalcogenide channel.

In one embodiment, the ferroelectric memory elements are in direct contact with the electrically conductive layers 146. In one embodiment, the memory device of the present disclosure can be a monolithic three-dimensional memory device comprising a vertical NAND device located over the substrate (109, 110), and the electrically conductive layers 146 can comprise, or are electrically connected to, a respective word line of the vertical NAND device. The substrate (109, 110) can comprise a silicon substrate. The vertical NAND device can comprise an array of monolithic three-dimensional NAND strings located over the silicon substrate. At least one memory cell in a first device level of the three-dimensional array of NAND strings is located over another memory cell in a second device level of the three-dimensional array of NAND string. The silicon substrate can contain an integrated circuit comprising a driver circuit for the memory device located thereon.

The array of monolithic three-dimensional NAND strings can comprise a plurality of metal dichalcogenide channels. At least one end portion of each of the plurality of metal dichalcogenide channels extends substantially perpendicular to a top surface of the substrate (109, 110). In one embodiment, the plurality of metal dichalcogenide channels can be connected in a parallel connection to a common horizontal semiconductor channel portion that is a portion of the semiconductor material layer 110 that extends between a source region 61 and the pedestal channel portions 111. The array of monolithic three-dimensional NAND strings can comprise a plurality of memory elements (e.g., memory cells which comprise portions of a tubular ferroelectric dielectric layer 500 that is present within each memory stack structure 55). Each memory element can be located adjacent to a respective one of the plurality of metal dichalcogenide channels, i.e., two-dimensional electron gas channels 60. The array of monolithic three-dimensional NAND strings can comprise a plurality of control gate electrodes having a strip shape extending substantially parallel to the top surface of the substrate (109, 110).

A two-dimensional metal dichalcogenide channel may have a thickness not greater than five atomic layers, and even more preferably not greater than three-atomic layers. Such a thin metal dichalcogenide material displays characteristics of a two-dimensional channel providing high charge carrier mobility. For example, a $MoS_2$ channel can have field limited mobility up to about 200 $cm^2/Vs$. This is more than an order of magnitude higher than the field limited mobility in conventional polysilicon channel.

The high mobility transport of electrons can be advantageously employed to increase the on-current of a memory stack structure, and to increase the signal-to-noise ratio during the read operation of the memory stack structure. The low leakage and low gate induced drain leakage ("GIDL") may result in lower power and less program and read disturb. The lower leakage, hence better boosting and less program disturb may lead to smaller power consumption. Additionally or alternatively, operation voltages can be reduced, thus cutting power consumption.

According to another aspect of the present disclosure, any of the ferroelectric memory elements of the present disclosure, such as the ferroelectric memory elements 21, the backside ferroelectric memory elements 22, wrap around ferroelectric memory elements 23, and/or the ferroelectric dielectric layer 504 may comprise a two-dimensional Van der Waals ferroelectric material. This material provides a Van der Waals heterostructure with the two-dimensional electron gas channel 60. Due to the two-dimensional characteristics of the materials therein, such structures can provide an ideal insulator/semiconductor interface without dangling bonds (with reduced dangling bonds), and improves device reliability. The small thicknesses of the ferroelectric memory elements and the semiconductor channel improve device scalability. At the same time, much higher mobility of the two-dimensional semiconductor channel can provide higher cell current and enhanced performance. The thickness of the two-dimensional ferroelectric material can have a thickness in a range from a single monolayer to 5 monolayers.

Non-limiting examples of the two-dimensional ferroelectric materials include $CuInP_2S_6$, $a-In_2Se_3$, g-SbP, g-SbAs, and Group IV monochalcogenide material having a formula of MX in which M is selected from Ge, Sn, or Pb and X is selected from S, Se, or Te.

For example, $\alpha-In_2Se_3$ is ferroelectric and has a Van der Waals structure, holds ferroelectric properties down to the single monolayer having a thickness of about 1 nm, holds ferroelectric properties in a multilayer structure, and has rhombohedral R3m structure, which is non-centrosymmetric and supports polarization that is switchable by an external electrical field.

In another example, $\gamma$-SbX (X=As, P) can be formed as a Van der Waals two-dimensional ferroelectric film having a thickness of a single monolayer or 2 to 3 monolayers. Based on first-principles calculations, ferroelectric memory devices of the present disclosure employing $\gamma$-SbX (X=As, P) are projected to exhibit excellent two-dimensional ferroelectricity with polarization around $3.80 \times 10^{-10}$ C m$^{-1}$ (for $\gamma$-SbAs) or $3.47 \times 10^{-10}$ C m$^{-1}$ (for $\gamma$-SbP). Further, the $\gamma$-SbX (X=As, P) can work at very high temperatures. For example, ferroelectricity of a single layer of $\gamma$-SbAs or $\gamma$-SbP is maintained well up to a temperature range of 600 K or 700 K. Thus, $\gamma$-SbX can be employed as a robust ferroelectric material in two-dimensional ferroelectric material—two-dimensional semiconductor material heterostructures to form the various nonvolatile memory devices of the present disclosure, which may comprise a three-dimensional NAND memory device or a three-dimensional NOR memory device.

In yet another example, the two-dimensional Van der Waals ferroelectric material can include $CuInP_2S_6$ (CIPS). In one example, CIPS can be deposited by chemical vapor deposition or conformal atomic layer deposition, e.g., using corresponding stoichiometric elemental precursors. The thickness of CIPS may be in a range from 2 nm to 6 nm. The deposited film may be annealed at an elevated temperature in a temperature range from 650 degrees Celsius to 750 degrees Celsius for a duration in a range from 10 minutes to 30 minutes.

In one embodiment, an optional ferroelectric-side interfacial dielectric layer 530 may be formed between the gate or word line and the two-dimensional Van der Waals ferroelectric material. The ferroelectric-side interfacial dielectric layer 530 may comprise aluminum oxide. For example, if the two-dimensional Van der Waals ferroelectric material is used as the ferroelectric dielectric layer 504 in the three-dimensional NAND device illustrated in FIG. 28A, then the ferroelectric-side interfacial dielectric layer 530 may be formed inside the backside recesses 143 shown in FIG. 25 prior to depositing the electrically conductive layers 146 in the backside recesses 143 on the dielectric interlayer, as shown in FIG. 26A. Thus, a structure similar to that of FIG. 26C may be formed. Alternatively, the ferroelectric-side interfacial dielectric layer 530 may be formed in the memory opening 49 prior to forming the tubular ferroelectric dielectric layer 500 to for a structure similar to that of FIG. 26B.

Figure 29:
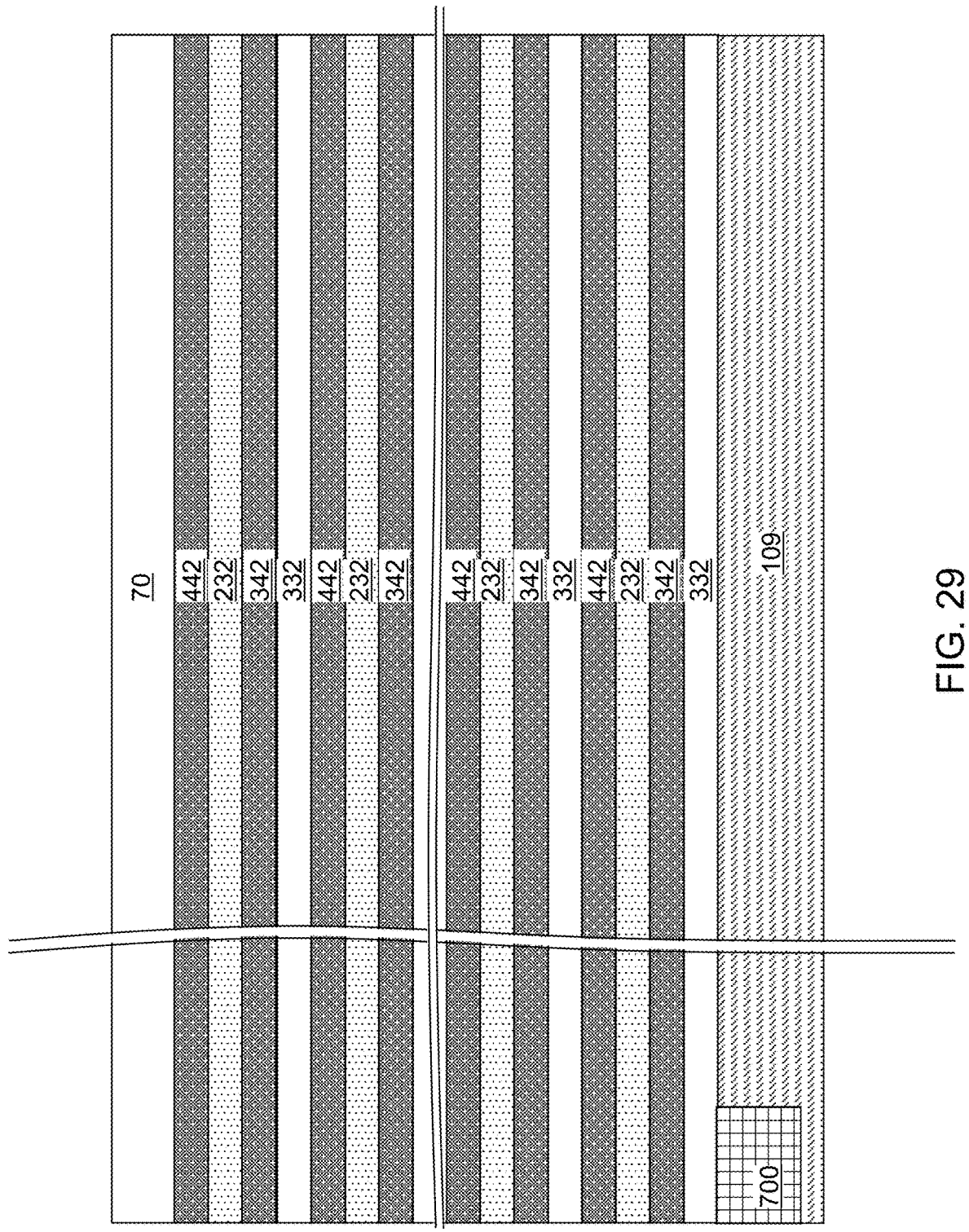
FIG. 29 is a vertical cross-sectional view of a fifth exemplary structure after formation of multiple instances of a unit layer stack including a source-level sacrificial layer, a channel-level insulating layer, a drain-level sacrificial layer, and a device-isolation-level insulating layer and formation of an insulating cap layer over a substrate according to a ninth embodiment of the present disclosure.

Referring to FIG. 29, a fifth exemplary structure according to a ninth embodiment of the present disclosure is illustrated, which may be derived from the fifth exemplary structure of FIG. 15. In this case, the semiconductor material layer 110 may, or may not, be employed. An insulating substrate may be employed in lieu of the substrate semiconductor layer 109. At least one instance of a unit layer stack including a device-isolation-level insulating layer 332, a source-level sacrificial layer 342, a channel-level insulating layer 232, and a drain-level sacrificial layer 442 can be formed over the substrate semiconductor layer 109. A plurality of instances of the unit layer stack may be formed over the substrate. The total number of instances of the unit layer stack may be in a range from 1 to 512, such as from 2 to 128, although lesser and greater number of the unit layer stack may also be employed.

Each source-level sacrificial layer 342 and each drain-level sacrificial layer 442 include a sacrificial material that can be removed selective to the materials of the device-isolation-level insulating layer 332 and the channel-level insulating layer 232. Further, each channel-level insulating layer 232 includes a material providing a higher etch rate in an etchant that etches each device-isolation-level insulating layer 332 selective to each source-level sacrificial layer 342 and each drain-level sacrificial layer 442.

In one embodiment, a vertical stack including a plurality instances of the unit layer stack may be derived from the alternating stack (132, 142) of the fifth exemplary structure by employing every odd-numbered (as counted from the bottom beginning with the integer 1) sacrificial material layer 142 as a source-level sacrificial layer 342, by employing every even-numbered sacrificial material layer 142 as a drain-level sacrificial layer 442, any by modifying the material composition of each even-numbered insulating layers 132 to provide a higher etch rate in an etchant than each odd-numbered insulating layer 132. In this case, the odd-numbered insulating layers 132 in the fifth exemplary structure can be the device-isolation-level insulating layers 332 in the fifth exemplary structure, and the even-numbered insulating layers 132 in the fifth exemplary structure can be the channel-level insulating layers 232.

Alternatively, the locations of the source-level sacrificial layers 342 and the drain-level sacrificial layers 442 may be reversed. In this case, every odd-numbered (as counted from the bottom beginning with the integer 1) sacrificial material layer 142 in the fifth exemplary structure can be employed as a source-level sacrificial layer 342 in the fifth exemplary structure, and every even-numbered sacrificial material layer 142 can be employed as a drain-level sacrificial layer 442 in the fifth exemplary structure.

In an illustrative example, the source-level sacrificial layers 342 and the drain-level sacrificial layers 442 can include silicon nitride, the device-isolation-level insulating layers 332 can include undoped silicate glass (such as TEOS oxide), and the channel-level insulating layers 232 can include a doped silicate glass (such as borosilicate glass, borophosphosilicate glass, or fluorosilicate glass) or organosilicate glass. In this case, the channel-level insulating layers 232 can have an etch rate in 100:1 dilute hydrofluoric acid that is at least 5 times (such as from 10 times to 1,000 times) the etch rate of the undoped silicate glass.

Generally, at least one instance of the unit layer stack can be formed over a substrate. The unit layer stack can comprise, from bottom to top or from top to bottom, a device-isolation-level insulating layer 332, a source-level sacrificial layer 342, a channel-level insulating layer 232, and a drain-level sacrificial layer 442. In one embodiment, the at least one instance of the unit layer stack comprises a vertical stack of a plurality of instances of the unit layer stack. An insulating cap layer 70 can be formed over the at least one instance of the unit layer stack.

Figure 30:
FIG. 30 is a vertical cross-sectional view of the fifth exemplary structure after forming stepped surfaces and a retro-stepped dielectric material portion according to the ninth embodiment of the present disclosure.

Referring to FIG. 30, the processing steps of FIG. 17 can be performed to form stepped surfaces and a retro-stepped dielectric material portion 65.

Figure 31:
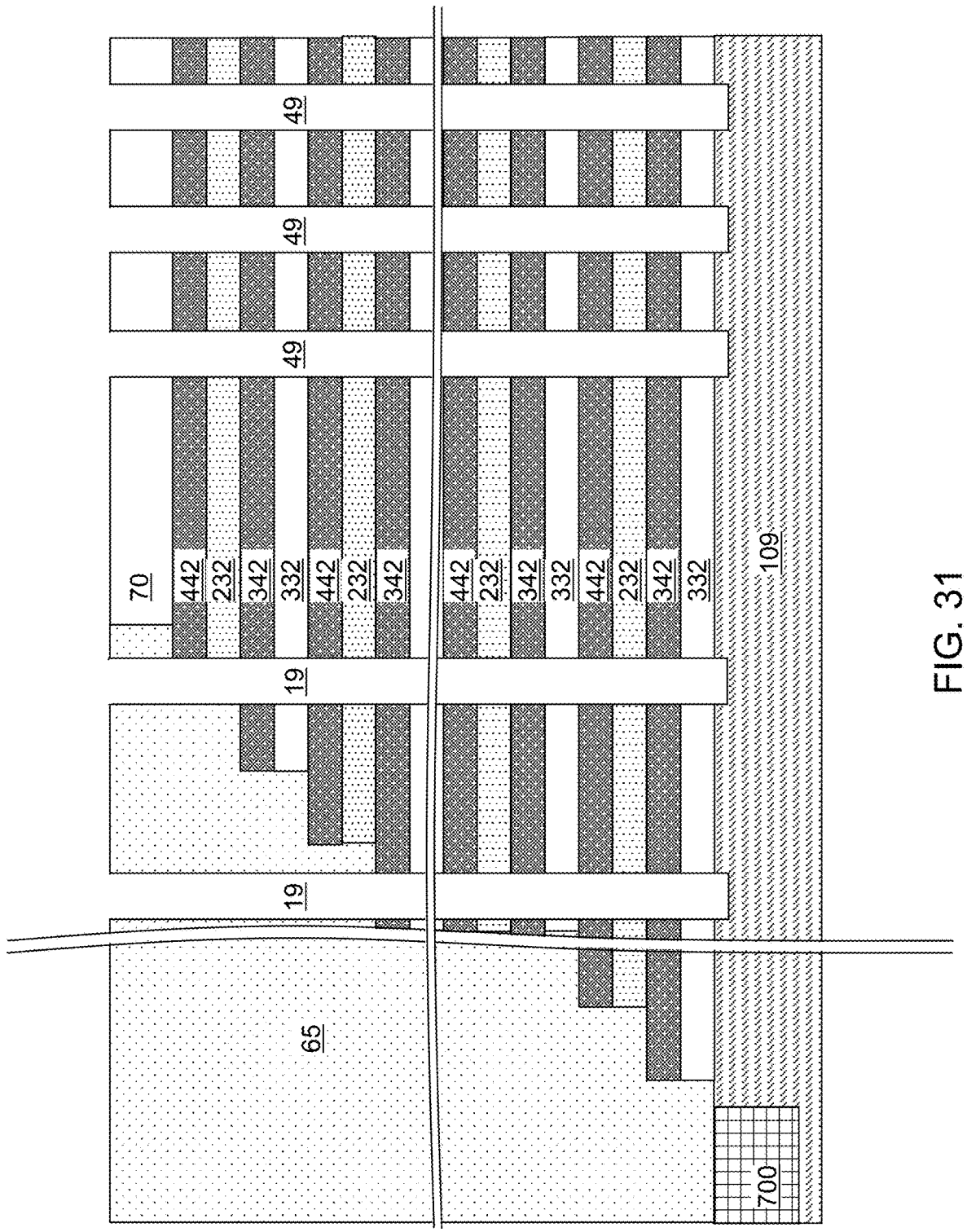
FIG. 31 is a vertical cross-sectional view of the fifth exemplary structure after formation of an array of memory opening according to the ninth embodiment of the present disclosure.

Referring to FIG. 31, the processing steps of FIGS. 18A and 18B can be performed to form memory openings 49 and support openings 19. Formation of the drain-select-level isolation structures 72 can be omitted.

Figure 32:
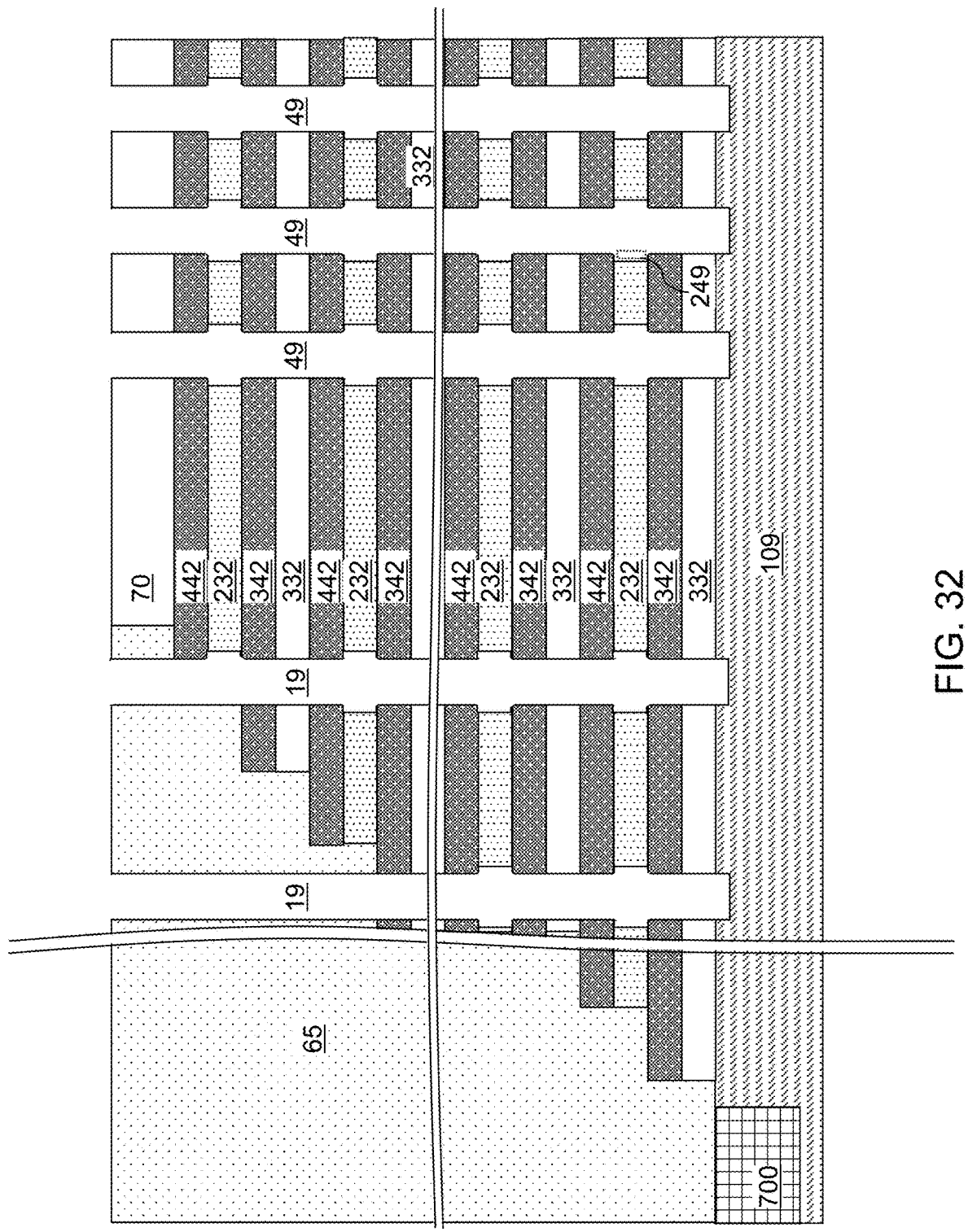
FIG. 32 is a vertical cross-sectional view of the fifth exemplary structure after formation of channel-level recesses according to the ninth embodiment of the present disclosure.

Referring to FIG. 32, an isotropic etch process is performed, which etches the material of the channel-level insulating layer 232 at a higher etch rate than the material of the device-isolation-level insulating layers 332 and selective to the materials of the source-level sacrificial layers 342 and the drain-level sacrificial layers 442. If the source-level sacrificial layers 342 and the drain-level sacrificial layers 442 include silicon nitride, if the device-isolation-level insulating layers 332 include undoped silicate glass, and if the channel-level insulating layers 232 include a doped silicate glass, a wet etch process employing dilute hydrofluoric acid (such as 100:1 dilute hydrofluoric acid) can be performed to laterally recess cylindrical sidewall segments of the channel-level insulating layers 232 selective to the source-level sacrificial layers 342, the drain-level sacrificial layers 442, and the device-isolation-level insulating layers 332.

Channel-level recesses 249 are formed by laterally recessing the channel-level insulating layers 232 selective to each source-level sacrificial layer 342, each drain-level sacrificial layer 442, and each device-isolation-level insulating layer 332. The channel-level recesses 249 are formed around each memory opening 49 and around each support opening 19 at each level of the channel-level insulating layers 232. The channel-level recesses 249 include cylindrical voids from which the material of the channel-level insulating layers 232 is removed. In one embodiment, the lateral recess distance of the isotropic etch process is selected in a range from the thickness of 1 monolayer of a two-dimensional electron gas channel material to be subsequently deposited to the thickness of 5 monolayers of the two-dimensional electron gas channel material to be subsequently deposited.

Figure 33:
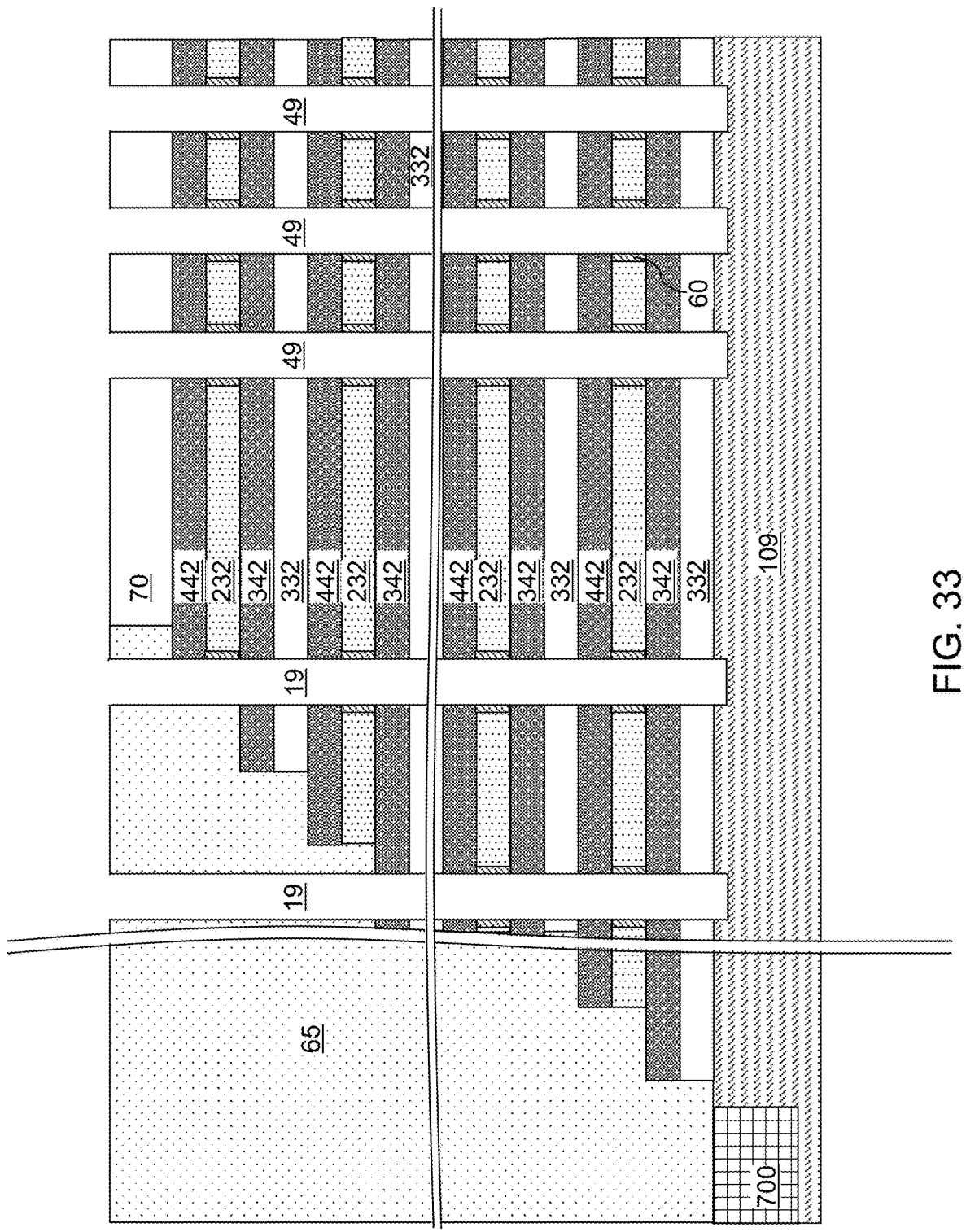
FIG. 33 is a vertical cross-sectional view of the fifth exemplary structure after formation of two-dimensional electron gas channels according to the ninth embodiment of the present disclosure.

Referring to FIG. 33, two-dimensional electron gas channels 60 can be formed within the volumes of the channel-level recesses 249 by depositing a metal dichalcogenide layer having a thickness in a range from 1 monolayer to 5 monolayers, and by anisotropically etching portions of the metallic dichalcogenide layer located outside the volumes of the channel-level recesses 249. The metal dichalcogenide layer may be deposited employing any of the methods described above. Each remaining cylindrical portion of the metal chalcogenide layer after the anisotropic etch process constitutes a two-dimensional electron gas channel 60, which may be a cylindrical two-dimensional electron gas channel. A vertical stack of two-dimensional cylindrical electron gas channels 60 can be formed within each memory opening 49.

In one embodiment, each of the two-dimensional cylindrical electron gas channels 60 comprises a metal dichalcogenide channel. In one embodiment, each of the at least one two-dimensional cylindrical electron gas channel within each memory opening 49 has a lateral thickness in a range from 1 monolayer to 5 monolayers, and includes the two-dimensional electron gas therein. In one embodiment, each of the at least one two-dimensional cylindrical electron gas channel in each memory opening 49 comprises a material having a composition of $Mo_{1-x}W_xS_{2-y}Se_y$, in which x is in a range from 0 to 1, and y is independent of x and is in a range from 0 to 2.

Figure 34A:
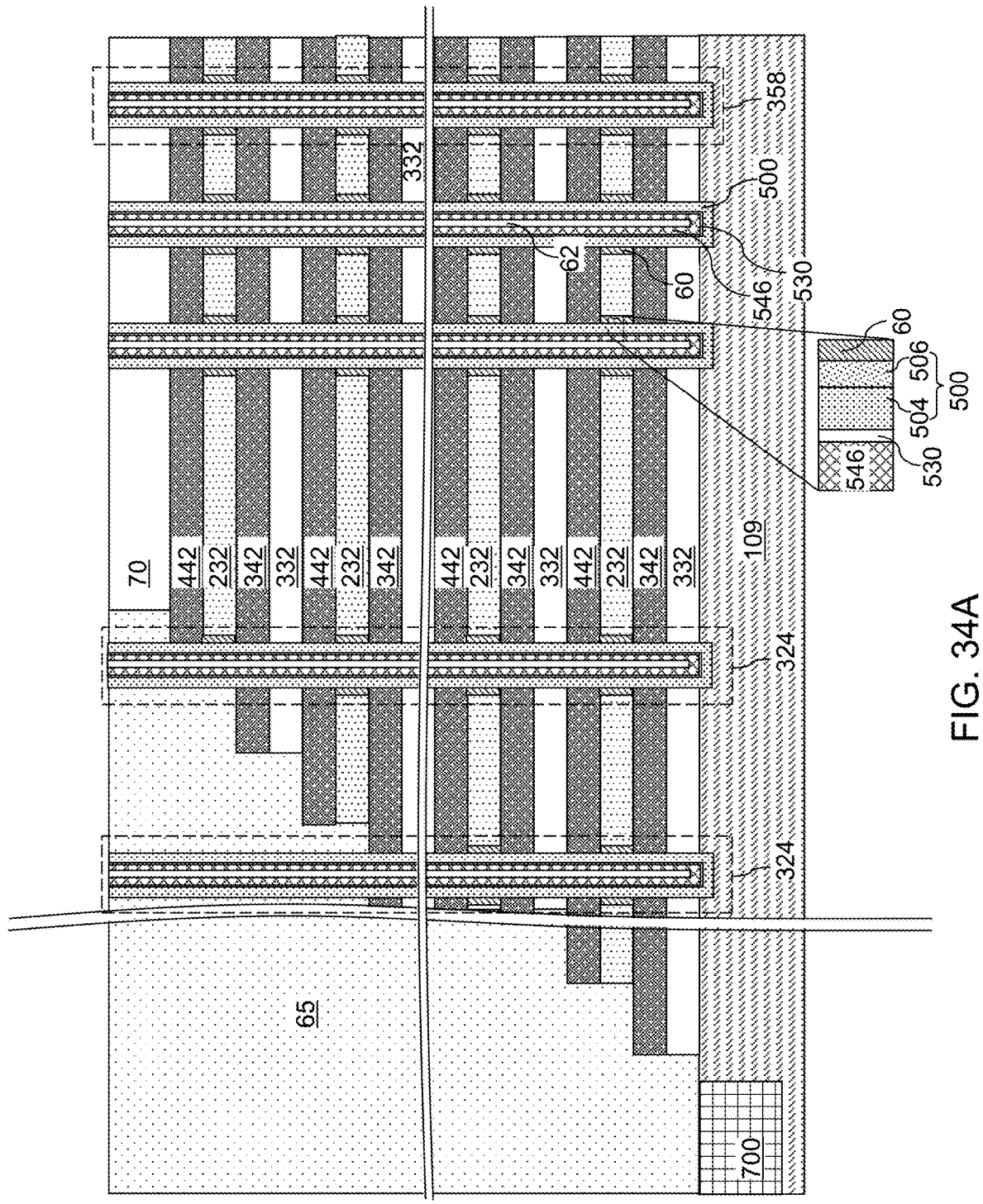
FIG. 34A is a vertical cross-sectional view of the fifth exemplary structure after formation of memory opening fill structures according to the ninth embodiment of the present disclosure.
Figure 34B:
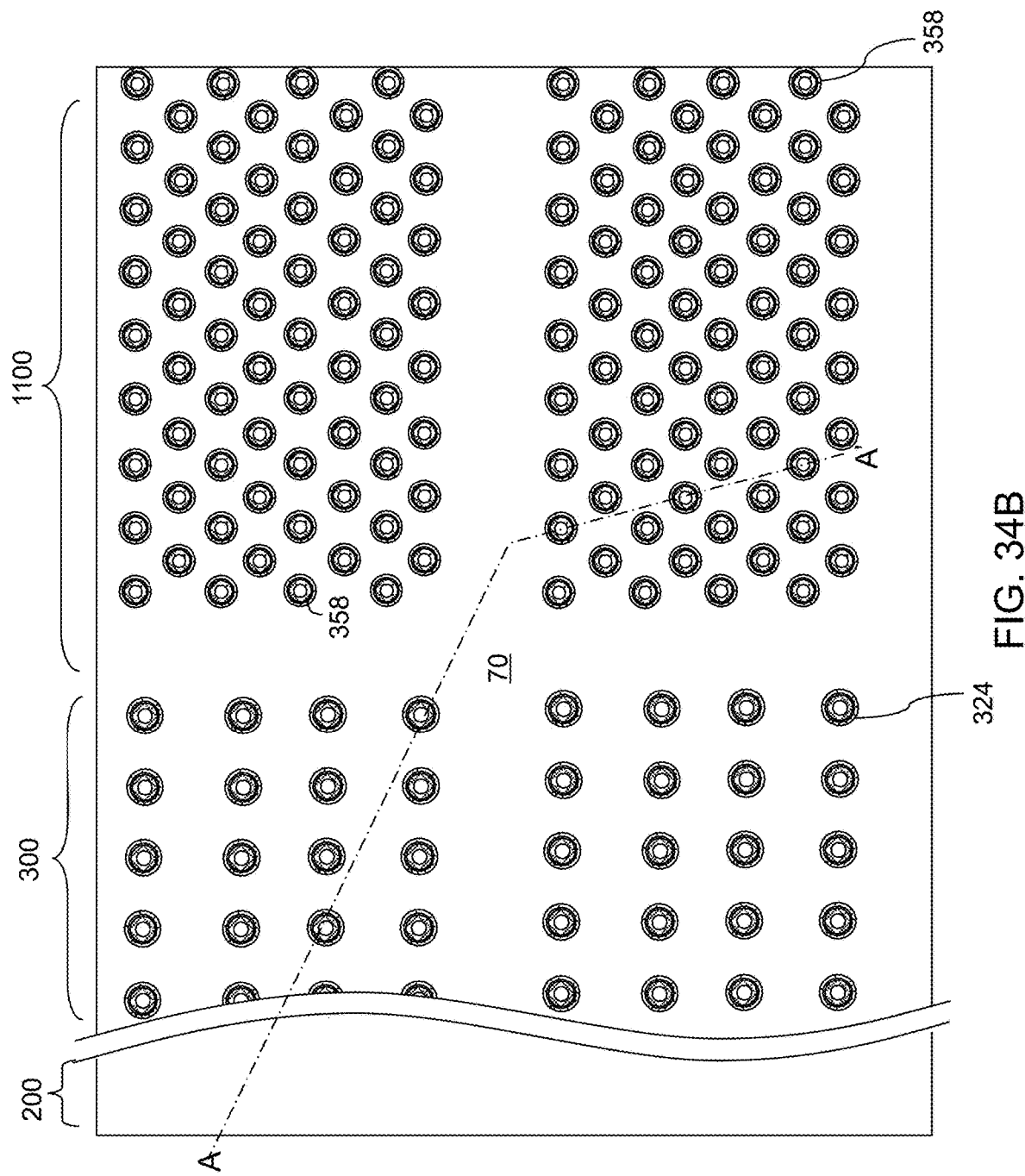
FIG. 34B is a vertical cross-sectional view of the fifth exemplary structure of FIG. 34A.

Referring to FIGS. 34A and 34B, a tubular ferroelectric dielectric layer 500 can be formed by conformally depositing at least one ferroelectric dielectric material on the physically exposed sidewalls of the two-dimensional cylindrical electron gas channels 60, the source-level sacrificial layers 342, the drain-level sacrificial layers 442, and the device-isolation-level insulating layers 332. The tubular ferroelectric dielectric layers 500 can be formed over inner cylindrical sidewalls of two-dimensional cylindrical electron gas channels 60.

The tubular ferroelectric dielectric layer 500 can include any configuration described above, and can be formed in any manner described above. In one embodiment, the tubular ferroelectric dielectric layer 500 can include a layer stack of a first ferroelectric dielectric layer 504 and a second dielectric layer 506 such that the second dielectric layer 506 is deposited directly on the inner cylindrical sidewalls of a vertical stack of two-dimensional cylindrical electron gas channels 60 in each memory opening 49, and the first ferroelectric dielectric layer 504 is deposited on the second dielectric layer 506. The thickness and the material composition of the second dielectric layer 506 can be the same as in the previously described embodiments. The thickness and the material composition of the first ferroelectric dielectric layer 504 can be the same as in the previously described embodiments.

In one embodiment, each of the tubular ferroelectric dielectric layers 500 comprises a first ferroelectric dielectric layer 504 having a first band gap energy, and a second dielectric layer 506 having a second band gap energy that is greater than the first band gap energy and located between the first ferroelectric dielectric layer 504 and the two-dimensional electron gas channels 60 within a same memory opening 49. In one embodiment, the first ferroelectric dielectric layer 504 comprises a first hafnium aluminum oxide or hafnium zirconium aluminum oxide layer; and the second dielectric layer 506 comprises a second hafnium aluminum oxide or hafnium zirconium aluminum oxide layer having a higher aluminum concentration than the first hafnium aluminum oxide or hafnium zirconium aluminum oxide layer. In one embodiment, the first ferroelectric dielectric layer 504 can have a material composition of $Hf_{1.5(1-\alpha-\beta)}Zr_{1.5\beta}Al_{2\alpha}O_3$, in which $\alpha$ is in a range from 0.01 to 0.2, and $\beta$ is in a range from 0 to 0.2, and the second dielectric layer 506 can have a material composition of $Hf_{1.5\gamma}Zr_{1.5\delta}Al_{2(1-\gamma-\delta)}O_3$, in which $\gamma$ is in a range from 0.05 to 0.2, and $\delta$ is in a range from 0 to 0.2.

In another embodiment, each tubular ferroelectric dielectric layer 500 comprises a two-dimensional Van der Waals ferroelectric material layer comprising a ferroelectric material selected from $CuInP_2S_6$, $a-In_2Se_3$, g-SbP, g-SbAs, or Group IV monochalcogenide material having a formula of MX in which M is selected from Ge, Sn, or Pb, and X is selected from S, Se, or Te.

A ferroelectric-side interfacial dielectric layer 530 can be optionally formed by conformal deposition of a dielectric material. The ferroelectric-side interfacial dielectric layer 530, if present, includes a dielectric material that improves the interface quality. The ferroelectric-side interfacial dielectric layer 530 comprises hafnium aluminum oxide, hafnium oxide or aluminum oxide. The thickness of the ferroelectric-side interfacial dielectric layer 530 can be in a range from 1 nm to 2 nm.

A word line 546 can be formed over an inner cylindrical sidewall of the tubular ferroelectric dielectric layer 500 within each memory opening 49 (e.g., on the ferroelectric-side interfacial dielectric layer 530 or directly on the tubular ferroelectric dielectric layer 500 if layer 530 is omitted). The word line 546 can vertically extend through each source-level sacrificial layer 342 and each drain-level sacrificial layer 442 within the at least one instance of the unit layer stack. The word line can include a metallic material such as titanium nitride, tantalum nitride, tungsten nitride, titanium, tantalum, tungsten, molybdenum, ruthenium, cobalt, copper, or any other transition metal element or an alloy thereof. The word lines 546 can be formed by conformal deposition of at least one metallic material. The lateral thickness of each word line 546 may be in a range from 6 nm to 100 nm, although lesser and greater thicknesses can also be employed.

In case a cavity is present in each memory opening 49 after formation of the word lines 546, a dielectric material can be deposited in the remaining volumes of the memory openings 49. For example, silicon oxide can be deposited in cavities within the memory openings 49 by a conformal deposition process. Excess portions of the dielectric material, the metallic material of the word lines 546, the optional ferroelectric-side interfacial dielectric layer 530, and the tubular ferroelectric dielectric layer 500 can be removed from above the horizontal plane including the top surface of the insulating cap layer 70 by a planarization process. The planarization process can include a chemical mechanical planarization (CMP) process and/or a recess etch process. Each remaining portion of the dielectric material constitutes a dielectric core 62.

A set of all material portions that fills a memory opening 49 constitutes a memory opening fill structure 358. A set of all material portions that fills a support opening 19 constitutes a support pillar structure 324. Each memory opening fill structure 358 and each support pillar structure 324 can include a vertical stack of two-dimensional cylindrical electron gas channels 60, a tubular ferroelectric dielectric layer 500, an optional ferroelectric-side interfacial dielectric layer 530, a word line 546, and an optional dielectric core 62.

Figure 35A:
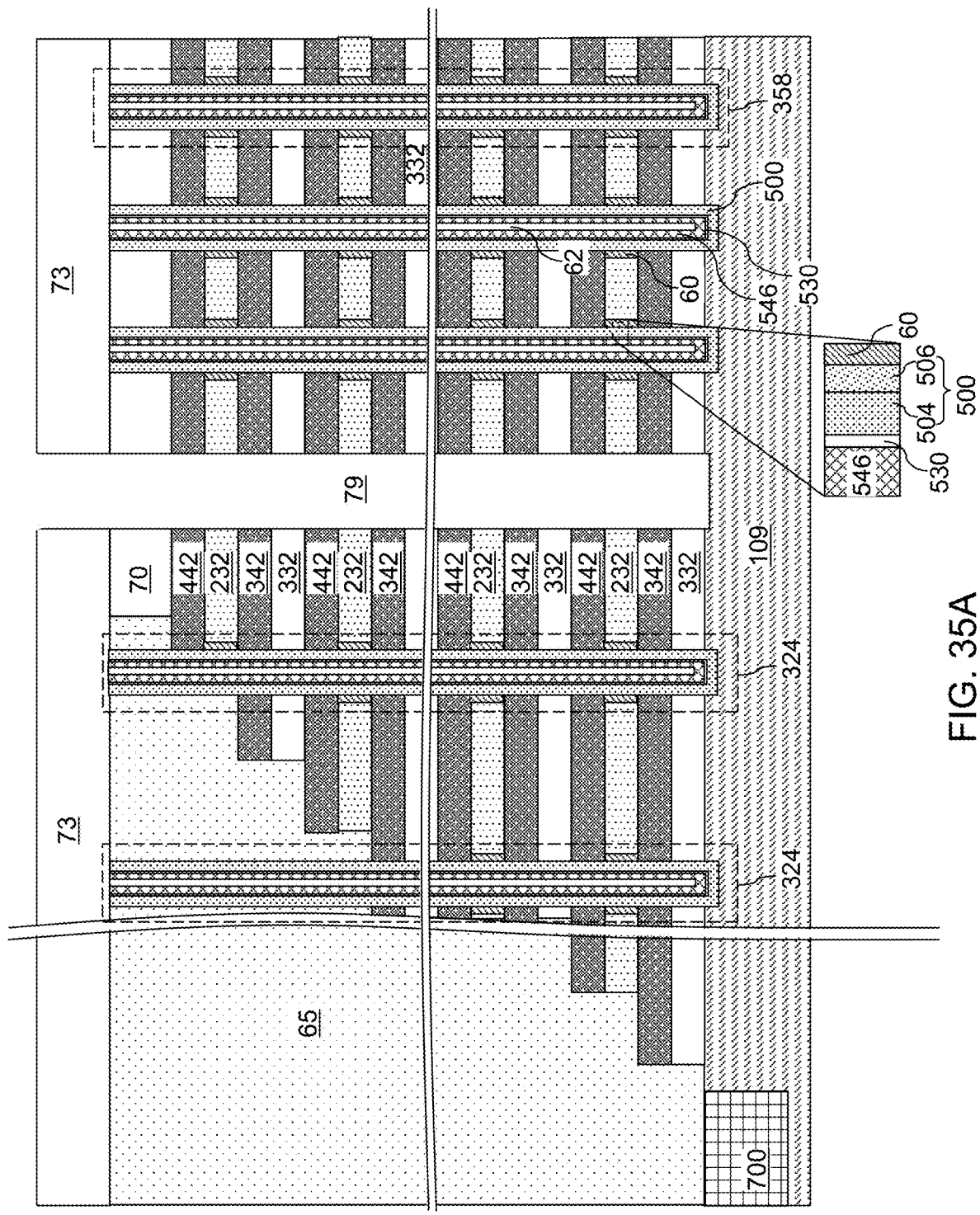
FIG. 35A is a vertical cross-sectional view of the fifth exemplary structure after formation of backside trenches according to the ninth embodiment of the present disclosure.
Figure 35B:
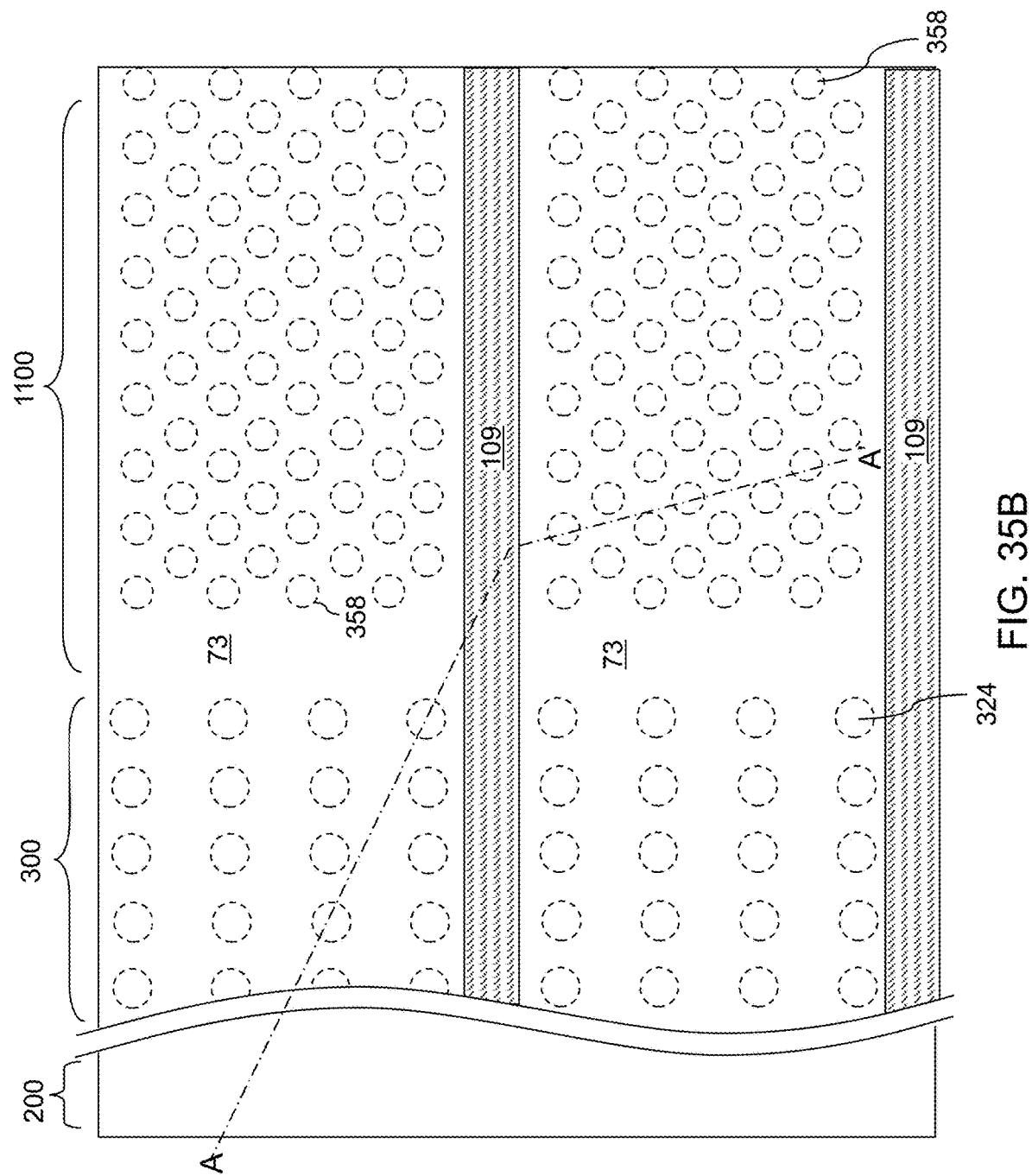
FIG. 35B is a vertical cross-sectional view of the fifth exemplary structure of FIG. 35A.

Referring to FIGS. 35A and 35B, the processing steps of FIGS. 24A and 24B can be performed to form a contact-level dielectric layer 73 and backside trenches 79.

Figure 36:
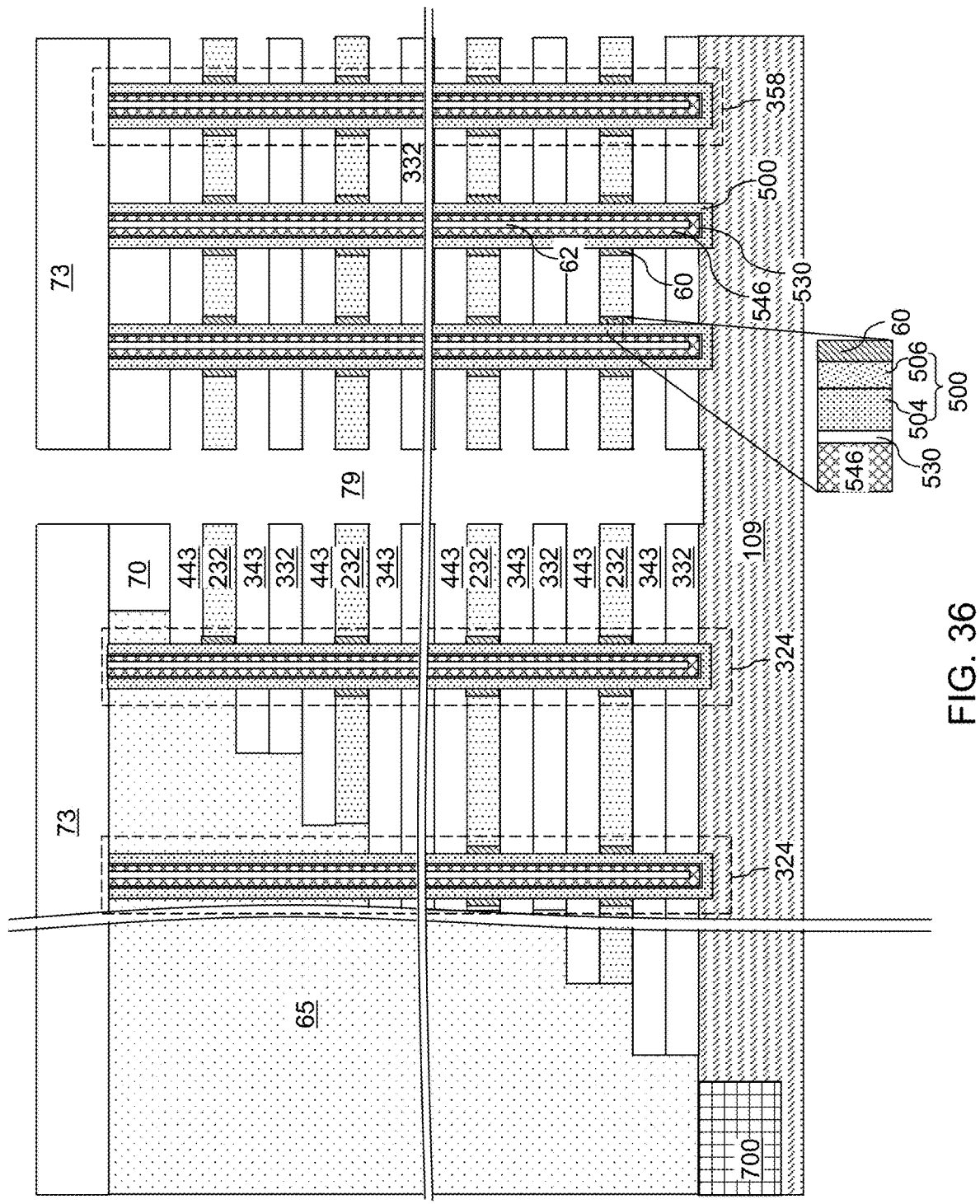
FIG. 36 is a vertical cross-sectional view of the fifth exemplary structure after formation of active-level backside recesses according to the ninth embodiment of the present disclosure.

Referring to FIG. 36, an isotropic etch process can be performed to etch the source-level sacrificial layer 342 and the drain-level sacrificial layer 442 selective to the device-isolation-level insulating layers 332 and the channel-level insulating layers 232. For example, if the source-level sacrificial layer 342 and the drain-level sacrificial layer 442 include silicon nitride, if the device-isolation-level insulating layers 332 include undoped silicate glass, and if the channel-level insulating layers 232 include a doped silicate glass, a wet etch process employing hot phosphoric acid can be performed to etch the source-level sacrificial layer 342 and the drain-level sacrificial layer 442. Active-level backside recesses (343, 443) are formed in volumes from which the source-level sacrificial layer 342 and the drain-level sacrificial layer 442 are removed. The active-level backside recesses (343, 443) include source-level backside recesses 343 formed in volumes from which the source-level sacrificial layers 342 are removed, and drain-level backside recesses 443 formed in volumes form which the drain-level sacrificial layers 442 are removed.

Figure 37:
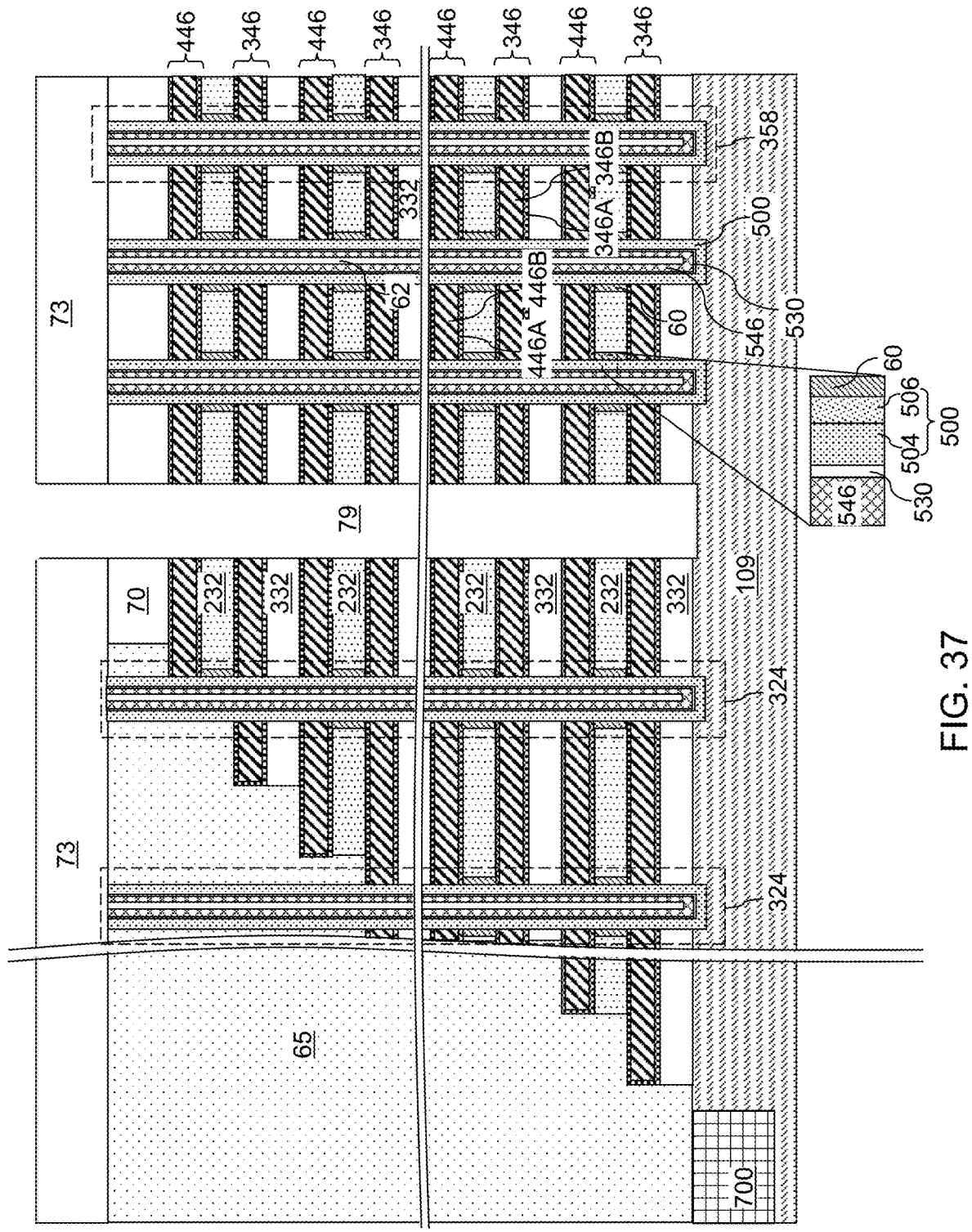
FIG. 37 is a vertical cross-sectional view of the fifth exemplary structure after formation of source layers and drain layers according to the ninth embodiment of the present disclosure.

Referring to FIG. 37, the processing steps of FIGS. 26A and 26B can be formed to deposit at least one conductive material in the active-level backside recesses (343, 443) and to remove excess portions of the at least one conductive material from inside the backside trenches 79 and from above the contact-level dielectric layer 73. The at least one conductive material may include a metallic nitride liner (346A, 446A) including a metallic nitride material (such as TiN, TaN, and/or WN) and a metallic fill material portion (346B, 446B) including a metallic fill material, which may include an elemental metal (such as W, Mo, Ru, Co, Cu, or any other transition metal) or an intermetallic alloy. A metallic source layer 346 is formed in each source-level backside recess 343, and a metallic drain layer 446 is formed in each drain-level backside recess 443. Each metallic source layer 346 can include a source-level metallic nitride liner 346A and a source-level metallic fill material portion 346B. Each metallic drain layer 446 can include a drain-level metallic nitride liner 446A and a drain-level metallic fill material portion 446B.

Each source-level sacrificial layer 342 and each drain-level sacrificial layer 442 can be replaced with metallic source layer and a metallic drain layer, respectively. Each metallic source layer 346 and each metallic drain layer 446 can be formed directly on annular horizontal surfaces of a respective subset of the two-dimensional cylindrical electron gas channels 60 which is located directly on a respective one of the channel-level insulating layers 232. In one embodiment, each metallic source layer 346 and each metallic drain layer 446 can be formed directly on annular horizontal surfaces of all two-dimensional cylindrical electron gas channels 60 that contact a same channel-level insulating layers 232 between a neighboring pair of backside trenches 79.

Figure 38A:
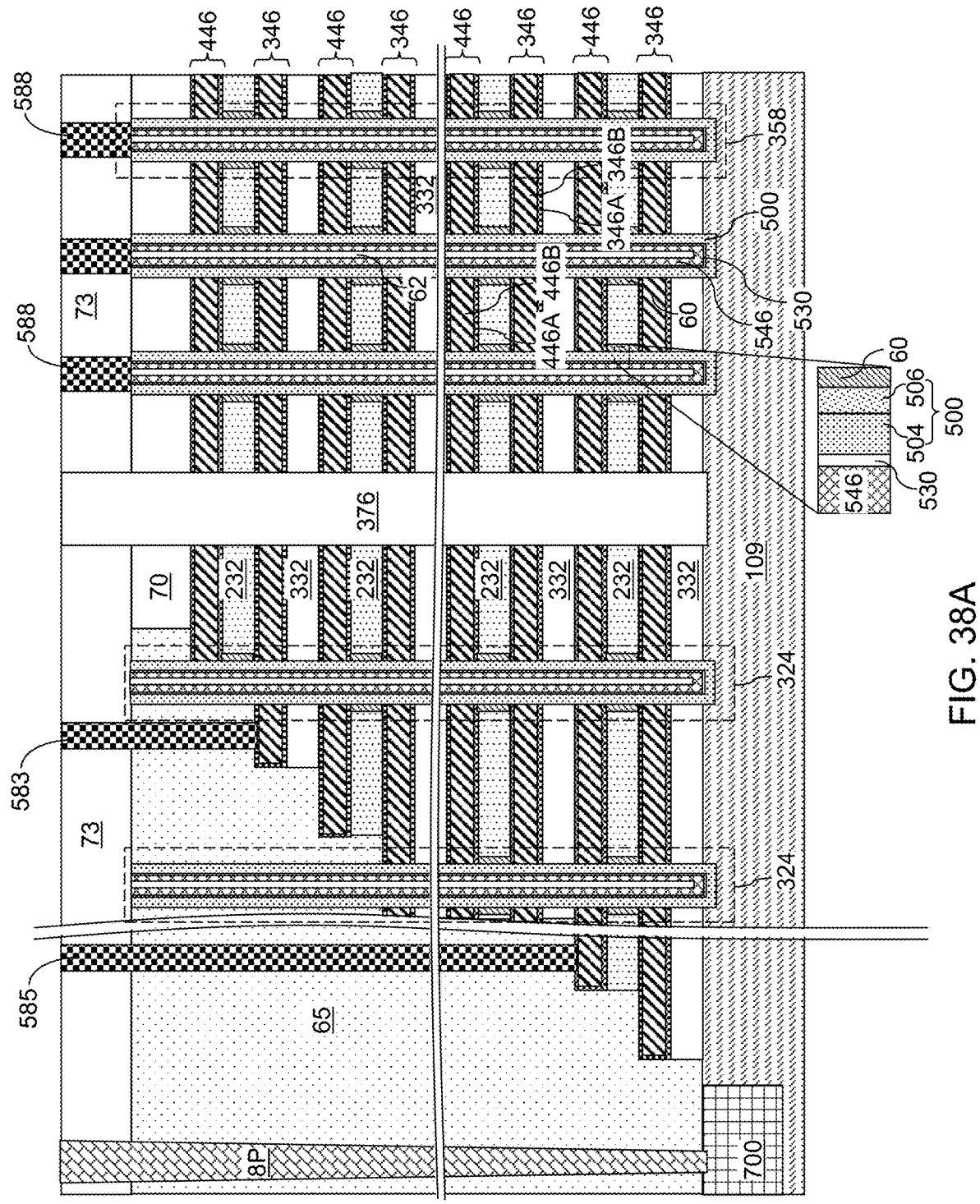
FIG. 38A is a vertical cross-sectional view of the fifth exemplary structure after formation of contact via structures according to the ninth embodiment of the present disclosure.
Figure 38B:
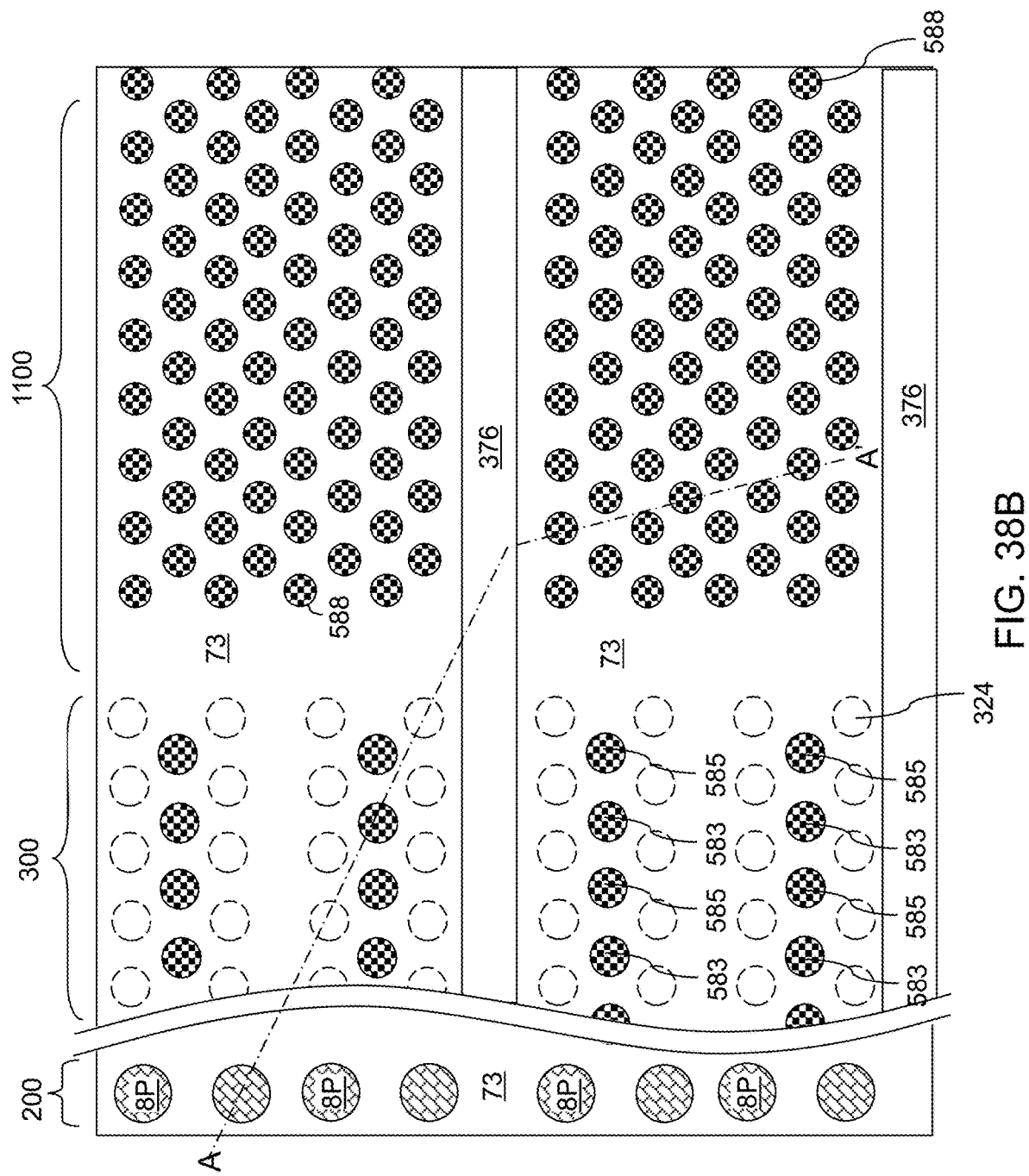
FIG. 38B is a vertical cross-sectional view of the fifth exemplary structure of FIG. 38A.

Referring to FIGS. 38A and 38B, a dielectric material can be deposited in the backside trenches 79 to form dielectric wall structures 376. Contact via structures (588, 583, 585, 8P) can be formed through the contact level dielectric layer 73, and optionally through the retro-stepped dielectric material portion 65. For example, word-line-contact via structures 588 can be formed through the contact level dielectric layer 73 on each word line 546. Source-contact via structures 583 can be formed on the metallic source layers 346 through the contact level dielectric layer 73 and through the retro-stepped dielectric material portion 65. Drain-contact via structures 585 can be formed on the metallic drain layers 446 through the contact level dielectric layer 73 and through the retro-stepped dielectric material portion 65. Peripheral device contact via structures 8P can be formed through the retro-stepped dielectric material portion 65 directly on respective nodes of the peripheral devices.

In an alternative embodiment, instead of replacing the source-level sacrificial layers 342 and the drain-level sacrificial layers 442 with respective metallic source layer 346 and a metallic drain layer 446, electrically conductive source and drain layers (346, 446) are formed as part of the initial unit layer stack (232, 332, 346, 446). In this alternative embodiment, each electrically conductive source and drain layer may comprise a heavily doped polysilicon layer. If desired, a thin (e.g., 1 to 2 nm thick) optional metallic interface improvement layer may be formed in contact with the heavily doped polysilicon layers.

Each two-dimensional cylindrical electron gas channel 60 is located between and contacts a vertically neighboring pair of a metallic source layer 346 and a metallic drain layer 446. Each two-dimensional cylindrical electron gas channel 60 is controlled by a gate electrode which comprises an adjacent portion of one of the word lines 546. The word lines 546 are independently controlled. Portions of the tubular ferroelectric dielectric material layers 500 located adjacent to a set of two-dimensional cylindrical electron gas channels 60 can be independently programmed to provide a two-dimensional ferroelectric NOR array. A vertical stack of two-dimensional ferroelectric NOR arrays located between a neighboring pair of dielectric wall structures 376 constitutes a three-dimensional ferroelectric NOR array.

Referring to all structures related to the fifth exemplary structure of the present disclosure, a memory device is provided, which comprises at least one unit layer stack located over a substrate, wherein the unit layer stack comprises a metallic source layer 346, a channel-level insulating layer 232, a metallic drain layer 446, and a device-isolation-level insulating layer 332; a plurality of memory openings 49 vertically extending through the at least one unit layer stack (346, 232, 436, 332); and memory opening fill structures 358 located within a respective one of the plurality of memory openings 49, wherein each of the memory opening fill structures 358 comprises a tubular ferroelectric dielectric layer 500 and at least one two-dimensional cylindrical electron gas channel 60 vertically extending between the metallic source layer 346 and the metallic drain layer 446 of the at least one unit layer stack (346, 232, 436, 332).

In one embodiment, each channel-level insulating layer 232 contacts an outer cylindrical sidewall of a respective two-dimensional cylindrical electron gas channel 60.

In one embodiment, the tubular ferroelectric dielectric layer 500 contacts a cylindrical surface of each of the metallic source layers 346 and a cylindrical surface of each of the metallic drain layers 446.

In one embodiment, a word line 546 can be formed over an inner cylindrical sidewall of the tubular ferroelectric dielectric layer 500 within each memory opening 49. The word line 546 can vertically extend through each metallic source layer 346 and each metallic drain layer 446 within the at least one unit layer stack (346, 232, 436, 332).

In one embodiment, the at least one unit layer stack (346, 232, 436, 332) comprises a vertical stack of a plurality of the unit layer stacks (346, 232, 436, 332).

In one embodiment, each of the at least one two-dimensional cylindrical electron gas channel 60 comprises a metal dichalcogenide channel.

In one embodiment, each of the at least one two-dimensional cylindrical electron gas channel 60 has a lateral thickness in a range from 1 monolayer to 5 monolayers and includes the two-dimensional electron gas therein; and each of the at least one two-dimensional cylindrical electron gas channel 60 comprises, and/or consists essentially of, a material having a composition of $Mo_{1-x}W_xS_{2-y}Se_y$, wherein x is in a range from 0 to 1, and y is independent of x and is in a range from 0 to 2. In one embodiment, the tubular ferroelectric dielectric layer 500 comprises a two-dimensional Van der Waals ferroelectric material layer comprising a ferroelectric material selected from $CuInP_2S_6$, $a-In_2Se_3$, g-SbP, g-SbAs, or Group IV monochalcogenide material having a formula of MX in which M is selected from Ge, Sn, or Pb, and X is selected from S, Se, or Te.

Figure 39:
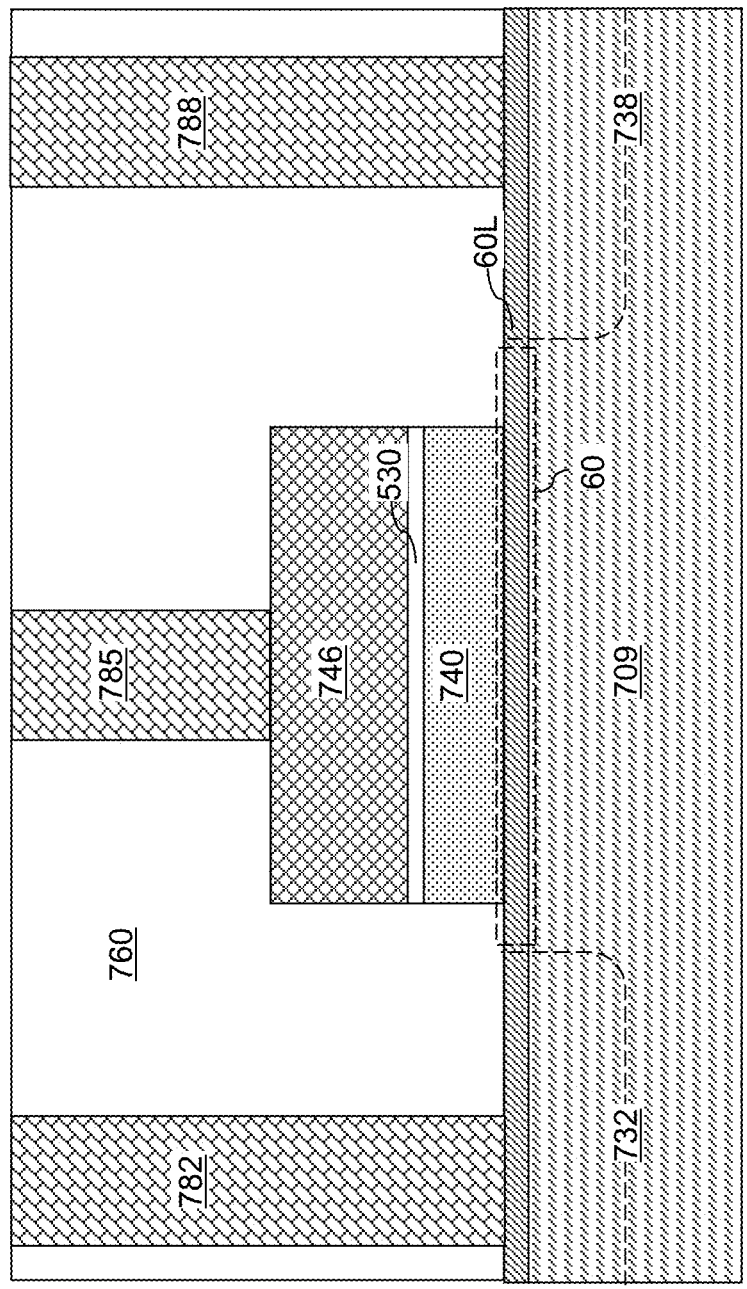
FIG. 39 is a vertical cross-sectional view of a first configuration of a sixth exemplary structure according to a tenth embodiment of the present disclosure.

Referring to FIG. 39, a first configuration of a sixth exemplary structure according to a tenth embodiment of the present disclosure is shown. The sixth exemplary structure includes a semiconductor substrate 709 that includes a semiconductor material layer. The semiconductor material layer may include a single crystalline semiconductor material layer or a polycrystalline semiconductor material. The semiconductor substrate 709 may include at least one elemental semiconductor material such as silicon, germanium, or a silicon-germanium alloy, or may include a compound semiconductor material such as a III-V compound semiconductor material or a II-V compound semiconductor material.

A two-dimensional electron gas channel layer 60L can be formed on a top surface of the semiconductor substrate 709. The two-dimensional electron gas channel layer 60L can include any of the materials for the two-dimensional electron gas channel layer 60L described above, and can have the same thickness as the two-dimensional electron gas channel layer 60L described above.

A layer stack of a two-dimensional Van der Waals ferroelectric material layer 740, an optional ferroelectric-side interfacial dielectric layer 530, and a gate electrode material layer 746 can be sequentially deposited over the two-dimensional electron gas channel layer 60L, and can be lithographically patterned for form a gate stack. The two-dimensional Van der Waals ferroelectric material layer 740 is formed on the two-dimensional electron gas channel 60. The two-dimensional Van der Waals ferroelectric material layer 740 can have the same thickness and the same material composition as any of the two-dimensional Van der Waals ferroelectric material layers described above. In one embodiment, the two-dimensional Van der Waals ferroelectric material layer 740 comprises, and/or consists essentially of, a ferroelectric material selected from $CuInP_2S_6$, $a-In_2Se_3$, g-SbP, g-SbAs, or Group IV monochalcogenide material having a formula of MX in which M is selected from Ge, Sn, or Pb, and X is selected from S, Se, or Te.

The ferroelectric-side interfacial dielectric layer 530 can have the same material composition and the same thickness as in previously described embodiments. In one embodiment, the ferroelectric-side interfacial dielectric layer 530 comprises, and/or consists essentially of, hafnium aluminum oxide, hafnium oxide or aluminum oxide, and contacts the two-dimensional Van der Waals ferroelectric material layer 740 and a gate electrode 746.

A remaining patterned portion of the gate electrode material layer comprises the gate electrode 746, which can include a doped semiconductor material or at least one metallic material such as a metallic nitride material (e.g., TiN, TaN, and/or WN) and/or at least one elemental metal or an intermetallic alloy.

Dopants can be implanted into end portions of the two-dimensional electron gas channel layer 60L and the underlying portion of the semiconductor substrate 709 using the gate electrode 746 as a mask to form a source region 732 and a drain region 738. Each of the source region 732 and the drain region 738 can include a respective doped portion of the two-dimensional electron gas channel layer 60L and a doped portion of the semiconductor substrate 709. The portion of the two-dimensional electron gas channel layer 60L that does not belong to the source region 732 or the drain region 738 constitutes a two-dimensional electron gas channel 60.

A planarization dielectric layer 760 including a dielectric material such as silicon oxide and/or silicon nitride can be deposited over the gate electrode 746, and can be planarized to provide a planar top surface. Contact via structures (782, 785, 788) can be formed through the planarization dielectric layer 760. The contact via structures (782, 785, 788) can include a source-contact via structure 782 contacting a top surface of the source region 732, a drain-contact via structure 788 contacting a top surface of the drain region 738, and a gate-contact via structure 785 contacting a top surface of the gate electrode 746.

Figure 40:
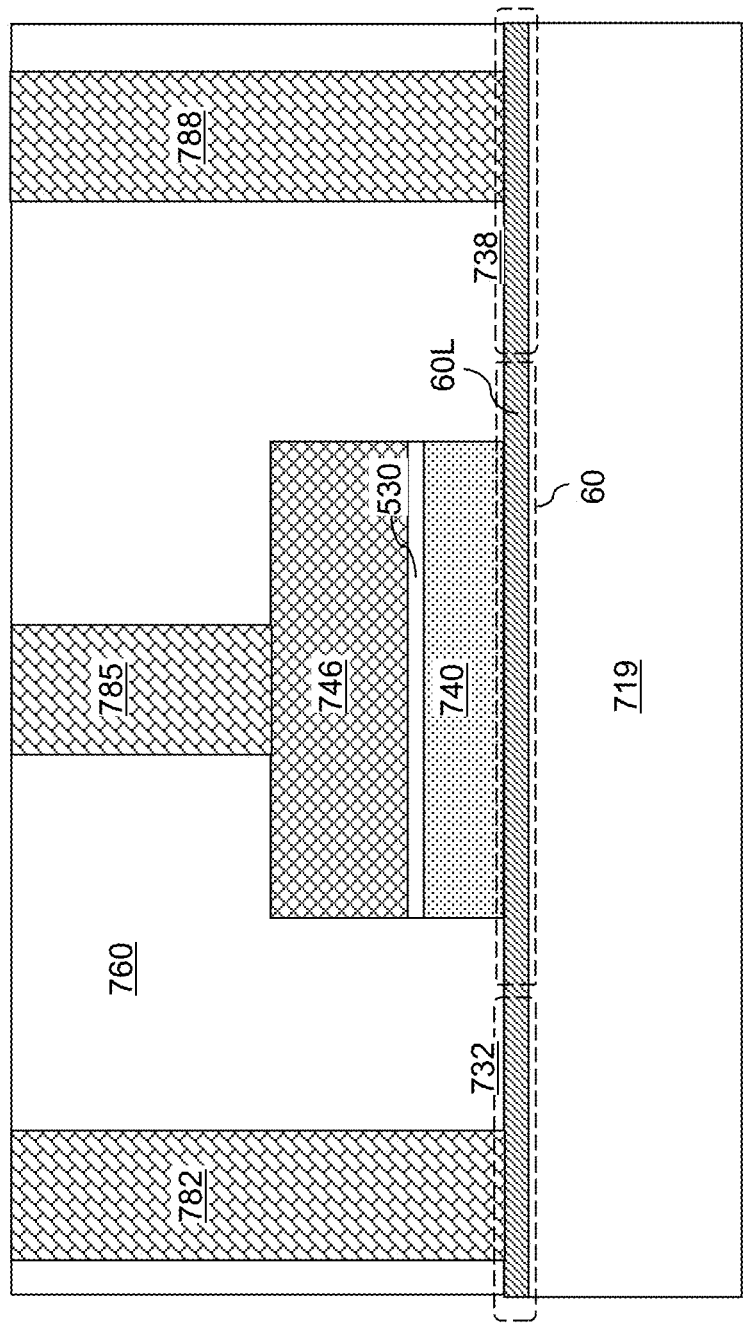
FIG. 40 is a vertical cross-sectional view of a second configuration of the sixth exemplary structure according to a tenth embodiment of the present disclosure.

Referring to FIG. 40, a second configuration of the sixth exemplary structure is illustrated, which can be derived from the first configuration of the sixth exemplary structure illustrated in FIG. 39 by employing an insulating substrate 719 in lieu of the semiconductor substrate 701. In this case, the source region 732 and the drain region 738 can be confined within the two-dimensional electron gas channel layer 60L.

Figure 41:
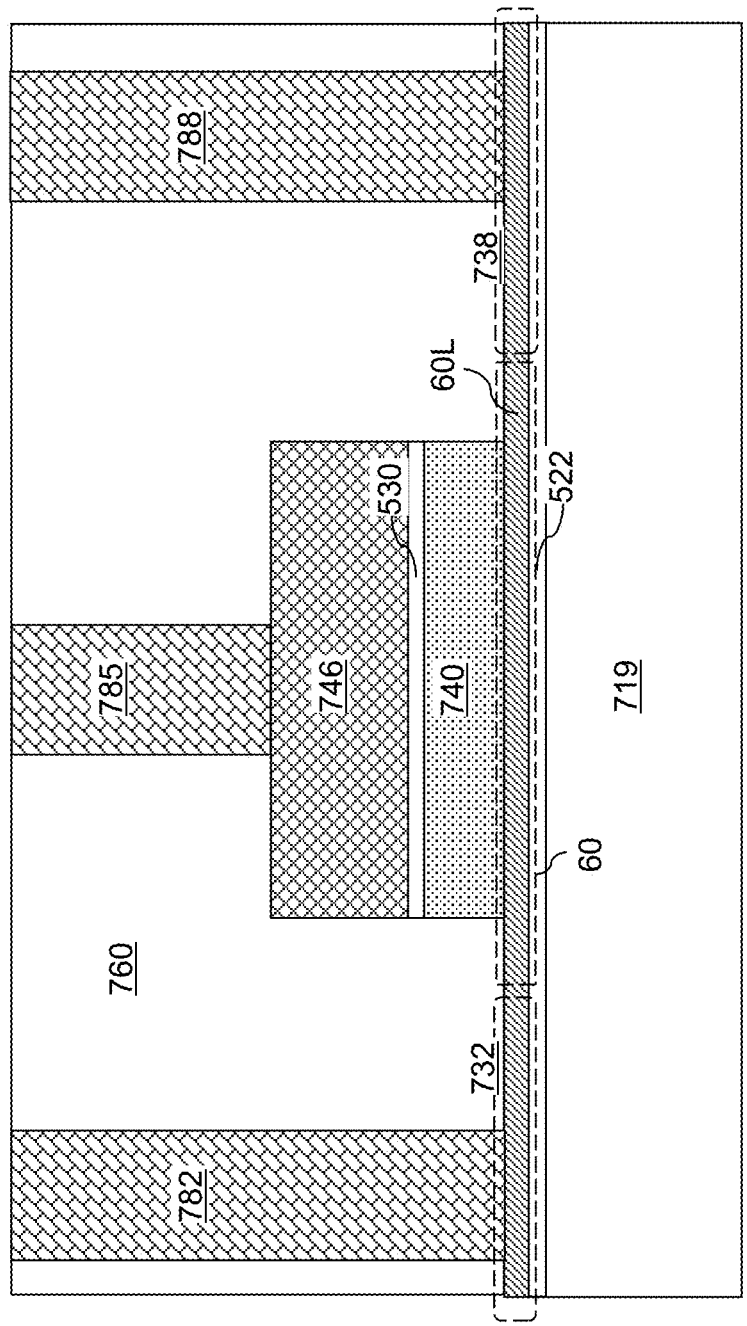
FIG. 41 is a vertical cross-sectional view of a third configuration of the sixth exemplary structure according to a tenth embodiment of the present disclosure.

Referring to FIG. 41, a third configuration of the sixth exemplary structure is illustrated, which can be derived from the second configuration of the sixth exemplary structure illustrated in FIG. 40 by forming a channel-side interfacial dielectric layer 522. The channel-side interfacial dielectric layer 522 can have the same material composition and the same thickness as in the previously described embodiments. The channel-side interfacial dielectric layer 522 can comprise, and/or can consist essentially of, hafnium aluminum oxide, hafnium oxide or aluminum oxide, and can contact the substrate (such as the insulating substrate 719) and the two-dimensional electron gas channel 60.

Figure 42:
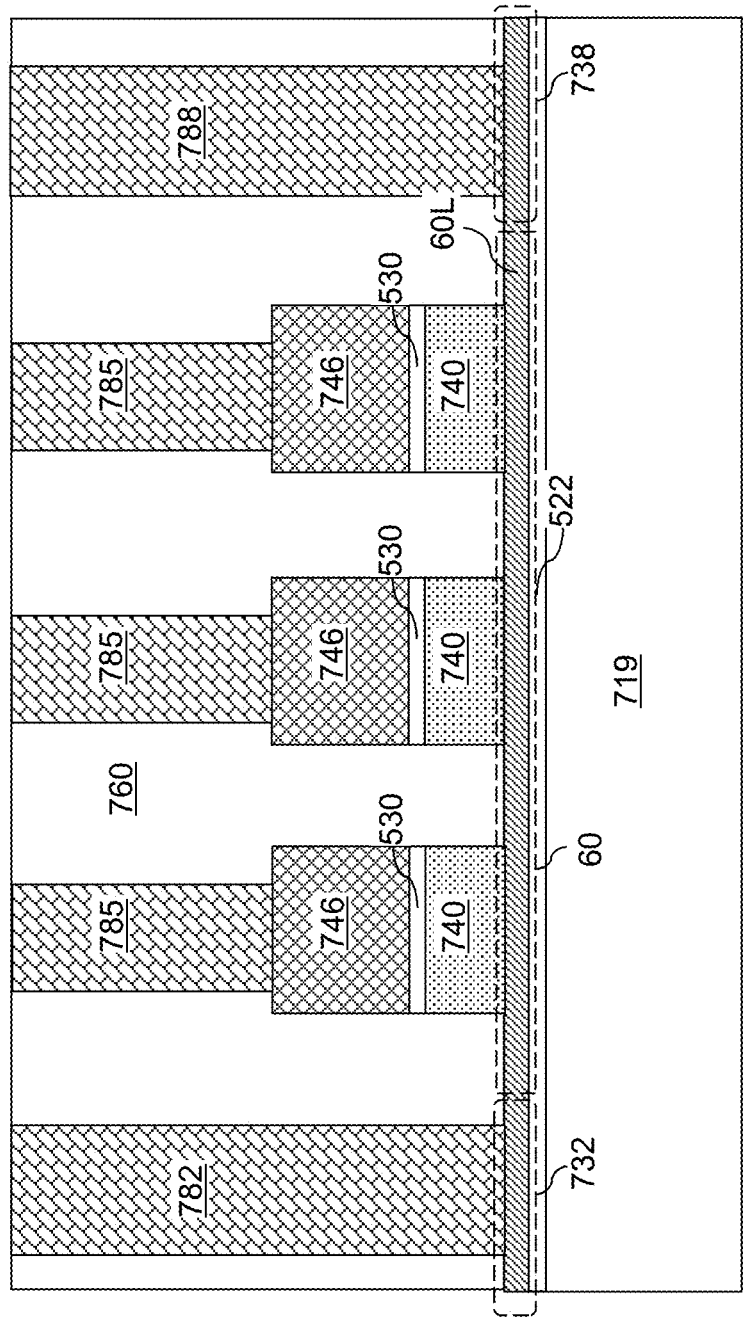
FIG. 42 is a vertical cross-sectional view of a fourth configuration of the sixth exemplary structure according to a tenth embodiment of the present disclosure.

Referring to FIG. 42, a fourth configuration of the sixth exemplary structure can be derived from any of the first, second, and third configurations of the sixth exemplary structure by forming a plurality of gate stacks (740, 530, 746) arranged along the direction connecting the source region 732 and the drain region 738 in lieu of a single gate stack (740, 530, 746) over the two-dimensional electron gas channel 60. The gate electrodes 746 can be independently controlled to provide a NAND ferroelectric memory string.

Figure 43:
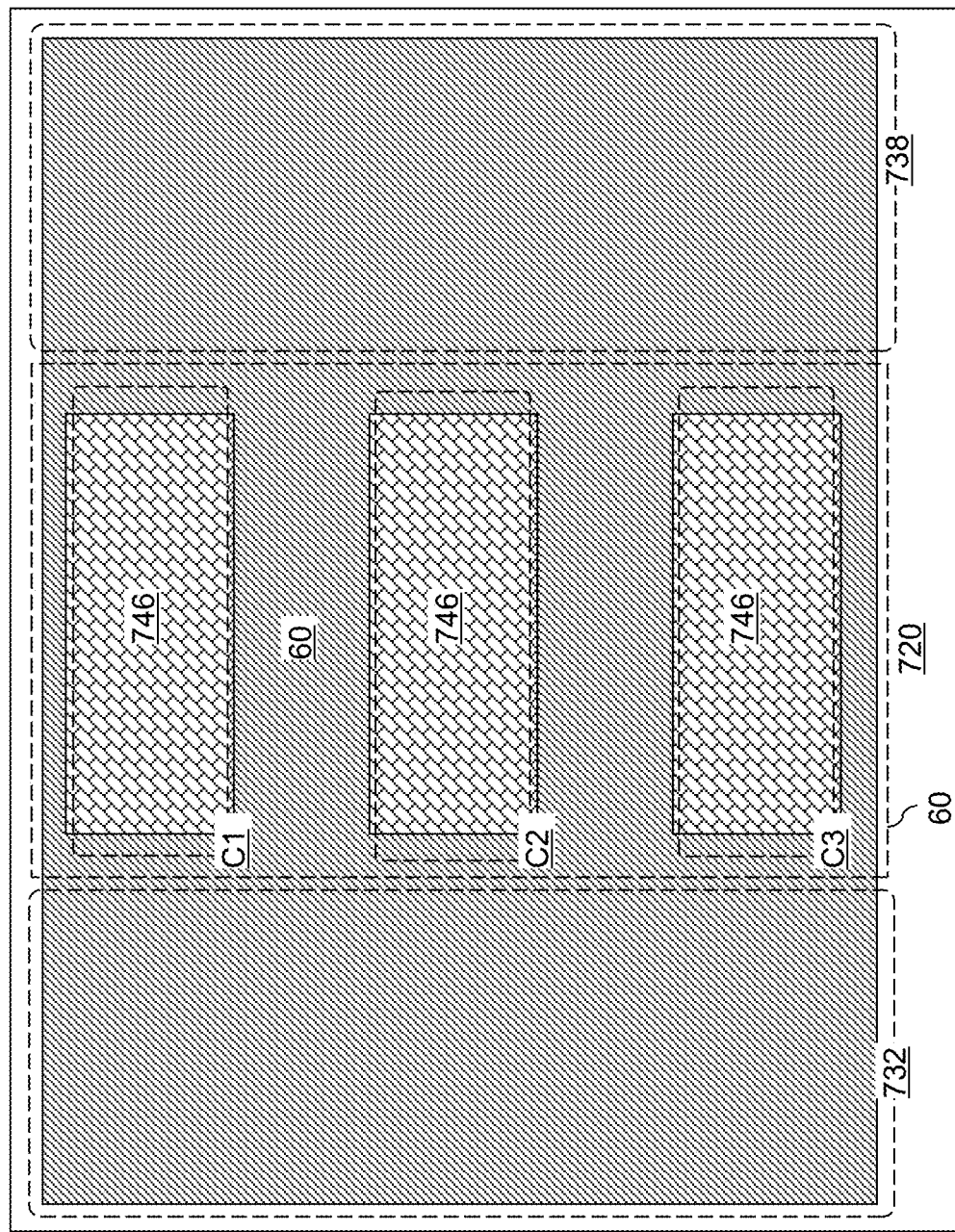
FIG. 43 is a top-down view of a fifth configuration of the sixth exemplary structure according to a tenth embodiment of the present disclosure.

Referring to FIG. 43, a fifth configuration of the sixth exemplary structure can be derived from any of the first, second, and third configurations of the sixth exemplary structure by forming a plurality of gate stacks (740, 530, 746) arranged perpendicular to the direction connecting the source region 732 and the drain region 738 in lieu of a single gate stack (740, 530, 746) over the two-dimensional electron gas channel 60. The gate electrodes 746 can be independently controlled to provide a NOR ferroelectric memory string. The two-dimensional electron gas channel 60 can include plurality of channel regions (C1, C2, C3) that are connected in a parallel connection between the source region 732 and the drain region 738.

Referring to all drawings related to the sixth exemplary structure, a memory device is provided, which comprises a two-dimensional electron gas channel 60 located on a substrate; (709, 719); a source region 732 and a drain region 738 located at end portions of the two-dimensional electron gas channel 60; a two-dimensional Van der Waals ferroelectric material layer 740 located on the two-dimensional electron gas channel 60 and comprising a ferroelectric material selected from $CuInP_2S_6$, $a-In_2Se_3$, g-SbP, g-SbAs, or Group IV monochalcogenide material having a formula of MX in which M is selected from Ge, Sn, or Pb, and X is selected from S, Se, or Te; and at least one gate electrode 746 located over two-dimensional Van der Waals ferroelectric material layer 740.

In one embodiment, the memory device comprises a ferroelectric-side interfacial dielectric layer 530 comprising hafnium aluminum oxide, hafnium oxide or aluminum oxide and contacting the two-dimensional Van der Waals ferroelectric material layer 740 and the at least one gate electrode 746.

In one embodiment, the substrate 709 comprises a semiconductor material layer; and the source region 732 and the drain region 738 include a respective doped portion of the semiconductor material layer 709. In another embodiment, the substrate 719 comprises a dielectric material.

In one embodiment, the source region 732 and the drain region 738 comprise a respective portion of a two-dimensional electron gas channel layer 60L including a material of the two-dimensional electron gas channel 60 and additionally including dopant atoms; a source-contact via structure 782 contacts a top surface of the source region 732; and a drain-contact via structure 788 contacts a top surface of the drain region 738.

In one embodiment, the at least one gate electrode 746 comprises a plurality of gate electrodes 746, and the plurality of gate electrodes 746 are arranged along a direction connecting the source region 732 and the drain region 738 to provide a NAND memory device, or are arranged along a direction perpendicular to the direction connecting the source region 732 and the drain region 738 to provide a NOR memory device.

Generally, the various embodiments of the present disclosure can provide ferroelectric memory devices having superior device characteristics over prior art ferroelectric memory devices. For example, a two-dimensional channel has an improved interface with the ferroelectric material with reduced or no dangling bonds. The improved interface quality improves the device reliability. This interface is further improved if a two-dimensional Van der Waals ferroelectric material is used. Furthermore, a smaller thickness of both two-dimensional channel and ferroelectric material also improves device scalability, while at the same time, much higher mobility of two-dimensional channel leads to higher cell current, and hence better device performance.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device, comprising:
   an alternating stack of insulating layers and electrically conductive layers located over a substrate;
   a memory opening vertically extending through the alternating stack;
   a two-dimensional electron gas channel located inside memory opening;
   a dielectric core surrounded by the channel; and
   a plurality of ferroelectric memory elements located between the channel and the electrically conductive layers,
   wherein the two-dimensional electron gas channel comprises a metal dichalcogenide channel.

2. The monolithic three-dimensional memory device of claim 1, wherein:
   the ferroelectric memory elements comprise portions of a tubular ferroelectric dielectric layer vertically extending through the electrically conductive layers of the alternating stack; and
   the tubular ferroelectric dielectric layer comprises:
      a first ferroelectric dielectric layer having a first band gap energy; and
      a second dielectric layer having a second band gap energy that is greater than the first band gap energy and located between the first ferroelectric dielectric layer and the metal dichalcogenide channel.

3. The monolithic three-dimensional memory device of claim 2, wherein:
   the first ferroelectric dielectric layer comprises a first hafnium aluminum oxide or hafnium zirconium aluminum oxide layer; and
   the second dielectric layer comprises a second hafnium aluminum oxide or hafnium zirconium aluminum oxide layer having a higher aluminum concentration than the first hafnium aluminum oxide or hafnium zirconium aluminum oxide layer.

4. The monolithic three-dimensional memory device of claim 1, wherein the metal dichalcogenide channel has a thickness in a range from 1 monolayer to 5 monolayers and includes the two-dimensional electron gas therein.

5. The monolithic three-dimensional memory device of claim 4, wherein the metal dichalcogenide channel comprises a material having a composition of $Mo_{1-x}W_xS_{2-y}Se_y$, wherein x is in a range from 0 to 1, and y is independent of x and is in a range from 0 to 2.

6. The monolithic three-dimensional memory device of claim 1, wherein:
the substrate comprises a semiconductor material layer; and
a bottom end of the metal dichalcogenide channel is electrically connected to the semiconductor material layer.

7. The monolithic three-dimensional memory device of claim 1, further comprising a drain region contacting an upper end of the metal dichalcogenide channel.

8. The monolithic three-dimensional memory device of claim 7, wherein the drain region comprises an annular doped metal dichalcogenide drain portion.

9. The monolithic three-dimensional memory device of claim 7, the drain region comprises a doped semiconductor drain portion.

10. The monolithic three-dimensional memory device of claim 7, wherein the drain region comprises a nickel layer, a nickel silicide layer, a N+ doped polysilicon layer, a stack of a titanium layer and a gold layer, or a stack of a nickel layer and a gold layer.

11. A ferroelectric memory device, comprising:
a two-dimensional electron gas channel;
a gate electrode; and
a ferroelectric element located between the gate electrode and the two-dimensional electron gas channel,
wherein the ferroelectric element comprises a two-dimensional Van der Waals ferroelectric element.

12. The ferroelectric memory device of claim 11, wherein the ferroelectric elements comprise portions of a two-dimensional Van der Waals ferroelectric material layer selected from $CuInP_2S_6$, a-$In_2Se_3$, g-SbP, g-SbAs, or Group IV monochalcogenide material having a formula of MX in which M is selected from Ge, Sn, or Pb, and X is selected from S, Se, or Te.

13. A method of forming a monolithic three-dimensional memory device, comprising:
forming an alternating stack of insulating layers and spacer material layers over a substrate, wherein the spacer material layers are formed as, or are subsequently replaced with, electrically conductive layers;
forming a memory opening through the alternating stack;
forming ferroelectric memory elements at a periphery of the memory opening at each level of the spacer material layers; and
forming a two-dimensional electron gas channel directly on the ferroelectric memory elements in the memory opening,
wherein the ferroelectric memory elements comprise two-dimensional Van der Waals ferroelectric elements.

14. A method of forming a monolithic three-dimensional memory device, comprising:
forming an alternating stack of insulating layers and spacer material layers over a substrate, wherein the spacer material layers are formed as, or are subsequently replaced with, electrically conductive layers;
forming a memory opening through the alternating stack;
forming ferroelectric memory elements at a periphery of the memory opening at each level of the spacer material layers; and
forming a two-dimensional electron gas channel directly on the ferroelectric memory elements in the memory opening,
wherein:
the two-dimensional electron gas channel comprises a metal dichalcogenide channel which has a thickness in a range from 1 monolayer to 5 monolayers and includes a two-dimensional electron gas therein, and
the metal dichalcogenide channel comprises a material having a composition of $Mo_{1-x}W_xS_{2-y}Se_y$, wherein x is in a range from 0 to 1, and y is independent of x and is in a range from 0 to 2.

15. The method of claim 14, wherein the metal dichalcogenide channel is formed by atomic layer deposition of a metal oxide layer comprising molybdenum oxide, tungsten oxide or molybdenum tungsten oxide, followed by chalcogenation of the metal oxide layer.

* * * * *